US008581625B2

(12) United States Patent
Yoneda et al.

(10) Patent No.: US 8,581,625 B2
(45) Date of Patent: Nov. 12, 2013

(54) PROGRAMMABLE LOGIC DEVICE

(75) Inventors: Seiichi Yoneda, Atsugi (JP); Tatsuji Nishijima, Hadano (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/463,084

(22) Filed: May 3, 2012

(65) Prior Publication Data

US 2012/0293206 A1 Nov. 22, 2012

(30) Foreign Application Priority Data

May 19, 2011 (JP) ................................ 2011-112045

(51) Int. Cl.
*H03K 19/173* (2006.01)

(52) U.S. Cl.
USPC ............................................. 326/38; 326/41

(58) Field of Classification Search
USPC .......... 326/37–39, 41, 44, 45, 47, 49–50, 101
See application file for complete search history.

(56) References Cited

U.S. PATENT DOCUMENTS 4,870,302 A 9/1989 Freeman
5,731,856 A 3/1998 Kim et al.
5,744,864 A 4/1998 Cillessen et al.
6,025,736 A * 2/2000 Vora et al. ...................... 326/39
6,127,702 A 10/2000 Yamazaki et al.
6,172,521 B1 1/2001 Motomura
6,294,274 B1 9/2001 Kawazoe et al.
6,363,004 B1 3/2002 Kang et al.
6,384,628 B1 5/2002 Lacey et al.
6,482,658 B2 11/2002 Kang et al.

(Continued)

FOREIGN PATENT DOCUMENTS

CN 101753861 6/2010
EP 1737044 A 12/2006

(Continued)

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

(Continued)

*Primary Examiner* — James H Cho
(74) *Attorney, Agent, or Firm* — Eric J. Robinson; Robinson Intellectual Property Law Office, P.C.

(57) ABSTRACT

An object is to provide a programmable logic device having logic blocks connected to each other by a programmable switch, where the programmable switch is characterized by an oxide semiconductor transistor incorporated therein. The extremely low off-state current of the oxide semiconductor transistor provides a function as a non-volatile memory due to its high ability to hold a potential of a gate electrode of a transistor which is connected to the oxide semiconductor transistor. The ability of the oxide semiconductor transistor to function as a non-volatile memory allows the configuration data for controlling the connection of the logic blocks to be maintained even in the absence of a power supply potential. Hence, the rewriting process of the configuration data at starting of the device can be omitted, which contributes to the reduction in power consumption of the device.

18 Claims, 29 Drawing Sheets

W
D
DB
A
B
150
152
154
OS
OS
FG1
FG2

(56) References Cited

U.S. PATENT DOCUMENTS 6,563,174 B2 5/2003 Kawasaki et al.
6,727,522 B1 4/2004 Kawasaki et al.
6,856,542 B2 2/2005 Roy et al.
7,049,190 B2 5/2006 Takeda et al.
7,061,014 B2 6/2006 Hosono et al.
7,064,346 B2 6/2006 Kawasaki et al.
7,105,868 B2 9/2006 Nause et al.
7,211,825 B2 5/2007 Shih et al
7,282,782 B2 10/2007 Hoffman et al.
7,297,977 B2 11/2007 Hoffman et al.
7,323,356 B2 1/2008 Hosono et al.
7,385,224 B2 6/2008 Ishii et al.
7,402,506 B2 7/2008 Levy et al.
7,411,209 B2 8/2008 Endo et al.
7,428,160 B2 9/2008 Kang
7,453,065 B2 11/2008 Saito et al.
7,453,087 B2 11/2008 Iwasaki
7,462,862 B2 12/2008 Hoffman et al.
7,468,304 B2 12/2008 Kaji et al.
7,501,293 B2 3/2009 Ito et al.
7,601,984 B2 10/2009 Sano et al.
7,674,650 B2 3/2010 Akimoto et al.
7,732,819 B2 6/2010 Akimoto et al.
7,750,671 B2 7/2010 Kang
7,750,678 B2 7/2010 Kang
7,768,313 B2 8/2010 Kang
7,782,085 B2 8/2010 Kang
7,791,074 B2 9/2010 Iwasaki
7,859,303 B2 12/2010 Kang
7,876,483 B2 1/2011 Watanabe et al.
7,924,058 B2 4/2011 Kang
7,994,500 B2 8/2011 Kim et al.
8,058,645 B2 11/2011 Jeong et al.
8,148,779 B2 4/2012 Jeong et al.
8,188,480 B2 5/2012 Itai
8,189,773 B2 5/2012 Nakano et al.
8,202,365 B2 6/2012 Umeda et al.
8,203,143 B2 6/2012 Imai
2001/0046027 A1 11/2001 Tai et al.
2002/0056838 A1 5/2002 Ogawa
2002/0132454 A1 9/2002 Ohtsu et al.
2003/0189401 A1 10/2003 Kido et al.
2003/0218222 A1 11/2003 Wager et al.
2004/0038446 A1 2/2004 Takeda et al.
2004/0127038 A1 7/2004 Carcia et al.
2005/0017302 A1 1/2005 Hoffman
2005/0199959 A1 9/2005 Chiang et al.
2006/0035452 A1 2/2006 Carcia et al.
2006/0043377 A1 3/2006 Hoffman et al.
2006/0091793 A1 5/2006 Baude et al.
2006/0108529 A1 5/2006 Saito et al.
2006/0108636 A1 5/2006 Sano et al.
2006/0110867 A1 5/2006 Yabuta et al.
2006/0113536 A1 6/2006 Kumomi et al.
2006/0113539 A1 6/2006 Sano et al.
2006/0113549 A1 6/2006 Den et al.
2006/0113565 A1 6/2006 Abe et al.
2006/0169973 A1 8/2006 Isa et al.
2006/0170111 A1 8/2006 Isa et al.
2006/0197092 A1 9/2006 Hoffman et al.
2006/0208977 A1 9/2006 Kimura
2006/0228974 A1 10/2006 Thelss et al.
2006/0231882 A1 10/2006 Kim et al.
2006/0238135 A1 10/2006 Kimura
2006/0244107 A1 11/2006 Sugihara et al.
2006/0284171 A1 12/2006 Levy et al.
2006/0284172 A1 12/2006 Ishii
2006/0292777 A1 12/2006 Dunbar
2007/0024187 A1 2/2007 Shin et al.
2007/0046191 A1 3/2007 Saito
2007/0052025 A1 3/2007 Yabuta
2007/0054507 A1 3/2007 Kaji et al.
2007/0090365 A1 4/2007 Hayashi et al.
2007/0108446 A1 5/2007 Akimoto
2007/0152217 A1 7/2007 Lai et al.
2007/0172591 A1 7/2007 Seo et al.
2007/0187678 A1 8/2007 Hirao et al.
2007/0187760 A1 8/2007 Furuta et al.
2007/0194379 A1 8/2007 Hosono et al.
2007/0252928 A1 11/2007 Ito et al.
2007/0272922 A1 11/2007 Kim et al.
2007/0287296 A1 12/2007 Chang
2008/0006877 A1 1/2008 Mardilovich et al.
2008/0038882 A1 2/2008 Takechi et al.
2008/0038929 A1 2/2008 Chang
2008/0050595 A1 2/2008 Nakagawara et al.
2008/0073653 A1 3/2008 Iwasaki
2008/0083950 A1 4/2008 Pan et al.
2008/0106191 A1 5/2008 Kawase
2008/0128689 A1 6/2008 Lee et al.
2008/0129195 A1 6/2008 Ishizaki et al.
2008/0166834 A1 7/2008 Kim et al.
2008/0182358 A1 7/2008 Cowdery-Corvan et al.
2008/0224133 A1 9/2008 Park et al.
2008/0254569 A1 10/2008 Hoffman et al.
2008/0258139 A1 10/2008 Ito et al.
2008/0258140 A1 10/2008 Lee et al.
2008/0258141 A1 10/2008 Park et al.
2008/0258143 A1 10/2008 Kim et al.
2008/0296568 A1 12/2008 Ryu et al.
2008/0308805 A1 12/2008 Akimoto et al.
2009/0045397 A1 2/2009 Iwasaki
2009/0067632 A1 3/2009 Nakano et al.
2009/0068773 A1 3/2009 Lai et al.
2009/0073325 A1 3/2009 Kuwabara et al.
2009/0114910 A1 5/2009 Chang
2009/0134399 A1 5/2009 Sakakura et al.
2009/0152506 A1 6/2009 Umeda et al.
2009/0152541 A1 6/2009 Maekawa et al.
2009/0167352 A1 7/2009 Norman
2009/0267645 A1* 10/2009 Lee et al. ........................ 326/41
2009/0278122 A1 11/2009 Hosono et al.
2009/0280600 A1 11/2009 Hosono et al.
2010/0065844 A1 3/2010 Tokunaga
2010/0084648 A1 4/2010 Watanabe
2010/0092800 A1 4/2010 Itagaki et al.
2010/0109002 A1 5/2010 Itagaki et al.
2010/0134141 A1* 6/2010 Bertin et al. .................... 326/39
2010/0134735 A1 6/2010 Nakamura et al.
2010/0148171 A1 6/2010 Hayashi et al.
2010/0207660 A1* 8/2010 Madurawe ...................... 326/41
2010/0276689 A1 11/2010 Iwasaki
2010/0279462 A1 11/2010 Iwasaki
2010/0295042 A1* 11/2010 Yano et al. ...................... 257/43
2010/0320458 A1 12/2010 Umeda et al.
2010/0320459 A1 12/2010 Umeda et al.
2011/0175646 A1 7/2011 Takemura et al.
2011/0193083 A1 8/2011 Kim et al.
2011/0215328 A1 9/2011 Morosawa et al.
2012/0119205 A1 5/2012 Taniguchi et al.
2012/0212995 A1 8/2012 Kurokawa
2012/0268164 A1 10/2012 Kobayashi et al.
2012/0293202 A1 11/2012 Nishijima et al.

FOREIGN PATENT DOCUMENTS

EP 2226847 A 9/2010
JP 60-198861 A 10/1985
JP 63-210022 A 8/1988
JP 63-210023 A 8/1988
JP 63-210024 A 8/1988
JP 63-215519 A 9/1988
JP 63-239117 A 10/1988
JP 63-265818 A 11/1988
JP 05-251705 A 9/1993
JP 06-077319 A 3/1994
JP 08-264794 A 10/1996
JP 10-285014 A 10/1998
JP 11-505377 5/1999
JP 2000-044236 A 2/2000
JP 2000-150900 A 5/2000
JP 3106998 11/2000
JP 2002-076356 A 3/2002
JP 2002-289859 A 10/2002

(56) References Cited

FOREIGN PATENT DOCUMENTS

| | | |
|---|---|---|
| JP | 2002-374165 A | 12/2002 |
| JP | 2003-086000 A | 3/2003 |
| JP | 2003-086808 A | 3/2003 |
| JP | 2004-015060 A | 1/2004 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-103918 A | 4/2007 |
| JP | 2007-123861 A | 5/2007 |
| JP | 4121138 | 7/2008 |
| JP | 2008-281988 A | 11/2008 |
| JP | 2009-099847 A | 5/2009 |
| JP | 2009-231613 | 10/2009 |
| JP | 2010-016347 | 1/2010 |
| JP | 4415062 | 2/2010 |
| JP | 2010-067954 | 3/2010 |
| JP | 2010-153834 | 7/2010 |
| JP | 2010-177431 | 8/2010 |
| JP | 4571221 | 10/2010 |
| JP | 4801054 | 10/2011 |
| JP | 2012-160679 | 8/2012 |
| KR | 2010-0061393 | 6/2010 |
| WO | WO-2004/114391 | 12/2004 |
| WO | WO 2005/117262 | 12/2005 |
| WO | WO 2006/115213 | 11/2006 |
| WO | WO 2007/029844 | 3/2007 |
| WO | WO 2008/126879 | 10/2008 |
| WO | WO-2008/133345 | 11/2008 |

OTHER PUBLICATIONS

Fortunato.E et al., "Wide-Bandgap High-Mobility ZNO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letter) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System, ", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compunds InMO3(ZnO)m (M=In,GA; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous Gizo (Ga2O3-In2O-ZnO) TFT,", SID Digest '08 : SID International Symposium Digest of Technical Papers, May 20, 2008, vol. 39, pp. 633-636.

Lee.J et al., "Worlds's Largest (15-inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its

(56) References Cited

OTHER PUBLICATIONS

Bending Properties,", SID Digest '09 : SID International Symposium Digest of Technical Papers, May 31, 2009, pp. 983-985.
Sakata.J et al., "Development of 4.0-in. AMOLED Display With Driver Circuit Using Amorphous In-Ga-Zn-Oxide TFTS,", IDW '09 : Proceedings of the 16TH International Display Workshops, 2009, pp. 689-692.
Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZNO TFT,", IMID '07 Digest, 2007, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-ZNn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.
Ohara.H et al., "21.3:4.0 in. QVGA AMOLED Display Using In-Ga-Zn-Oxide TFTS With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors, ", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications, ", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology, ", SID Digest '09 : SID International Symposium Digest of Technical Papers, May 31, 2009, pp. 395-398.
Lee.H. et al., "Current Status of, Challenges to, and Perspective View of AM-OLED, ", IDW '06 : Proceedings of the 13th International Display Worshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application, ", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "SPINEL,YBFE2O4, and YB2FE3O7 Types of Structures for Compounds in the IN2O3 and SC2O3-A2O3-BO Systems [A; FE, GA, OR AL; B: MG, MN, FE, NI, CU,OR ZN]at Temperatures Over 1000°C, ", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", JPN. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B. (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.
International Search Report (Application No. PCT/JP2012/062246) Dated Aug. 21, 2012.
Written Opinion (Application No. PCT/JP2012/062246) Dated Aug. 21, 2012.
Kamiya et al., "Carrier Transport Properties and Electronic Structures of Amorphous Oxide Semiconductors: the present status," Solid State Physics, Sep. 1, 2009, vol. 44, No. 9, pp. 621-633, AGNE Gijutsu Center.
Jeon et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

(56) References Cited

OTHER PUBLICATIONS

Ishii et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.
Choi et al., "New Non-Volatile Memory Structures for FPGA Architectures," IEEE Transactions on Very Large Scale Integration (VLSI) Systems, Jul. 1, 2008, vol. 16, No. 7, pp. 874-881, IEEE.
International Search Report (Application No. PCT/JP2010/072839) dated Feb. 1, 2011.
Written Opinion (Application No. PCT/JP2010/072839) dated Feb. 1, 2011.
Kim et al., "An Experimental High-Density DRAM Cell with a Built-in Gain Stage," IEEE Journal of Solid-State Circuits, Aug. 1, 1994, vol. 29, No. 8, pp. 978-981.
Shukuri et al., "A Complementary Gain Cell Technology for Sub-1V Supply DRAMs," IEDM 92: Technical Digest of International Electron Devices Meeting, Dec. 13, 1992, pp. 1006-1008.
Shukuri, "A Semi-Static Complementary Gain Cell Technology for Sub-1 V Supply DRAM's," IEEE Transactions on Electron Devices, Jun. 1, 1994, vol. 41, No. 6, pp. 926-931.
Song et al., "Short Channel Characteristics of Gallium-Indium-Zinc-Oxide Thin Film Transistors for Three-Dimensional Stacking Memory," IEEE Electron Device Letters, Jun. 1, 2008, vol. 29, No. 6, pp. 549-552.

* cited by examiner 233
229
231
A
B
C
D 235b
235a
235c
235
A
B
C
D 241a
237
239
237
241b
A
B
C
D FIG. 13A
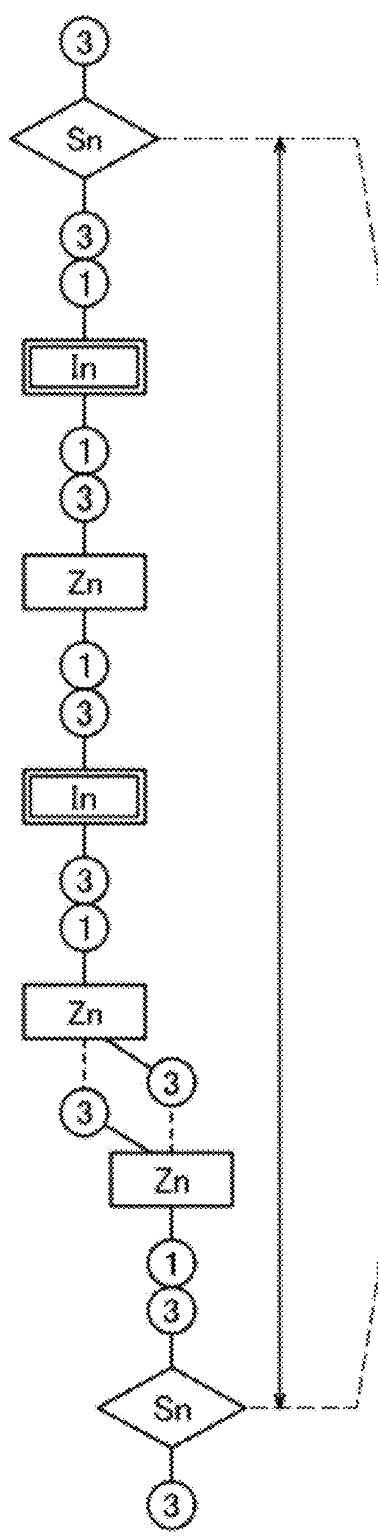
FIG. 13B
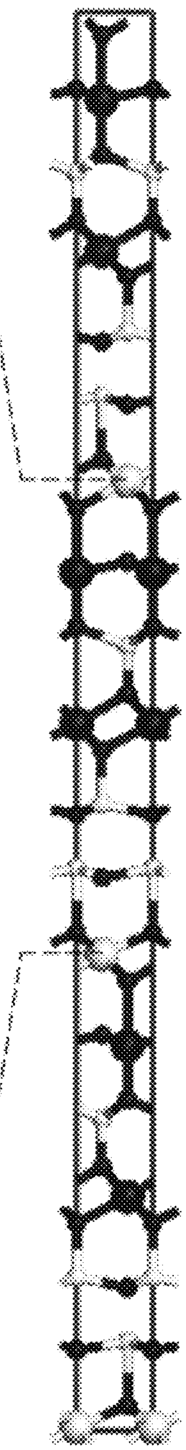
FIG. 13C
In
Sn
Zn
O FIG. 14B
FIG. 14A
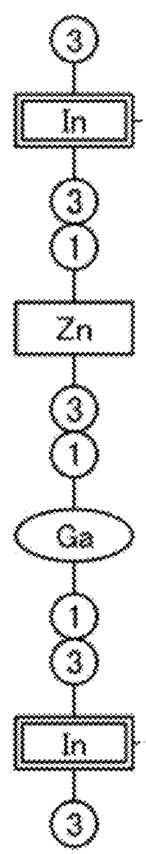
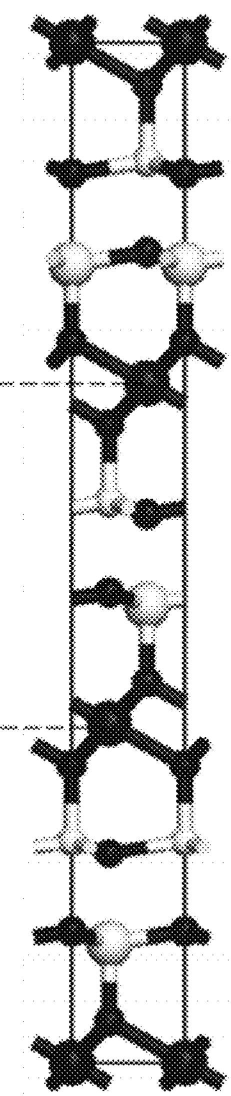
FIG. 14C
In
Ga
Zn
O 5 nm
33 nm
5 nm
1106a
1107
1105
1106b
1108a
1108b
1102
1102
1103b
1103a
1104
1103c
1101

Loff
33 nm
Loff
1106a
1107
1105
1106b
1108a
1108b
1102
1102
1103b
1103a
1104
1103c
1101

PROGRAMMABLE LOGIC DEVICE

TECHNICAL FIELD

The present invention relates to a programmable logic device and a semiconductor device including the programmable logic device. Further, the present invention relates to an electronic device including the semiconductor device.

BACKGROUND ART

In general, a circuit structure of a semiconductor integrated circuit typified by an integrated circuit (IC) or a large scale integrated circuit (LSI) is fixed at the time of manufacture and cannot be changed after the manufacture. In contrast, a semiconductor integrated circuit called a programmable logic device (PLD) has a structure in which unit logic blocks each including a plurality of logic circuits are electrically connected to each other through wirings. In the programmable logic device, a circuit structure of each logic block can be controlled by an electric signal.

Accordingly, the design of the programmable logic device can be changed even after the manufacture. Thus, time and cost required for designing and developing a semiconductor integrated circuit can be greatly reduced with the use of the programmable logic device.

The programmable logic device includes a complex PLD (CPLD) and a field programmable gate array (FPGA). In either of the programmable logic devices, connection of logic blocks is controlled by a programmable switch at an intersection of wirings between the logic blocks, which operates in accordance with data (configuration data) stored in a memory portion. In other words, data is programmed into each programmable switch for controlling connection of wirings between logic blocks, whereby a circuit structure of a programmable logic device can be changed.

A volatile memory such as a static random access memory (SRAM) is mainly used in the memory portion of the programmable logic device. On the other hand, a non-volatile memory including a floating gate transistor, such as a flash memory, is included in the memory portion in some cases, as disclosed in Patent Document 1.

REFERENCE

Patent Document

[Patent Document 1] Japanese Published Patent Application No. 2002-374165

DISCLOSURE OF INVENTION

In recent years, a reduction in power consumption of an electronic device is an important object, and a reduction in power consumption of a semiconductor integrated circuit used in the electronic device is highly required. In order to reduce power consumption, a driving method has been proposed in which supply of power supply potential to the entire semiconductor device or part thereof is temporarily stopped and a power supply potential is supplied to only a circuit block which requires power when needed (such a method is hereinafter referred to as a normally-off driving method).

However, in a programmable logic device including a volatile memory in a memory portion of a programmable switch for controlling connection of wirings between logic blocks, when the supply of power supply potential is stopped, configuration data stored in the memory portion is lost. Accordingly, in the programmable logic device including the volatile memory in the memory portion of the programmable switch, configuration data needs to be written to the volatile memory every time the power is supplied. Therefore, there is a long delay time from the start of supply of power to operation of the programmable logic device. In other words, in the programmable logic device including the volatile memory in the memory portion of the programmable switch, it is difficult to perform a normally-off driving method in which supply of power supply potential is temporarily stopped.

In the case where a non-volatile memory, which has a floating gate transistor, is used in a memory portion of a programmable switch for controlling connection of wirings between logic blocks in a programmable logic device, configuration data can be held even when power supply potential is not supplied temporarily by a normally-off driving method. However, a high potential is needed because electrons are injected into a floating gate in data writing; accordingly, a long time is required to write data. Moreover, a gate insulating layer of the floating gate readily deteriorates because of tunneling current in the data writing.

In view of the above problems, it is an object to provide a programmable logic device which can hold configuration data even when a power supply potential is not supplied, has short start-up time after the power is supplied, and can operate with low power.

In an embodiment of the disclosed invention, a transistor in a memory portion of a programmable switch for controlling connection of wirings between logic blocks includes a material which allows a sufficient reduction in off-state current of the transistor, such as an oxide semiconductor material which is a wide bandgap semiconductor. When the semiconductor material which allows a sufficient reduction in off-state current of the transistor is used, configuration data can be held even when a power supply potential is not supplied. Specific structures of a programmable logic device disclosed in this specification are as follows.

An embodiment of the disclosed invention is a programmable logic device including a plurality of logic blocks each including a plurality of logic circuits, a plurality of wirings electrically connected to the plurality of logic blocks and each extending in a row direction or in a column direction, and a plurality of wiring selection circuits each of which is provided at an intersection of the plurality of wirings and controls connection of the plurality of wirings at the intersection. Each of the plurality of wiring selection circuits includes at least one programmable switch which is electrically connected to two of the plurality of wirings at the intersection and controls connection of the two wirings. The programmable switch includes a first transistor and a second transistor. One of a source electrode and a drain electrode of the first transistor is electrically connected to one of the plurality of wirings and the other of the source electrode and the drain electrode of the first transistor is electrically connected to another one of the plurality of wirings. One of a source electrode and a drain electrode of the second transistor is electrically connected to a gate electrode of the first transistor. The second transistor includes an oxide semiconductor layer. A potential input from the other of the source electrode and the drain electrode of the second transistor is held in the gate electrode of the first transistor.

In the above structure, an inverter may be electrically connected between the one of the source electrode and the drain electrode of the second transistor and the gate electrode of the first transistor. Moreover, the programmable logic device may further include a third transistor. One of a source electrode and a drain electrode of the third transistor is electrically connected to the one of the source electrode and the drain electrode of the first transistor, the other of the source electrode and the drain electrode of the third transistor is electrically connected to the other of the source electrode and the drain electrode of the first transistor, and a gate electrode of the third transistor is electrically connected to the one of the source electrode and the drain electrode of the second transistor. The third transistor and the first transistor may have different conductivity types.

In the above structures, the first transistor is preferably formed using single crystal silicon. Further, it is preferable that the second transistor be stacked over the first transistor with an insulating film interposed therebetween and that at least part of the second transistor overlap with at least part of the first transistor. Furthermore, it is preferable that at least part of the second transistor overlap with at least part of a first transistor included in a programmable switch adjacent to the programmable switch including the second transistor.

A capacitor one terminal of which is electrically connected to the one of the source electrode and the drain electrode of the second transistor may be provided.

Another embodiment of the disclosed invention is a programmable logic device including a plurality of logic blocks each including a plurality of logic circuits, a plurality of wirings electrically connected to the plurality of logic blocks and each extending in the row direction or in the column direction, and a plurality of wiring selection circuits each of which is provided at an intersection of the plurality of wirings and controls connection of the plurality of wirings at the intersection. Each of the plurality of wiring selection circuits includes at least one programmable switch which is electrically connected to two of the plurality of wirings at the intersection and controls connection of the two wirings. The programmable switch includes a first transistor, a second transistor, a third transistor, and a fourth transistor. One of a source electrode and a drain electrode of the first transistor is electrically connected to one of the plurality of wirings and the other of the source electrode and the drain electrode of the first transistor is electrically connected to a different one of the plurality of wirings. One of a source electrode and a drain electrode of the second transistor is electrically connected to the one of the plurality of wirings and the other of the source electrode and the drain electrode of the second transistor is electrically connected to the different one of the plurality of wirings. One of a source electrode and a drain electrode of the third transistor is electrically connected to a gate electrode of the first transistor. One of a source electrode and a drain electrode of the fourth transistor is electrically connected to a gate electrode of the second transistor and a gate electrode of the fourth transistor is electrically connected to a gate electrode of the third transistor. The second transistor and the first transistor have different conductivity types. The third transistor and the fourth transistor each include an oxide semiconductor layer. A first potential input from the other of the source electrode and the drain electrode of the third transistor is held in the gate electrode of the first transistor. A second potential input from the other of the source electrode and the drain electrode of the fourth transistor is held in the gate electrode of the second transistor. A polarity of the second potential is opposite to a polarity of the first potential.

In the above structure, a capacitor one terminal of which is electrically connected to the one of the source electrode and the drain electrode of the third transistor or the fourth transistor may be provided.

A transistor in a memory portion of a programmable switch for controlling connection of wirings between logic blocks includes a wide bandgap semiconductor such as an oxide semiconductor, which allows a sufficient reduction in off-state current of the transistor, whereby configuration data can be held even when a power supply potential is not supplied. With such a structure, writing of configuration data after the power is supplied can be omitted, so that start-up time of a programmable logic device can be short. Accordingly, a reduction in power consumption of a programmable logic device can be achieved by a normally-off driving method.

BRIEF DESCRIPTION OF DRAWINGS

In the accompanying drawings:

FIGS. 13A to 13C illustrate a structure of an oxide;

FIGS. 14A to 14C illustrate a structure of an oxide;

BEST MODE FOR CARRYING OUT THE INVENTION

Figure 1A:
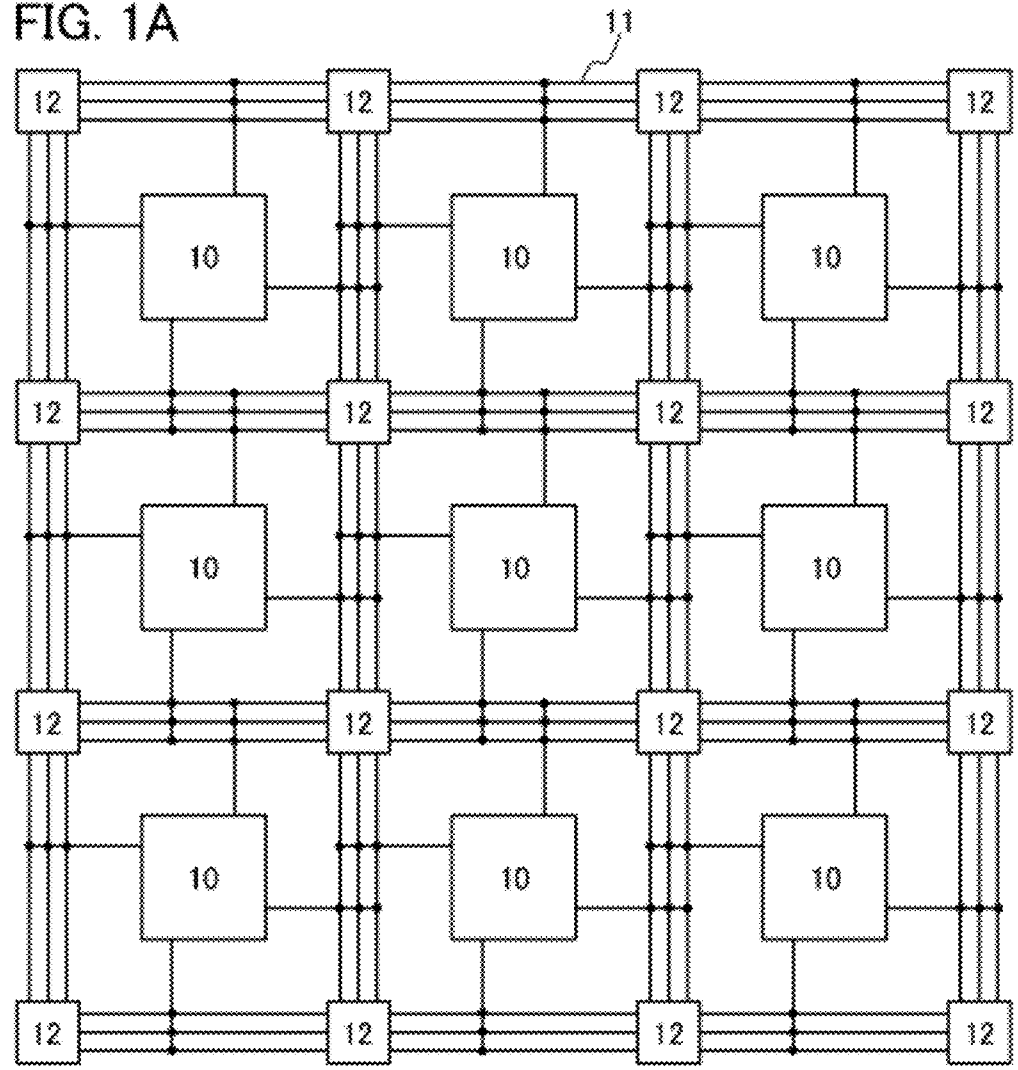
FIGS. 1A and 1B are circuit diagrams illustrating a programmable logic device according to an embodiment of the present invention.

Hereinafter, embodiments of the present invention will be described below with reference to the accompanying drawings. Note that the present invention is not limited to the description below, and it is easily understood by those skilled in the art that various changes and modifications can be made without departing from the spirit and scope of the present invention. Accordingly, the present invention should not be construed as being limited to the description of the embodiments below.

Note that functions of the "source" and "drain" may be switched in the case where transistors of different polarities are employed or in the case where the direction of a current flow changes in a circuit operation, for example. Therefore, the terms "source" and "drain" can be interchanged in this specification.

Note that the term "electrically connected" includes the case where components are connected through an "object having any electric function". There is no particular limitation on the "object having any electric function" as long as electric signals can be transmitted and received between the components connected through the object. Examples of the "object having any electric function" are a switching element such as a transistor, a resistor, an inductor, a capacitor, and an element with a variety of functions as well as an electrode and a wiring.

Even when a circuit diagram shows independent components as if they are electrically connected to each other, there is actually a case where one conductive film has functions of a plurality of components such as a case where part of a wiring also functions as an electrode. The expression "electrically connected" in this specification also includes such a case where one conductive film has functions of a plurality of components.

The terms "over" and "below" do not necessarily mean "directly on" and "directly under", respectively, in the description of a positional relation between components. For example, the expression "a gate electrode over a gate insulating layer" can mean the case where there is an additional component between the gate insulating layer and the gate electrode.

Note that the position, size, range, or the like of each component illustrated in drawings is not accurately represented in some cases for easy understanding. Therefore, the disclosed invention is not necessarily limited to the position, size, range, or the like as disclosed in the drawings.

The ordinal numbers such as "first", "second", and "third" are used in order to avoid confusion among components.

Embodiment 1

In this embodiment, a circuit structure of a programmable logic device according to an embodiment of the disclosed invention will be described with reference to FIGS. 1A and 1B, FIGS. 2A to 2C, FIGS. 3A to 3D, FIGS. 4A to 4C, and FIGS. 5A to 5C.

FIG. 1A shows a structure of a programmable logic device according to an embodiment of the disclosed invention. The programmable logic device includes a plurality of logic blocks 10 each including a plurality of logic circuits, a plurality of wirings 11 electrically connected to the plurality of logic blocks 10, and switch matrixes 12 each provided at an intersection of the plurality of wirings 11. The plurality of logic blocks 10 is preferably arranged in matrix as illustrated in FIG. 1A. At least one wiring 11 is provided between the logic blocks 10 and extends in the row direction or in the column direction. Further, each of the switch matrixes 12 is provided at the intersection of the plurality of wirings 11 extending in the row direction and the plurality of wirings 11 extending in the column direction. As illustrated in FIG. 1A, the plurality of wirings 11 and the plurality of switch matrixes 12 are provided so as to surround the peripheral portions of the plurality of logic blocks 10.

Note that the logic blocks 10 are not necessarily arranged in matrix with intervals. For example, the logic blocks 10 may be provided adjacent to each other in the row direction or in the column direction without wiring 11 therebetween. In that case, at least one wiring 11 is provided between groups of logic blocks adjacent to each other in the row direction or in the column direction. Each of the switch matrixes 12 is provided at the intersection of the plurality of wirings 11 extending in the row direction and the plurality of wirings 11 extending in the column direction. The plurality of wirings 11 and the plurality of switch matrixes 12 may be provided so as to surround the peripheral portion of the plurality of logic blocks 10. Any logic circuit can be used as a logic circuit included in the logic block 10. For example, a logic gate may be used, or a logic circuit in which logic gates are combined may be used.

The number of the logic blocks 10, the number of the wirings 11, and the number of the switch matrixes 12 are set as appropriate, and are not limited to the numbers in FIG. 1A.

The programmable logic device may further include a multiplier, a random access memory (RAM) block, a phase-locked loop (PLL) block, or an input/output (I/O) element. The multiplier has a function of multiplying plural pieces of data at high speed. The RAM block has a function of storing given data as a memory. The PLL block has a function of supplying a clock signal to a circuit in the programmable logic device. The I/O element has a function of controlling signal passing between the programmable logic device and an external circuit.

The logic block 10 includes a plurality of logic circuits. A desired logic circuit selected from the plurality of logic circuits is connected, so that a logic circuit having a desired logic function can be formed. Such a logic block 10 can be obtained in such a manner that a plurality of logic circuits is connected via a switch which performs switching of connection in accordance with stored data.

Alternatively, the above logic block 10 can be formed using a look-up table including a plurality of logic circuits. In response to an input signal, the look-up table can perform arithmetic processing in accordance with data stored in a memory provided in each logic block to output an output signal.

The logic block 10 may include a sequential circuit such as a flip flop or a counter circuit; for example, a shift register may be provided.

Figure 1B:
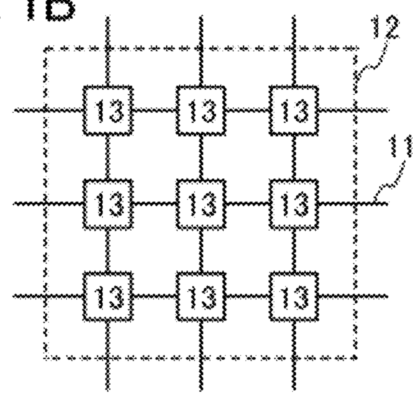

FIG. 1B illustrates a structure of one of the switch matrixes 12 in FIG. 1A. As illustrated in FIG. 1B, the switch matrix 12 includes wiring selection circuits 13 each at an intersection of one of the plurality of wirings 11 extending in the row direction and one of the plurality of wirings 11 extending in the column direction.

Figure 2A:
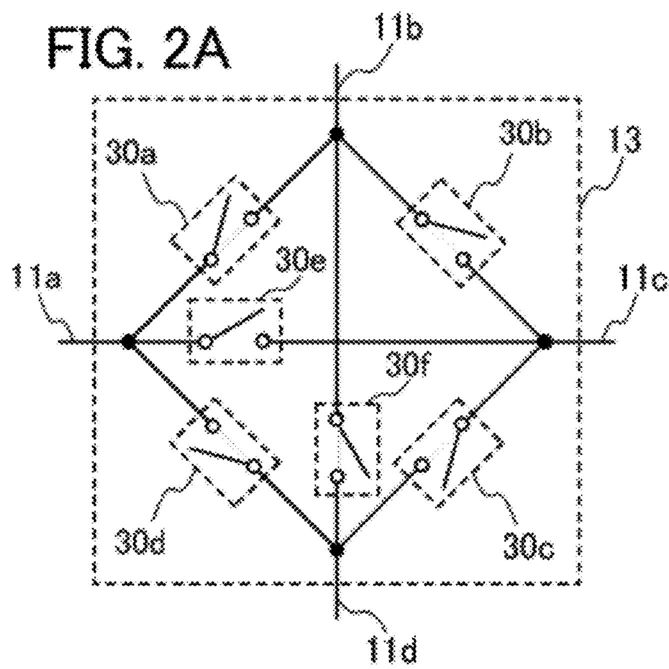
FIGS. 2A to 2C are circuit diagrams each illustrating part of a programmable logic device according to an embodiment of the present invention.

FIG. 2A illustrates a structure of the wiring selection circuit 13 in FIG. 1B. The wiring selection circuit 13 includes wirings 11*a* to 11*d* and programmable switches 30*a* to 30*f*. The wiring 11*a* is electrically connected to the wiring 11*b* through the programmable switch 30*a*, to the wiring 11*c* through the programmable switch 30*e*, and to the wiring 11*d* through the programmable switch 30*d*. The wiring 11*b* is electrically connected to the wiring 11*c* through the programmable switch 30*b* and to the wiring 11*d* through the programmable switch 30*f*. The wiring 11*c* is electrically connected to the wiring 11*d* through the programmable switch 30*c*.

The wiring 11*a* and the wiring 11*c* correspond to the wirings 11 which extend in the row direction as shown in FIGS. 1A and 1B, and each of the wiring 11*a* and wiring 11*c* can branch in another direction in the wiring selection circuit 13. For example, as illustrated in FIG. 2A, the wiring 11*a* extending in the row direction can be electrically connected to the wirings 11*b* and 11*d* by the programmable switches 30*a* and 30*d* to branch in the column direction. Similarly, the wiring 11*b* and the wiring 11*d* corresponding to the wirings 11 which extend in the column direction as shown in FIGS. 1A and 1B can also branch in the row direction by the programmable switches 30*a* to 30*d* of the wiring selection circuit 13.

Although four wirings (wirings 11*a* to 11*d*) are provided in the wiring selection circuit 13 in FIG. 2A, the structure of the wiring selection circuit 13 described in this embodiment is not limited to the above structure. The number of wirings provided in a wiring selection circuit depends on the number of wirings provided in a programmable logic device; therefore, two or more wirings are provided as appropriate and the programmable switches are provided in accordance with the number of the wirings.

Here, each of the programmable switches 30*a* to 30*f* controls connection of two of the wirings 11*a* to 11*d* in accordance with stored data (also referred to as configuration data). Thus, in the wiring selection circuit 13, on and off of the programmable switches 30*a* to 30*f* are changed, so that a desired connection relation of the wirings 11*a* to 11*d* can be obtained.

In other words, in the wiring selection circuit 13 provided at the intersection of the wirings 11 in the switch matrix 12, on and off of the programmable switches are changed, so that desired logic blocks 10 of the plurality of logic blocks 10 can be selectively connected. Thus, a programmable logic device having a desired logic function can be formed. The switch matrix 12 provided in this manner allows two desired logic blocks 10 to be directly connected to each other without another logic block 10 provided therebetween.

Figure 2B:
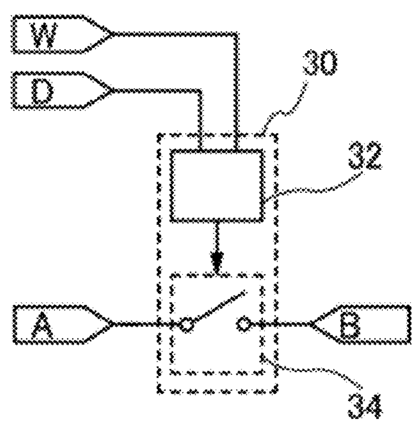

FIG. 2B illustrates a structure of a programmable switch 30 corresponding to each of the programmable switches 30*a* to 30*f* in FIG. 2A. The programmable switch in FIG. 2B includes a terminal A, a terminal B, a memory portion 32, and a switch portion 34.

In the programmable switch 30, the switch portion 34 is controlled in accordance with configuration data stored in the memory portion 32 and thus connection between the terminal A and the terminal B is controlled. Each of the terminal A and the terminal B is electrically connected to one of the plurality of wirings 11 provided in the wiring selection circuit 13. The switch portion 34 is electrically connected to the wirings 11 provided in the wiring selection circuit 13 through the terminal A and the terminal B. The memory portion 32 is electrically connected to a data line D for inputting a potential of configuration data to be stored in the memory portion, to a word line W for inputting a signal for controlling writing of the configuration data to the memory portion, and to the switch portion 34 at a node storing the configuration data.

Figure 2C:
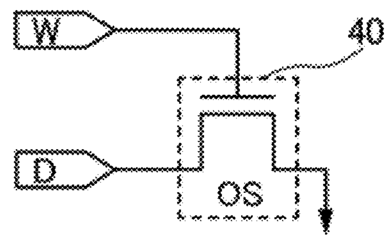

FIG. 2C illustrates a structure of the memory portion 32 included in the programmable switch 30. As illustrated in FIG. 2C, the memory portion 32 includes a transistor 40. One of a source electrode and a drain electrode of the transistor 40 is electrically connected to the switch portion 34, the other of the source electrode and the drain electrode of the transistor 40 is electrically connected to the data line D, and a gate electrode of the transistor 40 is electrically connected to the word line W. Here, a transistor having extremely small off-state current is used as the transistor 40. In the off state of the transistor 40, a potential corresponding to configuration data can be held in the one of the source electrode and the drain electrode electrically connected to the switch portion 34. For example, when the state where one of a source electrode and a drain electrode is at a high potential corresponds to “1” and the state where one of a source electrode and a drain electrode is at a low potential corresponds to “0”, one-bit configuration data can be stored.

The transistor having extremely small off-state current includes, in a channel formation region, a wide bandgap semiconductor which has a wider bandgap and lower intrinsic carrier density than a silicon semiconductor. As one example of a wide bandgap semiconductor which has a wider bandgap and lower intrinsic carrier density than a silicon semiconductor, a compound semiconductor such as silicon carbide (SiC) or gallium nitride (GaN), an oxide semiconductor formed of a metal oxide such as In—Ga—Zn—O-based oxide semiconductor, or the like can be used. In this embodiment, a transistor including an oxide semiconductor is used as the transistor having extremely small off-state current in the memory portion 32. Note that in a circuit diagram, in some cases, “OS” is written beside a transistor in order to indicate that the transistor includes an oxide semiconductor.

Figure 3A:
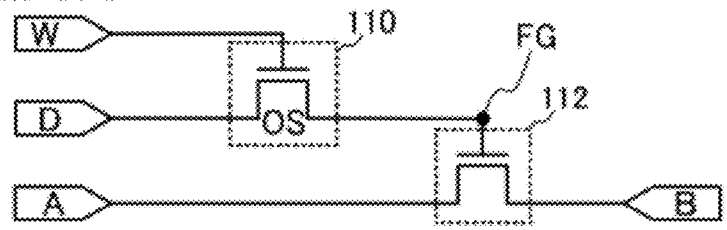
FIGS. 3A to 3D are circuit diagrams each illustrating part of a programmable logic device according to an embodiment of the present invention.

FIG. 3A illustrates a specific circuit structure of the programmable switch 30 including the memory portion 32 and the switch portion 34. The programmable switch in FIG. 3A includes a transistor 112 and a transistor 110. One of a source electrode and a drain electrode of the transistor 112 is electrically connected to the terminal A and the other of the source electrode and the drain electrode of the transistor 112 is electrically connected to the terminal B of the programmable switch. One of a source electrode and a drain electrode of the transistor 110 is electrically connected to a gate electrode of the transistor 112, the other of the source electrode and the drain electrode of the transistor 110 is electrically connected to the data line D, and a gate electrode of the transistor 110 is electrically connected to the word line W.

The terminal A is one terminal of the programmable switch and is electrically connected to one of the plurality of wirings 11 provided in the wiring selection circuit 13. The terminal B is the other terminal of the programmable switch and is electrically connected to another one of the plurality of wirings 11 provided in the wiring selection circuit 13. The transistor 110 corresponds to the memory portion 32 in FIG. 2B and includes an oxide semiconductor layer. The transistor 112 corresponds to the switch portion 34 in FIG. 2B. Note that the transistor 112 may be an n-channel transistor or a p-channel transistor. In this embodiment, the transistor 112 is an n-channel transistor.

In the programmable switch in FIG. 3A, a potential corresponding to configuration data is supplied to a node at which the one of the source electrode and the drain electrode of the transistor 110 and the gate electrode of the transistor 112 are electrically connected to each other (hereinafter also referred to as a node FG), and the potential is held in the node FG, so that electrical conduction between the terminal A and the terminal B is determined. A writing operation and a holding operation of the configuration data in the programmable switch are described below.

First, a potential of the word line W is set to a potential at which the transistor 110 is turned on, so that the transistor 110 is turned on. Thus, a potential of the data line D is supplied to the node FG. In other words, a given potential is supplied to the gate electrode of the transistor 112 (data writing). Here, in the case where the given potential is a high potential, the n-channel transistor 112 is turned on, so that electrical conduction between the terminal A and the terminal B is obtained. In the case where the given potential is a low potential, the n-channel transistor 112 is turned off, so that electrical conduction between the terminal A and the terminal B is not obtained.

After the potential of the data line D is written to the node FG, while the potential of the data line D is kept, the potential of the word line W is set to a potential at which the transistor 110 is turned off, so that the transistor 110 is turned off. The transistor 110 includes a wide bandgap semiconductor such as an oxide semiconductor and has extremely small off-state current; therefore, the given potential supplied to the node FG is held (data holding). In other words, the given potential supplied to the gate electrode of the transistor 112 is held, and thus, the connection state of the transistor 112 is also kept. Thus, a connection state of the programmable switch in FIG. 3A can be kept without supply of a power supply potential.

Thus, a transistor in a memory portion of a programmable switch for controlling connection of wirings between logic blocks includes a wide bandgap semiconductor such as an oxide semiconductor, which allows a sufficient reduction in off-state current of the transistor, whereby configuration data can be held for a long time even when a power supply potential is not supplied, and a connection state of the programmable switch can be kept. Accordingly, even when a power supply potential is not supplied to a logic block and a plurality of programmable switches by a driving method (normally-off driving method) in which supply of power supply potential to the entire programmable logic device or part thereof is temporarily stopped and a power supply potential is supplied to only a circuit block which requires power when needed, a connection state of the logic blocks can be kept. Thus, by the normally-off driving method, writing of configuration data after the power is supplied can be omitted, so that start-up time of the programmable logic device can be short. Accordingly, a reduction in power consumption of the programmable logic device in this embodiment can be achieved by the normally-off driving method.

Further, a potential corresponding to configuration data is supplied to the node FG through the transistor 110, whereby the data can be written. As compared to the case where a floating gate is used for a memory portion of a programmable switch and configuration data is written by injection of electrons, a potential and time required for writing data can be greatly reduced. Moreover, deterioration of a gate insulating layer of a floating gate by the tunneling current in the injection of electrons does not occur; accordingly, the number of data rewrite cycles can be increased.

In a general programmable logic device, a connection state of logic blocks is changed by switching of a programmable switch in a state where a semiconductor device including the programmable logic device does not operate. This is called configuration. In contrast, configuration performed in a state where the semiconductor device is operating is called dynamic configuration. As described above, the programmable switch of this embodiment can write configuration data at high speed; accordingly, the dynamic configuration can be easily performed.

In the programmable switch, the connection state of the plurality of logic circuits may be stored in not only the wiring selection circuit 13 in FIG. 1A but also the logic block 10 in FIG. 1A.

Programmable switches each having a structure different from the structure in FIG. 3A are described with reference to FIGS. 3B to 3D, FIGS. 4A to 4C, and FIGS. 5A to 5C.

Figure 3B:
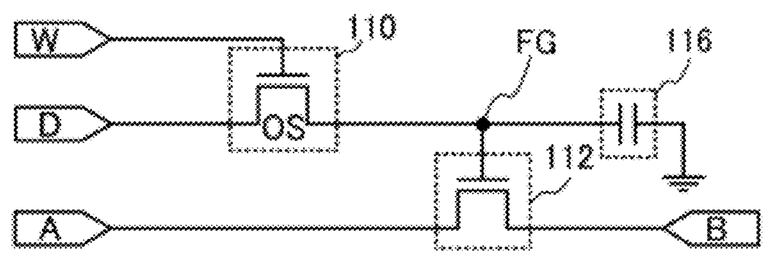

A programmable switch in FIG. 3B is different from the programmable switch in FIG. 3A in that a capacitor 116 is included. One terminal of the capacitor 116 is electrically connected to the node FG and the other terminal of the capacitor 116 is kept at a fixed potential. The other terminal of the capacitor 116 is grounded in this embodiment. Note that the other structure is similar to that of the programmable switch in FIG. 3A.

The capacitor 116 is provided in this way, so that charge supplied to the node FG in input of a potential corresponding to the configuration data to the node FG from the data line D can be easily held; accordingly, the configuration-data-holding characteristics of the programmable switch can be easily improved. In the case where the parasitic capacitance of the node FG is sufficiently large, an effect similar to the effect obtained in the case where capacitor 116 is provided can be obtained even without a capacitor.

Figure 3C:
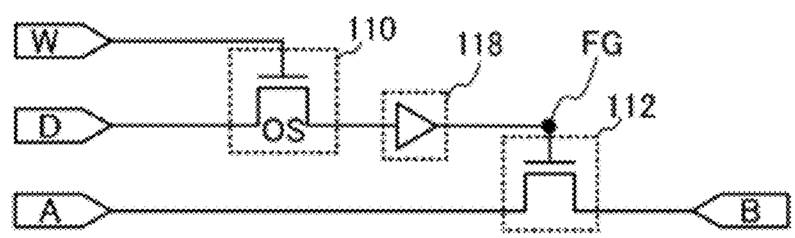

A programmable switch in FIG. 3C is different from the programmable switch in FIG. 3A in that a buffer 118 is provided between the one of the source electrode and the drain electrode of the transistor 110 and the gate electrode of the transistor 112. Here, the node which includes the gate electrode of the transistor 112 is the node FG. Note that the other structure is similar to that of the programmable switch in FIG. 3A.

The buffer 118 is provided in this way and a potential is supplied to the node FG from a power supply line, so that change of a potential of the node FG due to a capacitive coupling of the transistor 112 can be prevented even when the potential of the terminal A or the terminal B is changed. Further, when the buffer 118 is provided, a potential corresponding to the power supply potential can be input to the node FG even when the potential input from the data line D drops by the threshold potential of the transistor 110 in the transistor 110.

Figure 3D:
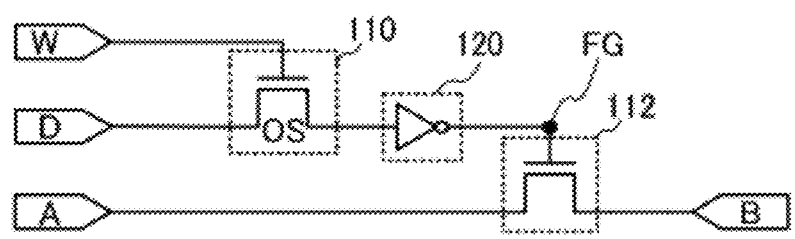

A programmable switch in FIG. 3D is different from the programmable switch in FIG. 3A in that an inverter 120 is provided between the one of the source electrode and the drain electrode of the transistor 110 and the gate electrode of the transistor 112. Here, the node which includes the gate electrode of the transistor 112 is the node FG. Note that the other structure is similar to that of the programmable switch in FIG. 3A. A polarity of the potential input from the data line D is inverted by the inverter 120, so that an operation of the transistor 112 in the programmable switch in FIG. 3D is the reverse of the operation of the transistor 112 in the programmable switch in FIG. 3A.

The inverter 120 is provided in this way and a potential is supplied to the node FG from a power supply line, so that change of a potential of the node FG due to a capacitive coupling of the transistor 112 can be prevented even when the potential of the terminal A or the terminal B is changed. Further, when the inverter 120 is provided, a potential corresponding to the power supply potential can be input to the node FG even when the potential input from the data line D drops by the threshold potential of the transistor 110 in the transistor 110.

In each of the programmable switches in FIGS. 3A to 3D, the transistor 112 is used in the switch portion, but the structure of the switch portion according to this embodiment is not limited thereto. A transmission gate 134 can be used instead of the transistor 112 used in the switch portion.

Figure 4A:
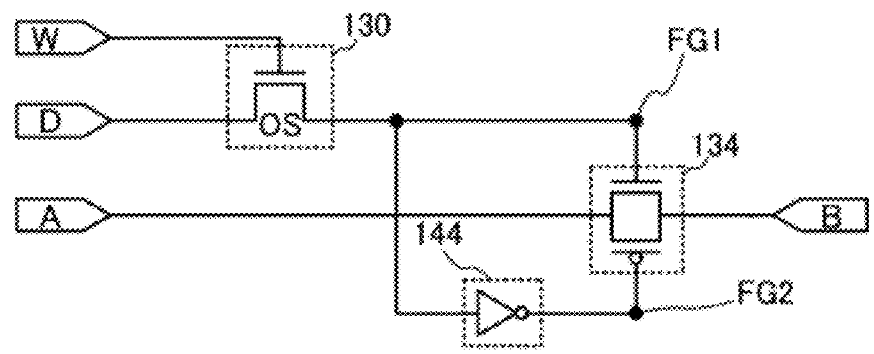
FIGS. 4A to 4C are circuit diagrams each illustrating part of a programmable logic device according to an embodiment of the present invention.

For example, a structure illustrated in FIG. 4A may be employed. A programmable switch in FIG. 4A includes a transistor 130, the transmission gate 134, and an inverter 144. The transmission gate 134 includes an n-channel transistor and a p-channel transistor. One of a source electrode and a drain electrode of each of the transistors is electrically connected to the terminal A, and the other of the source electrode and the drain electrode of each of the transistors is electrically connected to the terminal B. A gate electrode of the n-channel transistor (node FG1) is electrically connected to one of a source electrode and a drain electrode of the transistor 130, and a gate electrode of the p-channel transistor (node FG2) is electrically connected to the one of the source electrode and the drain electrode of the transistor 130 through the inverter 144. The other of the source electrode and the drain electrode of the transistor 130 is electrically connected to the data line D and a gate electrode of the transistor 130 is electrically connected to the word line W. The transistor 130 includes an oxide semiconductor layer. Although the inverter 144 is provided between the one of the source electrode and the drain electrode of the transistor 130 and the gate electrode of the p-channel transistor of the transmission gate 134 in FIG. 4A, the structure of the programmable switch is not limited to this. The inverter 144 may be provide between the one of the source electrode and the drain electrode of the transistor 130 and the gate electrode of the n-channel transistor of the transmission gate 134.

In other words, the programmable switch in FIG. 4A is different from the programmable switch in FIG. 3A in that the transmission gate 134 is provided instead of the transistor 112 included in the switch portion and that the inverter 144 is provided between the gate electrode of one of the transistors of the transmission gate 134 and the one of the source electrode and the drain electrode of the transistor 130.

In the case where a switch portion of a programmable switch includes one transistor, a potential which is higher (or lower) than the highest (or lowest) potential applied to a source electrode or a drain electrode of the transistor by the threshold voltage of the transistor needs to be applied to a gate electrode of the transistor so that the connection state (on state or off state) of the transistor is kept. However, as described above, when a transmission gate is used in a switch portion of a programmable switch, switching can be performed even without application of the potential higher (or lower) than the highest (or lowest) potential by the threshold voltage to a gate electrode. Thus, a reduction in power consumption of the programmable switch can be achieved.

Figure 4B:
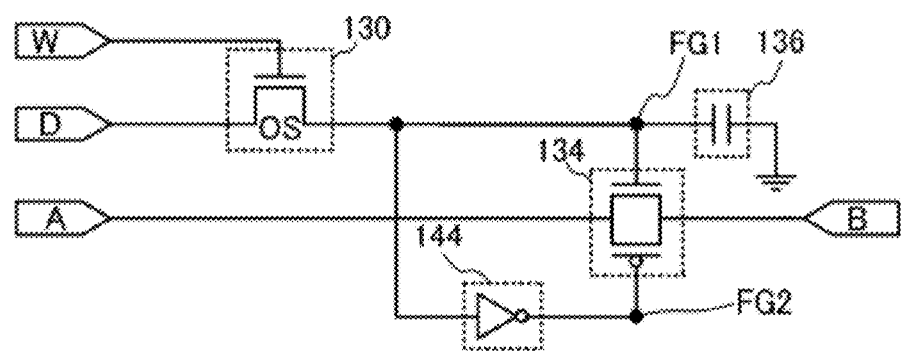

A programmable switch in FIG. 4B is different from the programmable switch in FIG. 4A in that a capacitor 136 is included. One terminal of the capacitor 136 is electrically connected to the node FG1 and the other terminal of the capacitor 136 is kept at a fixed potential. The other terminal of the capacitor 136 is grounded in this embodiment. Note that the other structure is similar to that of the programmable switch in FIG. 4A.

The capacitor 136 is provided in this way, so that charge supplied to the node FG1 in input of a potential corresponding to the configuration data to the node FG1 from the data line D can be easily held; accordingly, the configuration-data-holding characteristics of the programmable switch can be easily improved. In the case where the parasitic capacitance of the node FG1 is sufficiently large, an effect similar to the effect obtained in the case where capacitor 136 is provided can be obtained even without a capacitor.

Figure 4C:
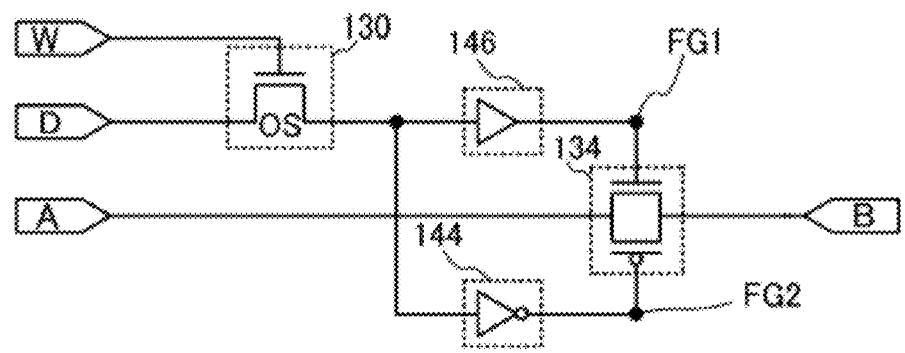

A programmable switch in FIG. 4C is different from the programmable switch in FIG. 4A in that a buffer 146 is provided between the one of the source electrode and the drain electrode of the transistor 130 and the gate electrode of the n-channel transistor of the transmission gate 134. Note that the other structure is similar to that of the programmable switch in FIG. 4A.

The inverter 144 and the buffer 146 are provided and a potential is supplied to each of the node FG1 and the node FG2 from a power supply line, so that change of potentials of the node FG1 and the node FG2 due to a capacitive coupling of the transistors of the transmission gate 134 can be prevented even when the potential of the terminal A or the terminal B is changed. Further, when the inverter 144 and the buffer 146 are provided, a potential corresponding to the power supply potential can be input to the node FG1 and the node FG2 even when the potential input from the data line D drops by the threshold potential of the transistor 130 in the transistor 130.

In each of the programmable switches in FIGS. 4A to 4C, the inverter 144 is used so that a potential input to a gate electrode of one transistor of the transmission gate 134 in the switch portion and a potential input to a gate electrode of the other transistor of the transmission gate 134 have opposite polarities to each other. However, the structure of the programmable switch according to this embodiment is not limited thereto. The data line D to which a potential is input, a data line DB to which a potential having a polarity opposite to a polarity of the potential input to the data line D is input, and transistors including an oxide semiconductor, which are electrically connected to the respective data lines, may be used.

Figure 5A:
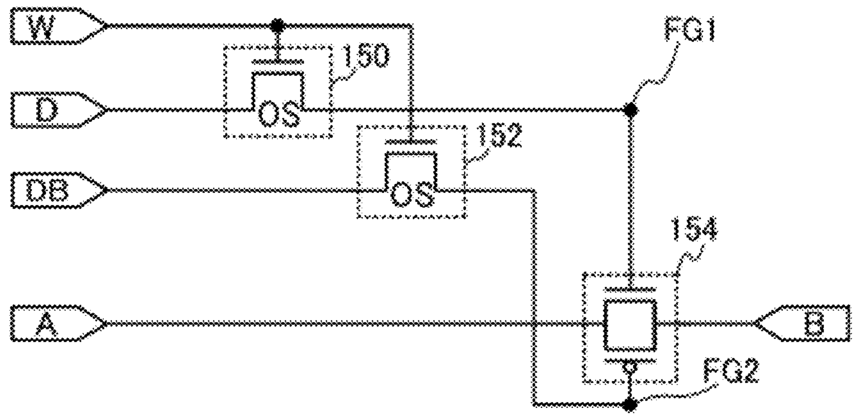
FIGS. 5A to 5C are circuit diagrams each illustrating part of a programmable logic device according to an embodiment of the present invention.

For example, a structure illustrated in FIG. 5A may be employed. A programmable switch in FIG. 5A includes a transistor 150, a transistor 152, and a transmission gate 154. The transmission gate 154 includes an n-channel transistor and a p-channel transistor. One of a source electrode and a drain electrode of each of the transistors of the transmission gate 154 is electrically connected to the terminal A, and the other of the source electrode and the drain electrode of each of the transistors of the transmission gate 154 is electrically connected to the terminal B. A gate electrode of the n-channel transistor (node FG1) is electrically connected to one of a source electrode and a drain electrode of the transistor 150, and a gate electrode of the p-channel transistor (node FG2) is electrically connected to one of a source electrode and a drain electrode of the transistor 152. The other of the source electrode and the drain electrode of the transistor 150 is electrically connected to the data line D, and a gate electrode of the transistor 150 is electrically connected to the word line W. The other of the source electrode and the drain electrode of the transistor 152 is electrically connected to the data line DB, and a gate electrode of the transistor 152 is electrically connected to the word line W. The transistor 150 and the transistor 152 each include an oxide semiconductor layer. A potential of the data line D and a potential of the data line DB have opposite polarities.

In other words, the programmable switch in FIG. 5A is different from the programmable switch in FIG. 3A in that the transmission gate 154 is provided instead of the transistor 112 included in the switch portion and that the data line DB and the transistor 152 are provided.

As described above, when a transmission gate is used in a switch portion of a programmable switch, switching can be performed even without application of a potential higher (or lower) than the highest (or lowest) potential applied to a source electrode or a drain electrode of a transistor by the threshold voltage of the transistor to a gate electrode, as in the programmable switch including the transmission gate in FIG. 4A. Thus, a reduction in power consumption of the programmable switch can be achieved.

Figure 5B:
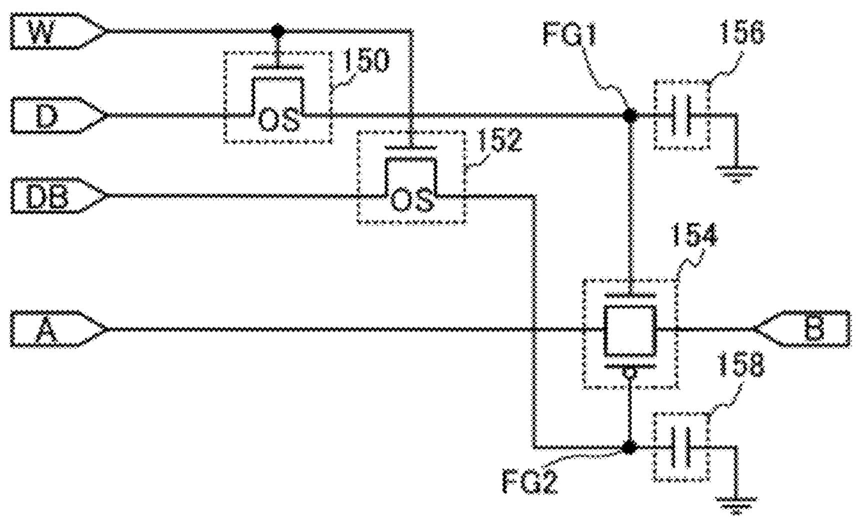

A programmable switch in FIG. 5B is different from the programmable switch in FIG. 5A in that a capacitor 156 and a capacitor 158 are included. One terminal of the capacitor 156 is electrically connected to the node FG1 and the other terminal of the capacitor 156 is electrically connected to a fixed potential. One terminal of the capacitor 158 is electrically connected to the node FG2 and the other terminal of the capacitor 158 is electrically connected to a fixed potential. The other terminal of each of the capacitors 156 and 158 is grounded in this embodiment. Note that the other structure is similar to that of the programmable switch in FIG. 5A.

The capacitor 156 and the capacitor 158 are provided in this way, so that charge supplied to the node FG1 and the node FG2 in input of a potential corresponding to the configuration data to the node FG1 from the data line D and a potential corresponding to the configuration data to the node FG2 from the data line DB can be easily held; accordingly, the configuration-data-holding characteristics of the programmable switch can be easily improved. In the case where the parasitic capacitance of each of the node FG1 and the node FG2 is sufficiently large, an effect similar to the effect obtained in the case where capacitor 156 and the capacitor 158 are provided can be obtained even without capacitors.

Figure 5C:
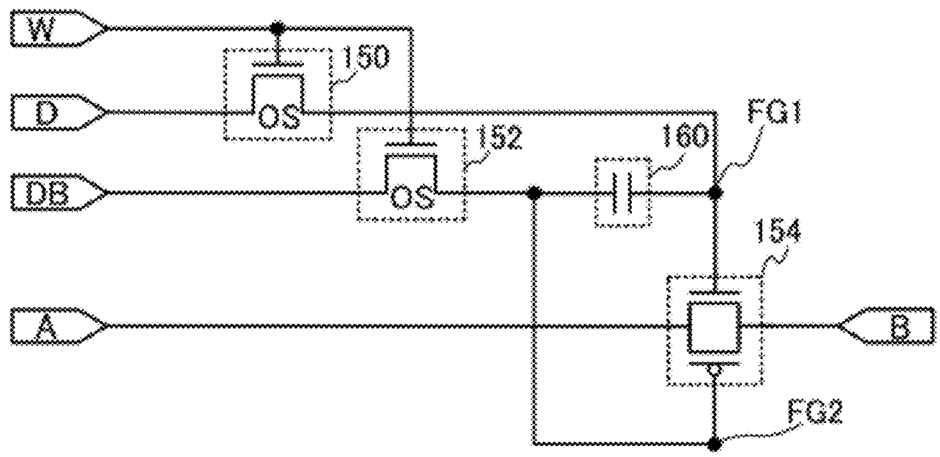

Alternatively, as in a programmable switch in FIG. 5C, a capacitor 160 one terminal of which is electrically connected to the node FG1 and the other terminal of which is electrically connected to the node FG2 may be provided. Note that the other structure is similar to that of the programmable switch in FIG. 5A.

Note that any of the programmable switches in FIGS. 4A to 4C and FIGS. 5A to 5C can be used in combination with a structure similar to any of the structures of the programmable switch in FIGS. 3B to 3D.

As described above, a transistor in a memory portion of a programmable switch for controlling connection of wirings between logic blocks includes a wide bandgap semiconductor such as an oxide semiconductor, which allows a sufficient reduction in off-state current of the transistor, whereby configuration data can be held even when a power supply potential is not supplied. Thus, writing of configuration data after the power is supplied can be omitted, so that start-up time of a programmable logic device can be short. Accordingly, a reduction in power consumption of a programmable logic device can be achieved by the normally-off driving method.

The structures, the methods, and the like in this embodiment can be combined with each other, or can also be combined with any of structures, methods, and the like in the other embodiments as appropriate.

Embodiment 2

In this embodiment, a method for manufacturing the programmable switch of the programmable logic device in Embodiment 1 will be described with reference to FIGS. 6A to 6D, FIGS. 7A and 7B, FIGS. 8A to 8C, and FIGS. 9A and 9B. A method for manufacturing the programmable switch including the transistor 110 and the transistor 112, which is illustrated in FIG. 3A, will be described as an example. Note that in FIGS. 6A to 6D, FIGS. 7A and 7B, FIGS. 8A to 8C, and FIGS. 9A and 9B, a cross-sectional view taken along line A-B corresponds to a cross-sectional view of a region where the transistor 110 including an oxide semiconductor film and the n-channel transistor 112 are formed, and a cross-sectional view taken along line C-D corresponds to a cross-sectional view of the node FG at which the one of the source electrode and the drain electrode of the transistor 110 including an oxide semiconductor film is connected to the gate electrode of the n-channel transistor 112.

Figure 6A:
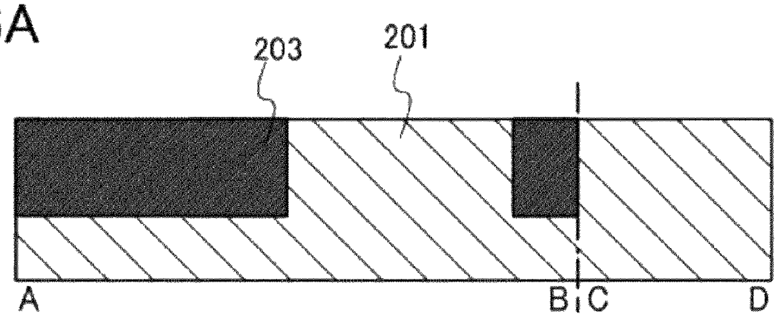
FIGS. 6A to 6D illustrate steps of manufacturing a programmable logic device.

First, as illustrated in FIG. 6A, an element isolation region 203 is formed in a p-type semiconductor substrate 201.

As the p-type semiconductor substrate 201, a single crystal silicon substrate (a silicon wafer) having p-type conductivity, or a compound semiconductor substrate (e.g., a SiC substrate, a sapphire substrate, or a GaN substrate) can be used.

Instead of the p-type semiconductor substrate 201, the following substrate may be used as a silicon on insulator (SOI) substrate: a so-called separation by implanted oxygen (SIMOX) substrate which is formed in such a manner that after an oxygen ion is implanted into a mirror-polished wafer, an oxide layer is formed at a certain depth from the surface and defects generated in a surface layer are eliminated by high temperature heating; or an SOI substrate formed by a technique called a Smart-Cut method in which a semiconductor substrate is cleaved by utilizing the thermally induced growth of a minute void formed by implantation of a hydrogen ion, an epitaxial layer transfer (ELTRAN: a registered trademark of Canon Inc.) method, or the like.

The element isolation region 203 is formed by a local oxidation of silicon (LOCOS) method, a shallow trench isolation (STI) method, or the like.

In the case where a p-channel transistor is formed over the same substrate, for example, in the case where the transmission gate or the inverter in FIG. 4A is formed over the same substrate, an n-well region may be formed in part of the p-type semiconductor substrate 201. The n-well region is formed by addition of an impurity element imparting n-type conductivity, such as phosphorus or arsenic.

Here, the p-type semiconductor substrate is used, but an n-type semiconductor substrate may be used and a p-channel transistor may be formed. In that case, an n-channel transistor may be formed over the same substrate in such a manner that an impurity element imparting p-type conductivity, such as boron, is added to an n-type semiconductor substrate and thus a p-well region is formed.

Figure 6B:
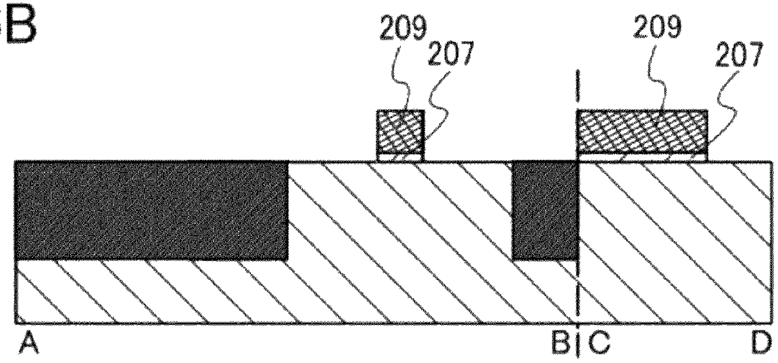

Next, as illustrated in FIG. 6B, a gate insulating film 207 and a gate electrode 209 are formed over the semiconductor substrate 201.

A surface of the semiconductor substrate 201 is oxidized by heat treatment, so that a silicon oxide film is formed. Alternatively, a silicon oxide film is formed by a thermal oxidation method, and then a surface of the silicon oxide film is nitrided by a nitridation treatment; thus a stacked structure including the silicon oxide film and the silicon film containing oxygen and nitrogen (silicon oxynitride film) is formed. Next, part of the silicon oxide film or the silicon oxynitride film is selectively etched, so that the gate insulating film 207 is formed. Alternatively, the gate insulating film 207 is formed in such a manner that silicon oxide, silicon oxynitride, metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like is formed to have a thickness of 5 nm to 50 nm by a CVD method, a sputtering method, or the like, and then part thereof is selectively etched.

It is preferable that the gate electrode 209 be formed using a metal selected from tantalum, tungsten, titanium, molybdenum, chromium, niobium, and the like, or an alloy material or a compound material including any of the metals as its main component. Further, polycrystalline silicon to which an impurity such as phosphorus is added can be used. Alternatively, the gate electrode 209 may have a stacked structure including a metal nitride film and a film of any of the above metals. As the metal nitride, tungsten nitride, molybdenum nitride, or titanium nitride can be used. When the metal nitride film is provided, adhesiveness of the metal film can be increased; accordingly, separation can be prevented.

The gate electrode 209 is formed in such a manner that a conductive film is formed by a sputtering method, a CVD method, or the like and then part of the conductive film is selectively etched.

Here, the surface of the semiconductor substrate 201 is oxidized by heat treatment, so that a silicon oxide film is formed; a conductive film including a stack of a tantalum nitride film and a tungsten film is formed over the silicon oxide film by a sputtering method; and then part of the silicon oxide film and part of the conductive film are selectively etched. Thus, the gate insulating film 207 and the gate electrode 209 are formed.

Note that for high integration, a structure in which sidewall insulating layers are not provided on side surfaces of the gate electrode 209 is preferable. On the other hand, when the characteristics of the transistor have priority, sidewall insulating layers may be provided on the side surfaces of the gate electrode 209.

Figure 6C:
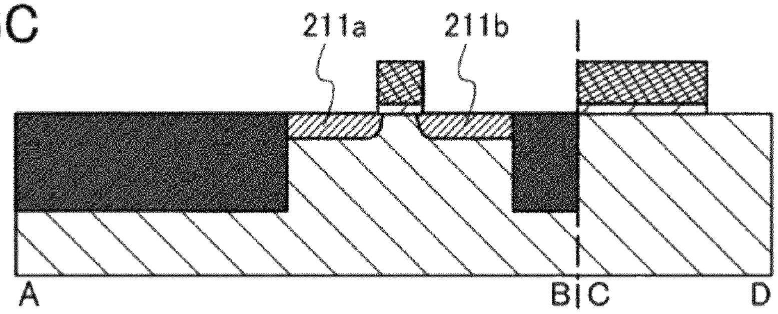

Next, as illustrated in FIG. 6C, an impurity element imparting n-type conductivity is added to the semiconductor substrate 201, so that an n-type impurity region 211*a* and an n-type impurity region 211*b* are formed. In the case where an n-well region is formed in the same substrate, p-type impurity regions are formed by addition of an impurity element imparting p-type conductivity to the n-well region. The concentration of the impurity element imparting n-type conductivity in the n-type impurity regions 211*a* and 211*b* is higher than or equal to $1\times10^{19}/cm^3$ and lower than or equal to $1\times10^{21}/cm^3$, and the concentration of the impurity element imparting p-type conductivity in the p-type impurity regions is higher than or equal to $1\times10^{19}/cm^3$ and lower than or equal to $1\times10^{21}/cm^3$. The impurity element imparting n-type conductivity and the impurity element imparting p-type conductivity are added to the semiconductor substrate 201 and the n-well region, respectively, by an ion doping method, an ion implantation method, or the like as appropriate.

In the case where sidewall insulating layers are formed on the side surfaces of the gate electrode 209, an impurity region having an impurity concentration different from that in the n-type impurity regions 211*a* and 211*b* and that in the p-type concentration regions can be formed in regions overlapping with the sidewall insulating layers.

Figure 6D:
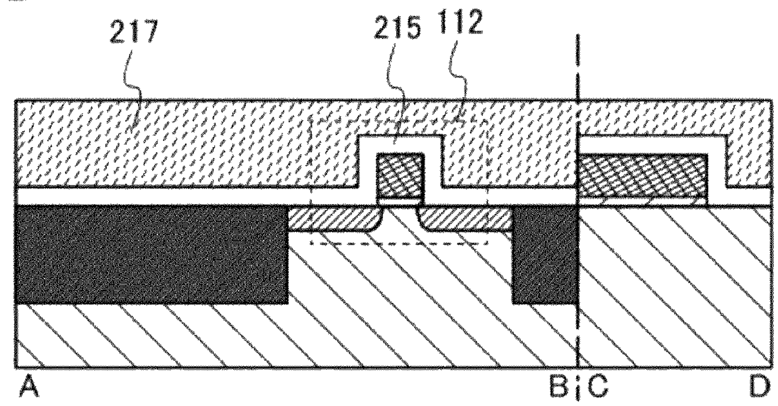

Next, as illustrated in FIG. 6D, an insulating film 215 and an insulating film 217 are formed by a sputtering method, a CVD method, or the like over the semiconductor substrate 201, the element isolation region 203, the gate insulating film 207, and the gate electrode 209.

The insulating films 215 and 217 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, a hydrogen content of the insulating film 215 can be increased. Heat treatment is performed using such an insulating film 215, whereby it is possible to hydrogenate the semiconductor substrate, to terminate a dangling bond by hydrogen, and to reduce defects in the semiconductor substrate.

Note that planarity of the insulating film 217 can be high when the insulating film 217 is formed using an inorganic material such as borophosphosilicate glass (BPSG), or an organic material such as a polyimide or an acrylic resin.

After the formation of the insulating film 215 or the insulating film 217, heat treatment is performed to activate the impurity elements added to the n-type impurity regions 211*a* and 211*b* and the p-type impurity regions.

Through the above steps, as illustrated in FIG. 6D, the n-channel transistor 112 can be manufactured. Here, the transistor 112 is formed using a semiconductor other than an oxide semiconductor, such as single crystal silicon, so that the transistor 112 can operate at high speed. Thus, a programmable switch capable of operating at high speed can be manufactured.

Next, part of each of the insulating films 215 and 217 is selectively etched to form opening portions. Then, contact plugs 219*a* and 219*b* are formed in the opening portions. Typically, the contact plugs 219*a* and 219*b* are formed in such a manner that after a conductive film is formed by a sputtering method, a CVD method, or the like, planarization treatment is performed by a chemical mechanical polishing (CMP) method, etching, or the like, and an unnecessary portion of the conductive film is removed.

The conductive film to be the contact plugs 219*a* and 219*b* is formed in such a manner that tungsten silicide is formed by a CVD method using a $WF_6$ gas and a $SiH_4$ gas to fill the opening portions.

Next, an insulating film is formed by a sputtering method, a CVD method, or the like over the insulating film 217 and the contact plugs 219*a* and 219*b*, and then, part of the insulating film is selectively etched to form an insulating film 221 having a groove portion. Next, after a conductive film is formed by a sputtering method, a CVD method, or the like, planarization treatment is performed by a CMP method, etching, or the like, and an unnecessary portion of the conductive film is removed; thus, wirings 223*a* and 223*b* are formed (see FIG. 7A).

Here, the wiring 223*a* serves as the one of the source electrode and the drain electrode of the transistor 112 and is electrically connected to one of the terminal A and the terminal B in FIG. 3A. The wiring 223*b* serves as the other of the source electrode and the drain electrode of the transistor 112 and is electrically connected to the other of the terminal A and the terminal B in FIG. 3A.

The insulating film 221 can be formed using a material similar to that of the insulating film 215.

The wirings 223*a* and 223*b* are formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

The insulating film 221 and the wirings 223*a* and 223*b* which are planarized are used, whereby variation in electric characteristics of a transistor including an oxide semiconductor film, which is formed later, can be reduced. Further, the transistor including an oxide semiconductor film can be manufactured with a high yield.

Next, heat treatment or plasma treatment is preferably performed so that hydrogen contained in the insulating film 221 and the wirings 223*a* and 223*b* is released. Consequently, in heat treatment performed later, diffusion of hydrogen to an insulating film and an oxide semiconductor film to be formed later can be prevented. The heat treatment is performed at a temperature of higher than or equal to 100° C. and lower than the strain point of the substrate in an inert atmosphere, a reduced-pressure atmosphere, or a dry air atmosphere. Further, for the plasma treatment, a rare gas, oxygen, nitrogen, or nitrogen oxide (e.g., nitrous oxide, nitrogen monoxide, or nitrogen dioxide) is used.

Next, an insulating film 225 is formed by a sputtering method, a CVD method, or the like over the insulating film 221 and the wirings 223*a* and 223*b*. The insulating film 225 is formed with a single layer or a stack including one or more of silicon oxide, silicon oxynitride, silicon nitride oxide, gallium oxide, hafnium oxide, yttrium oxide, aluminum oxide, and aluminum oxynitride. The insulating film 225 is preferably formed using an oxide insulating film from which part of oxygen is released by heating. As the oxide insulating film from which part of oxygen is released by heating, an oxide insulating film containing oxygen at a proportion exceeding the stoichiometric proportion is used. Oxygen is released by heating from the oxide insulating film; therefore, oxygen can be diffused into the oxide semiconductor film by heating performed in a later step.

The insulating film 225 is preferably planarized by CMP treatment or the like. The surface of the insulating film 225 has an average surface roughness ($R_a$) of 1 nm or less, preferably 0.3 nm or less, further preferably 0.1 nm or less.

Note that in this specification and the like, the average surface roughness ($R_a$) is obtained by three-dimension expansion of center line average surface roughness ($R_a$) which is defined by JIS B 0601:2001 (ISO 4287:1997) so that $R_a$ can be applied to a measurement surface, and is an average value of the absolute values of deviations from a reference surface to a specific surface.

When the measurement surface is expressed as Z=F(X,Y), the average surface roughness ($R_a$) is an average value of the absolute values of deviations from the reference surface to the specific surface and is shown by the following Formula 1.

[Formula 1]

$$R_a = \frac{1}{S_0}\int_{Y_1}^{Y_2}\int_{X_1}^{X_2}|F(X, Y) - Z_0|\,dX\,dY \tag{1}$$

Here, the specific surface is a surface which is a target of roughness measurement, and is a rectangular region which is surrounded by four points represented by the coordinates $(X_1,Y_1)$, $(X_1,Y_2)$, $(X_2,Y_1)$, and $(X_2,Y_2)$. $S_0$ represents the area of the specific surface when the specific surface is flat ideally. In addition, the reference surface refers to a surface parallel to an X-Y surface at the average height of the specific surface. In short, when the average value of the height of the specific surface is denoted by $Z_0$, the height of the reference surface is also denoted by $Z_0$. The average surface roughness ($R_a$) can be measured using an atomic force microscope (AFM).

The CMP treatment may be performed once or plural times. When the CMP treatment is performed plural times, first polishing is preferably performed with a high polishing rate followed by final polishing with a low polishing rate. By performing polishing steps with different polishing rates in combination, the planarity of the surface of the insulating film 225 can be further increased.

Alternatively, plasma treatment can be used as the planarization treatment of the insulating film 225. The plasma treatment is performed in such a manner that an inert gas, for example, a rare gas such as an argon gas is introduced into a vacuum chamber and an electric field is applied so that a surface to be processed serves as a cathode. The plasma treatment has a principle similar to that of a plasma dry etching method and an inert gas is used in the plasma treatment. In other words, the plasma treatment is treatment in which the surface to be processed is irradiated with ions of an inert gas and minute unevenness of the surface is reduced by a sputtering effect. Therefore, the plasma treatment can also be referred to as "reverse sputtering treatment".

In the plasma treatment, electrons and argon cations are present in plasma and the argon cations are accelerated in a cathode direction. The surface to be processed is sputtered by the accelerated argon cations. At this time, a projecting portion of the surface to be processed is preferentially sputtered. Particles generated by sputtering from the surface to be processed attach to another place of the surface to be processed. At this time, the particles are preferentially attached to a depressed portion of the surface to be processed. In this manner, by reducing the projecting portion and filling the depressed portion, the planarity of the surface to be processed can be improved. Note that a combination of plasma treatment and CMP treatment can further planarize the insulating film 225.

Note that through the plasma treatment, it is possible to remove impurities such as hydrogen, moisture, and an organic substance attached onto the surface of the insulating film 225 by a sputtering effect.

It is preferable that impurities such as hydrogen, water, a compound having a hydroxyl group, and a hydride in a deposition chamber be removed by heating and evacuation of the deposition chamber before formation of the oxide semiconductor. It is particularly important to remove such impurities adsorbed on an inner wall of the deposition chamber. Here, the heat treatment may be performed at a temperature of higher than or equal to 100° C. and lower than or equal to 450° C., for example. Evacuation of the deposition chamber is preferably performed with a rough vacuum pump such as a dry pump, and a high vacuum pump such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination of the turbo molecular pump and a cryopump having a high capability in evacuating water or a sputter ion pump having a high capability in evacuating hydrogen is effective. At this time, when the impurities are removed while an inert gas is introduced, the rate of desorption of water or the like, which is difficult to desorb only by evacuation, can be further increased. Removal of impurities in the deposition chamber by such treatment before the film formation of the oxide semiconductor can prevent hydrogen, water, a compound having a hydroxyl group, a hydride, and the like from entering the oxide semiconductor.

Before the oxide semiconductor film is formed by a sputtering apparatus, a dummy substrate may be put into the sputtering apparatus, and an oxide semiconductor film may be formed over the dummy substrate, so that hydrogen and moisture attached to the target surface or a deposition shield may be removed.

Figure 7A:
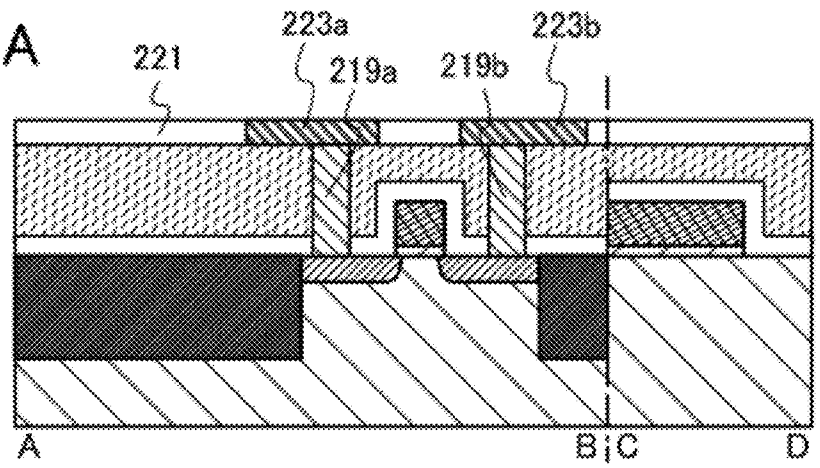
FIGS. 7A and 7B illustrate steps of manufacturing a programmable logic device.
Figure 7B:
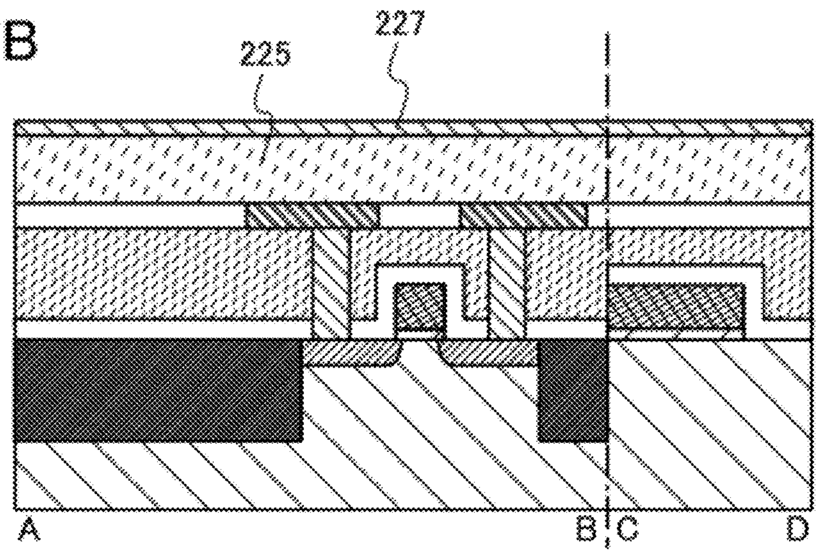

Next, an oxide semiconductor film 227 is formed over the insulating film 225 by a sputtering method, a coating method, a printing method, an evaporation method, a PCVD method, a PLD method, an ALD method, an MBE method, or the like (see FIG. 7B). Here, as the oxide semiconductor film 227, an oxide semiconductor film having a thickness of greater than or equal to 1 nm and less than or equal to 50 nm, preferably greater than or equal to 3 nm and less than or equal to 20 nm is formed by a sputtering method. When the oxide semiconductor film 227 has a thickness in the above range, a short-channel effect which might be caused due to miniaturization of the transistor can be suppressed.

An oxide semiconductor used for the oxide semiconductor film 227 preferably contains at least indium (In) or zinc (Zn). In particular, In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. Further, silicon oxide may be included in the above oxide semiconductor. Here, for example, an In—Ga—Zn-based oxide means an oxide containing indium (In), gallium (Ga), and zinc (Zn) as its main components and there is no particular limitation on the ratio of In:Ga:Zn. The In—Ga—Zn-based oxide may contain a metal element other than In, Ga, and Zn. In this case, the amount of oxygen in the oxide semiconductor preferably exceeds the stoichiometric proportion. When the amount of oxygen exceeds the stoichiometric proportion, generation of carriers which results from oxygen vacancies in the oxide semiconductor film can be suppressed.

Alternatively, a material represented by $InMO_3(ZnO)_m$ (m>0, and m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, and n is an integer) may be used.

Note that the concentration of an alkali metal or an alkaline earth metal in the oxide semiconductor film 227 is preferably lower than or equal to $1\times10^{18}$ atoms/cm$^3$, more preferably lower than or equal to $2\times10^{16}$ atoms/cm$^3$. When an alkali metal or an alkaline earth metal is bonded to an oxide semiconductor, carriers are generated in some cases, which cause an increase in the off-state current of the transistor.

The oxide semiconductor film 227 may contain nitrogen at a concentration of lower than or equal to $5\times10^{18}$ atoms/cm$^3$.

As an oxide semiconductor which can be used for the oxide semiconductor film 227, a wide bandgap semiconductor which has a wider bandgap and lower intrinsic carrier density than a silicon semiconductor is used. The off-state current of a transistor can be reduced with the use of an oxide semiconductor having a wide energy gap.

The oxide semiconductor film 227 may have a single crystal structure or a non-single-crystal structure. In the latter case, the oxide semiconductor film 227 may have either an amorphous structure or a polycrystal structure. Further, the oxide semiconductor film 227 may have an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when surface flatness is improved, mobility higher than that of an oxide semiconductor in an amorphous state can be obtained. In order to improve the surface flatness, the oxide semiconductor is preferably formed over a flat surface. As described above, the average surface roughness ($R_a$) of the surface of the insulating film 225 is 1 nm or less, preferably 0.3 nm or less, further preferably 0.1 nm or less, and the oxide semiconductor film 227 is preferably formed thereover.

Here, the oxide semiconductor film 227 is formed by a sputtering method.

For example, as a target used in the sputtering method, the following can be given: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also represented as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

In the case where an In—Ga—Zn—O-based material is used as an oxide semiconductor, a target to be used may have a composition ratio of In:Ga:Zn=1:1:1, 4:2:3, 3:1:2, 1:1:2, 2:1:3, 3:1:4, or the like in an atomic ratio, for example. A target of an In—Ga—Zn-based oxide having any of the above atomic ratios or an oxide whose composition is close to the above compositions can be used. When the target has any of the above composition ratios, a polycrystal or a CAAC-OS described later is more likely to be formed.

In the case where an In—Sn—Zn—O-based material is used as an oxide semiconductor, a target to be used may have a composition ratio of In:Sn:Zn=1:1:1, 2:1:3, 1:2:2, 20:45:35, or the like in an atomic ratio, for example. A target of an In—Sn—Zn-based oxide having any of the above atomic ratios or an oxide whose composition is close to the above compositions can be used. When the target has any of the above composition ratios, a polycrystal or a CAAC-OS described later is likely to be formed.

In the case where an In—Zn—O-based material is used as the oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of $Z \geq 1.5X+Y$ is satisfied. A target of an In—Zn—O-based oxide having any of the above atomic ratios or an oxide whose composition is close to the above compositions can be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is close to the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. Further, in order to prevent hydrogen, water, a compound having a hydroxyl group, a hydride, and the like from entering the oxide semiconductor film, as a sputtering gas, it is preferable to use an atmosphere of a high-purity gas from which impurities such as hydrogen, water, a compound having a hydroxyl group, and a hydride are sufficiently removed.

In a sputtering method, an RF power supply device, an AC power supply device, a DC power supply device, or the like can be used as a power supply device for generating plasma as appropriate.

The leakage rate of a treatment chamber in which the oxide semiconductor film is formed is preferably lower than or equal to $1\times10^{-10}$ Pa·m$^3$/sec., whereby entry of an impurity into the film to be formed by a sputtering method can be decreased. As described above, in the process for forming the oxide semiconductor film and preferably in the process for forming the oxide insulating film, entry of impurities is suppressed as much as possible through control of the pressure of the treatment chamber, leakage rate of the treatment chamber, and the like, whereby entry of impurities including hydrogen into the oxide semiconductor film can be reduced. In addition, diffusion of impurities such as hydrogen from the oxide insulating film to the oxide semiconductor film can be reduced.

As the oxide semiconductor film 227, a c-axis aligned crystalline oxide semiconductor (CAAC-OS) film including crystallized parts may be used.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface over which the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface over which the CAAC-OS film is formed or a normal vector of a top surface of the formed CAAC-OS film, the directions of the c-axes may be different from each other in the film depending on the shape of the CAAC-OS film (the cross-sectional shape of the surface over which the CAAC-OS film is formed or the cross-sectional shape of the surface of the CAAC-OS film). The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of 1 nm or less, preferably 0.3 nm or less, further preferably 0.1 nm or less.

An example of a crystal structure of the CAAC-OS will be described in detail with reference to FIGS. 12A to 12E, FIGS. 13A to 13C, FIGS. 14A to 14C, and FIGS. 15A and 15B. In FIGS. 12A to 12E, FIGS. 13A to 13C, FIGS. 14A to 14C, and FIGS. 15A and 15B, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 12A to 12E, O surrounded by a circle represents tetracoordinate O and O surrounded by a double circle represents tricoordinate O.

Figure 12A:
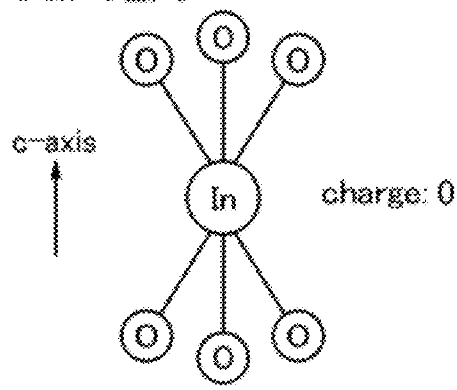
FIGS. 12A to 12E each illustrate a structure of an oxide.

FIG. 12A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 12A is actually an octahedral structure, but is illustrated as a planar structure for simplicity. Note that three tetracoordinate O atoms exist in each of an upper half and a lower half in FIG. 12A. In the small group illustrated in FIG. 12A, electric charge is 0.

Figure 12D:
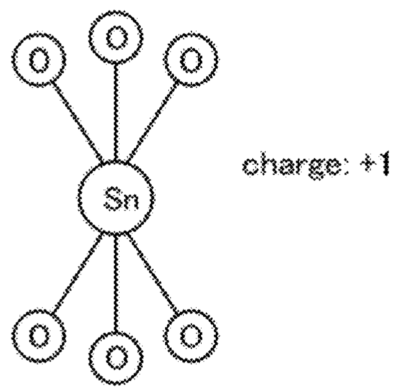
Figure 12B:
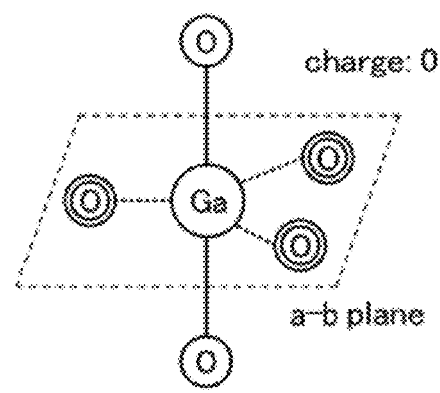

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 12B. An In atom can also have the structure illustrated in FIG. 12B because an In atom can have five ligands. In the small group illustrated in FIG. 12B, electric charge is 0.

Figure 12E:
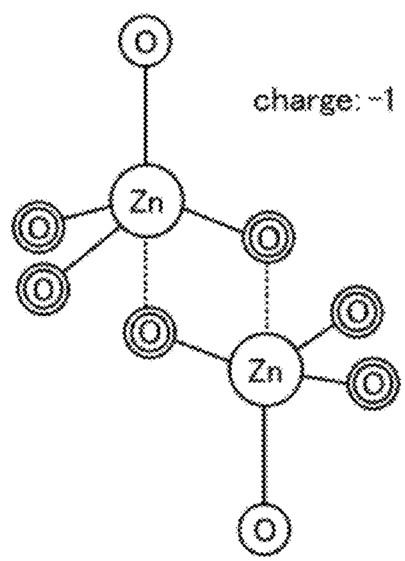
Figure 12C:
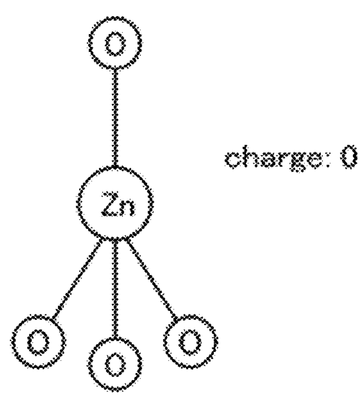

FIG. 12C illustrates a structure including one tetracoordinate Zn atom and four tetracoordinate O atoms proximate to the Zn atom. In FIG. 12C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 12C. In the small group illustrated in FIG. 12C, electric charge is 0.

FIG. 12D illustrates a structure including one hexacoordinate Sn atom and six tetracoordinate O atoms proximate to the Sn atom. In FIG. 12D, three tetracoordinate O atoms exist in each of an upper half and a lower half. In the small group illustrated in FIG. 12D, electric charge is +1.

FIG. 12E illustrates a small group including two Zn atoms. In FIG. 12E, one tetracoordinate O atom exists in each of an upper half and a lower half. In the small group illustrated in FIG. 12E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 12A each have three proximate In atoms in the downward direction, and the three O atoms in the lower half each have three proximate In atoms in the upward direction. The one O atom in the upper half with respect to the pentacoordinate Ga atom in FIG. 12B has one proximate Ga atom in the downward direction, and the one O atom in the lower half has one proximate Ga atom in the upward direction. The one O atom in the upper half with respect to the tetracoordinate Zn atom in FIG. 12C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 13A illustrates a model of a medium group included in a layered structure of an In—Sn—Zn—O-based material. FIG. 13B illustrates a large group including three medium groups. Note that FIG. 13C illustrates an atomic arrangement in the case where the layered structure in FIG. 13B is observed from the c-axis direction.

In FIG. 13A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. In FIG. 13A, one tetracoordinate O atom existing in each of an upper half and a lower half with respect to an In atom is denoted by circled 1. FIG. 13A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 13A, in the order starting from the top, a Sn atom proximate to three tetracoordinate O atoms in each of an upper half and a lower half is bonded to an In atom proximate to one tetracoordinate O atom in each of an upper half and a lower half through one tetracoordinate O atom, the In atom is bonded to a Zn atom proximate to three tetracoordinate O atoms in an upper half through one tetracoordinate O atom, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels electric charge +1, is needed to form a layered structure including a Sn atom. As a structure having electric charge of −1, the small group including two Zn atoms as illustrated in FIG. 12E can be given. For example, with one small group including two Zn atoms, electric charge of one small group including a Sn atom can be cancelled, so that the total electric charge of the layered structure can be 0.

When the large group illustrated in FIG. 13B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

As an example, FIG. 14A illustrates a model of a medium group included in a layered structure of an In—Ga—Zn—O-based material.

In the medium group included in the layered structure of the In—Ga—Zn—O-based material in FIG. 14A, in the order starting from the top, an In atom proximate to three tetracoordinate O atoms in each of an upper half and a lower half is bonded to a Zn atom proximate to one tetracoordinate O atom in an upper half through one tetracoordinate O atom, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 14B illustrates a large group including three medium groups. Note that FIG. 14C illustrates an atomic arrangement in the case where the layered structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

With respect to the layered structure of the In—Ga—Zn—O-based material, a large group can be formed using not only the medium group illustrated in FIG. 14A but also a medium group in which the arrangement of the In atom, the Ga atom, and the Zn atom is different from that in FIG. 14A.

When the large group illustrated in FIG. 14B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 15A:
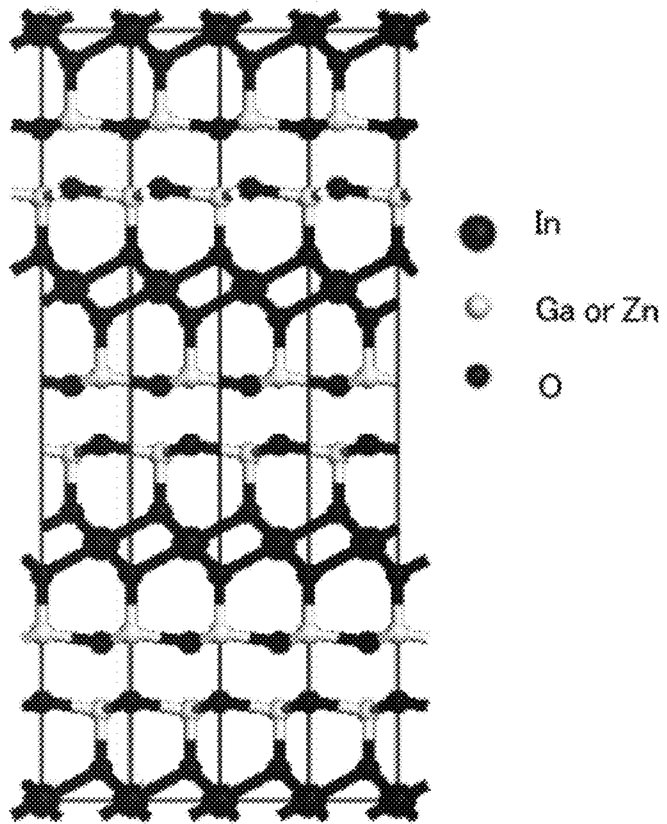
FIGS. 15A and 15B each illustrate a structure of an oxide.

In the case where n=1 ($InGaZnO_4$), a crystal structure illustrated in FIG. 15A can be obtained, for example. Note that in the crystal structure in FIG. 15A, since a Ga atom and an In atom each have five ligands as illustrated in FIG. 12B, the crystal structure can include a structure in which Ga is replaced with In.

Figure 15B:
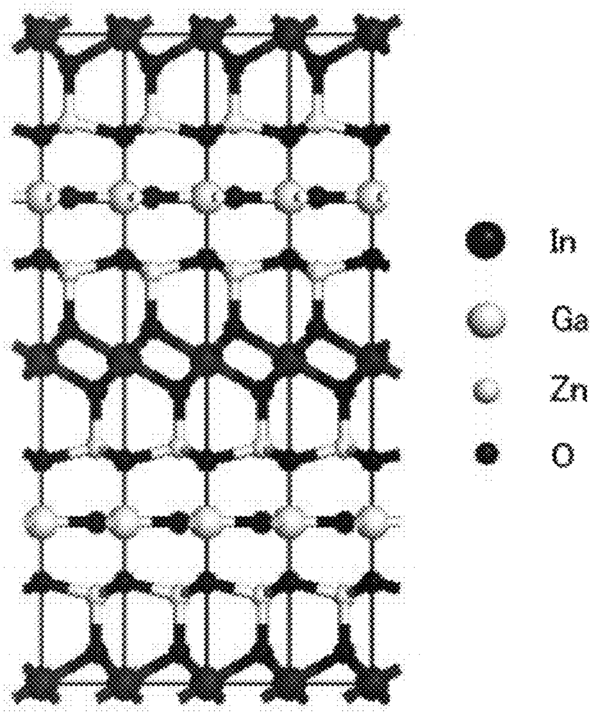

In the case where n=2 ($InGaZn_2O_5$), a crystal structure illustrated in FIG. 15B can be obtained, for example. Note that in the crystal structure in FIG. 15B, since a Ga atom and an In atom each have five ligands as illustrated in FIG. 12B, the crystal structure can includes a structure in which Ga is replaced with In can be obtained.

The substrate is heated to a temperature higher than 200° C. and lower than or equal to 700° C., preferably higher than 300° C. and lower than or equal to 500° C., more preferably higher than or equal to 400° C. and lower than or equal to 450° C. during the formation of the oxide semiconductor film 227 so that the oxide semiconductor film 227 includes the CAAC-OS. The oxide semiconductor film 227 is formed while the substrate is heated in this manner, whereby the oxide semiconductor film 227 can include the CAAC-OS.

Alternatively, a thin film of a first oxide semiconductor film having a thickness of greater than or equal to a thickness of one atomic layer and less than or equal to 10 nm, preferably greater than or equal to 2 nm and less than or equal to 5 nm is formed while the heating is performed at temperature in the above range, and then a second oxide semiconductor film which is thicker than the first oxide semiconductor film is formed while heating is performed in a similar manner; thus, the first oxide semiconductor film and the second oxide semiconductor film may be stacked to form the oxide semiconductor film 227 including the CAAC-OS.

In an attempt to form the oxide semiconductor film 227 having an amorphous structure, the oxide semiconductor film 227 is formed at a substrate temperature lower than 200° C., preferably lower than 180° C. The oxide semiconductor film 227 is formed in this manner, whereby the oxide semiconductor film 227 can have an amorphous structure.

Alternatively, the oxide semiconductor film 227 including the CAAC-OS may be formed in the following manner: after an oxide semiconductor film having an amorphous structure is formed in the above manner, heat treatment at a temperature of higher than or equal to 250° C. and lower than or equal to 700° C., preferably higher than or equal to 400° C., more preferably higher than or equal to 500° C., still more preferably higher than or equal to 550° C. is performed, so that at least part of the oxide semiconductor film having an amorphous structure is crystallized. Note that the heat treatment can be performed in an inert gas atmosphere. The inert gas atmosphere is preferably an atmosphere which contains nitrogen or a rare gas (e.g., helium, neon, or argon) as its main component and does not contain water, hydrogen, or the like.

For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is lower than or equal to 1 ppm, preferably lower than or equal to 0.1 ppm). Heat treatment for hydration or hydrogenation, which is described later, can serve as this heat treatment.

In the above method, as the substrate heating temperature at the time of film formation is higher, the impurity concentration of the obtained oxide semiconductor film 227 is lower. Further, the atomic arrangement in the oxide semiconductor film 227 is ordered and the density thereof is increased, so that a polycrystal or a CAAC-OS is likely to be formed. Furthermore, by the film formation in an oxygen gas atmosphere, a polycrystal or a CAAC-OS is more easily formed because an unnecessary atom of a rare gas or the like is not included. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %.

After the oxide semiconductor film 227 is formed, the oxide semiconductor film 227 may be subjected to heat treatment. The heat treatment can further remove a substance including a hydrogen atom in the oxide semiconductor film 227; thus, a structure of the oxide semiconductor film 227 can be improved and defect levels in the energy gap can be reduced. The heat treatment is performed in an inert gas atmosphere at a temperature of higher than or equal to 300° C. and lower than or equal to 700° C., preferably higher than or equal to 450° C. and lower than or equal to 600° C. In the case where the substrate has the strain point, the heat treatment is performed at a temperature lower than the strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is lower than or equal to 1 ppm, preferably lower than or equal to 0.1 ppm).

The heat treatment can be performed in such a way that, for example, the semiconductor substrate 201 is introduced into an electric furnace using a resistance heating element or the like and heated at 450° C. under a nitrogen atmosphere for an hour.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used. Note that in the case where a GRTA apparatus is used as the heat treatment apparatus, the substrate may be heated in an inert gas heated to high temperature of 650° C. to 700° C. because the heat treatment time is short.

In addition, after the oxide semiconductor film 227 is heated by the heat treatment, a high-purity oxygen gas, a high-purity $N_2O$ gas, or ultra dry air (the moisture concentration is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that water, hydrogen, and the like be not contained in these gases in particular. The purity of the oxygen gas or the $N_2O$ gas that is introduced into the same furnace is preferably 6N or higher, further preferably 7N or higher (i.e., the concentration of impurities in the oxygen gas or the $N_2O$ gas is 1 ppm or lower, preferably 0.1 ppm or lower). By the action of the oxygen gas or the $N_2O$ gas, oxygen which is one of main components of the oxide semiconductor and which has been eliminated at the same time as the step for removing impurities by dehydration or dehydrogenation can be supplied.

Note that the heat treatment can be referred to as dehydration treatment, dehydrogenation treatment, or the like because of its advantageous effect of removing hydrogen, water, or the like. The heat treatment can be performed at the timing, for example, before the oxide semiconductor layer is processed to have an island shape, after the gate insulating film is formed, or the like. Such heat treatment for dehydration or dehydrogenation may be performed once or plural times.

Next, part of the oxide semiconductor film 227 is selectively etched to form an oxide semiconductor film 229. Then, an insulating film 231 is formed over the oxide semiconductor film 229 by a sputtering method, a CVD method, or the like. After that, a gate electrode 233 is formed over the insulating film 231 (see FIG. 8A).

The insulating film 231 may be formed with a single layer or a stack using one or more of silicon oxide, silicon oxynitride, silicon nitride oxide, silicon nitride, aluminum oxide, hafnium oxide, gallium oxide, a Ga—Zn—O-based metal oxide, and the like. The insulating film 231 may also be an oxide insulating film from which oxygen is released by heating, such as a film that can be used as the insulating film 225. By using a film from which oxygen is released by heating as the insulating film 231, oxygen vacancies caused in the oxide semiconductor film 229 can be reduced by heat treatment performed later and deterioration of electric characteristics of the transistor can be suppressed.

When the insulating film 231 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be decreased even when the thickness of the gate insulating film is reduced.

The thickness of the insulating film 231 is preferably greater than or equal to 10 nm and less than or equal to 300 nm, more preferably greater than or equal to 5 nm and less than or equal to 50 nm, still more preferably greater than or equal to 10 nm and less than or equal to 30 nm.

The gate electrode 233 can be formed using a metal element selected from aluminum, chromium, copper, tantalum, titanium, molybdenum, and tungsten; an alloy containing any of these metal elements as a component; an alloy containing these metal elements in combination; or the like. Further, one or both metal elements of manganese and zirconium may be used. Further, the gate electrode 233 may have a single-layer structure or a stacked-layer structure of two or more layers.

For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using the above light-transmitting conductive material and the above metal element.

The gate electrode 233 is formed by a printing method or an inkjet method. Alternatively, the gate electrode 233 is formed in such a manner that a conductive film is formed by a sputtering method, a CVD method, an evaporation method, or the like and then part of the conductive film is selectively etched.

A material layer in contact with the insulating film 231, such as an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN), is preferably provided between the gate electrode 233 and the insulating film 231. These films each have a work function of higher than or equal to 5 eV, or higher than or equal to 5.5 eV; thus, the threshold voltage in the electric characteristics of the transistor can be positive. Accordingly, a so-called normally-off switching element can be obtained. For example, in the case of using an In—Ga—Zn—O film containing nitrogen, an In—Ga—Zn—O film having a higher nitrogen concentration than the oxide semiconductor film 229, specifically, an In—Ga—Zn—O film having a nitrogen concentration of higher than or equal to 7 at. % is used.

Note that after the insulating film 231 is formed, heat treatment (second heat treatment) may be performed in an inert gas atmosphere or an oxygen atmosphere. The heat treatment temperature is preferably higher than or equal to 200° C. and lower than or equal to 450° C., more preferably higher than or equal to 250° C. and lower than or equal to 350° C. By performing such heat treatment, variation in electrical characteristics of the transistor can be reduced. In the case where oxygen is contained in the insulating film 231 or the insulating film 225 which is in contact with the oxide semiconductor film 229, oxygen can be supplied to the oxide semiconductor film 229 and the oxygen defects in the oxide semiconductor film 229 can be repaired. As described above, the heat treatment has an effect of supplying oxygen; therefore, the heat treatment can also be referred to as supply of oxygen.

Note that in this embodiment, the heat treatment for supply of oxygen is performed after the insulating film 231 is formed; however, the timing of the heat treatment for supply of oxygen is not limited thereto and the heat treatment may be performed as appropriate as long as the formation of the insulating film 231 is completed.

As described above, the heat treatment for dehydration or dehydrogenation and the heat treatment for supply of oxygen are performed to reduce impurities and compensate the oxygen vacancies in the oxide semiconductor film 229, whereby the oxide semiconductor film 229 can be highly purified so as to contain impurity elements as little as possible.

Figure 8A:
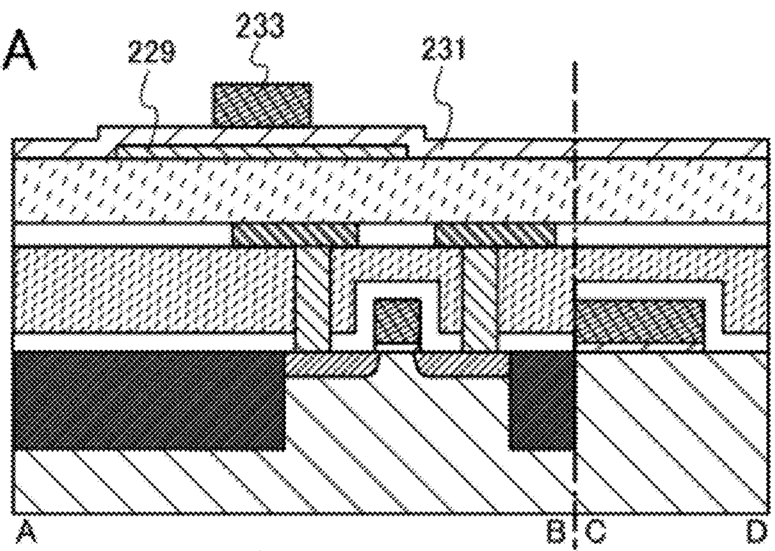
FIGS. 8A to 8C illustrate steps of manufacturing a programmable logic device.
Figure 8B:
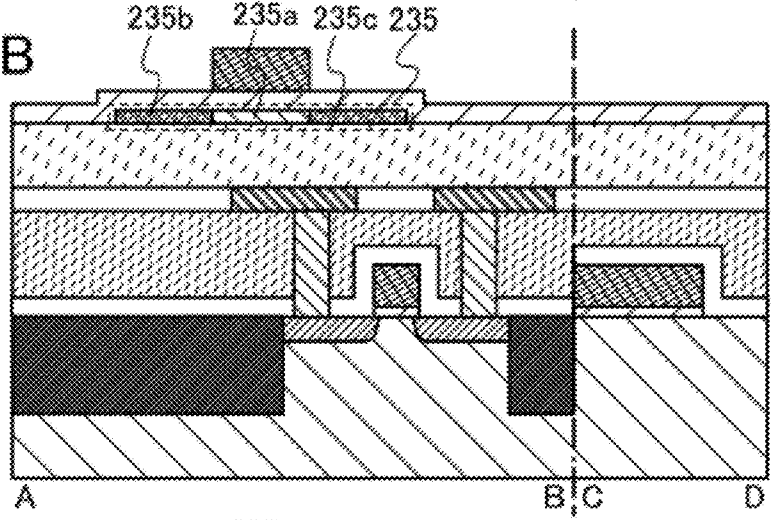

Next, treatment for adding a dopant to the oxide semiconductor film 229 is performed with the use of the gate electrode 233 as a mask. As a result, as illustrated in FIG. 8B, a first region 235*a* which is covered with the gate electrode 233 and to which the dopant is not added and a pair of second regions 235*b* and 235*c* containing the dopant are formed. Since the dopant is added with the use of the gate electrode 233 as a mask, the first region 235*a* to which the dopant is not added and the pair of second regions 235*b* and 235*c* containing the dopant can be formed in a self-aligned manner.

The first region 235*a* which overlaps with the gate electrode 233 serves as a channel region. The pair of second regions 235*b* and 235*c* containing the dopant serves as electric-field relaxation regions. The first region 235*a* and the pair of second regions 235*b* and 235*c* containing the dopant constitute an oxide semiconductor film 235.

The concentration of hydrogen in the first region 235*a* of the oxide semiconductor film 235 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, still more preferably lower than or equal to $1\times10^{16}$ atoms/cm$^3$. By a bond of an oxide semiconductor and hydrogen, part of contained hydrogen serves as a donor to generate electrons as carriers. For that reason, by reduction in the concentration of hydrogen in the first region 235*a* of the oxide semiconductor film 235, a negative shift of the threshold voltage can be suppressed.

The concentration of the dopant in the pair of second regions 235*b* and 235*c* is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the pair of second regions 235*b* and 235*c* contains the dopant, the carrier density or the number of defects can be increased. Therefore, the conductivity can be higher than that of the first region 235*a* which does not contain the dopant. Note that an excessive increase in the concentration of the dopant causes inhibition of carrier movement by the dopant, which leads to a reduction in conductivity of the pair of second regions 235*b* and 235*c* containing the dopant.

The pair of second regions 235*b* and 235*c* containing the dopant preferably has a conductivity of higher than or equal to 0.1 S/cm and lower than or equal to 1000 S/cm, preferably higher than or equal to 10 S/cm and lower than or equal to 1000 S/cm.

The existence of the pair of second regions 235*b* and 235*c* containing the dopant in the oxide semiconductor film 235 can relieve an electric field applied to the end portion of the first region 235*a* serving as a channel region. Thus, a short-channel effect of the transistor can be suppressed.

As a method for adding the dopant to the oxide semiconductor film 229, an ion doping method or an ion implantation method can be used. As the dopant, boron, nitrogen, phosphorus, and arsenic can be given. Alternatively, helium, neon, argon, krypton, and xenon can be added. Further alternatively, hydrogen may be used. Still alternatively, as the dopant, at least one of boron, nitrogen, phosphorus, and arsenic, at least one of helium, neon, argon, krypton, and xenon, and hydrogen in appropriate combination can be added.

The addition of the dopant to the oxide semiconductor film 229 is conducted in a state where the oxide semiconductor film 229 is covered with the insulating film 231 and the like; alternatively, the addition of the dopant may be conducted in a state where the oxide semiconductor film 229 is exposed.

Alternatively, the dopant can be added by a method other than an ion doping method, an ion implantation method, or the like. For example, the dopant can be added in the following manner: plasma is generated in an atmosphere of a gas containing an element to be added and plasma treatment is performed on an object to which the dopant is added. A dry etching apparatus, a CVD apparatus, a high-density CVD apparatus, or the like can be used to generate the plasma.

After that, heat treatment may be performed. The heat treatment is performed typically at a temperature of higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 235*b* and 235*c* containing the dopant can be reduced. In the heat treatment, the pair of second regions 235*b* and 235*c* containing the dopant may be in either a crystalline state or an amorphous state.

Figure 8C:
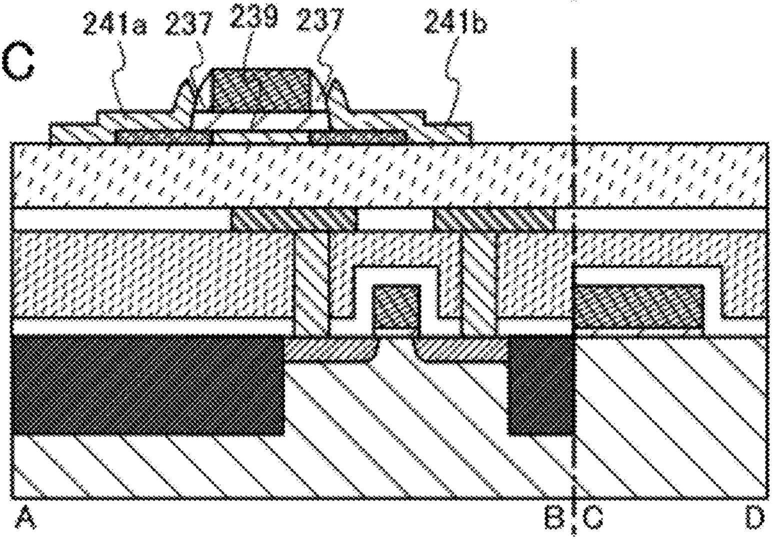

Next, as illustrated in FIG. 8C, sidewall insulating films 237 on side surfaces of the gate electrode 233, a gate insulating film 239, an electrode 241*a*, and an electrode 241*b* are formed.

The sidewall insulating films 237 may each be formed with a single layer or a stack using one or more of silicon oxide, silicon oxynitride, silicon nitride oxide, silicon nitride, aluminum oxide, aluminum oxynitride, aluminum nitride oxide, aluminum nitride, and the like, for example. The sidewall insulating films 237 may be formed using an oxide insulating film from which part of oxygen is released by heating in a manner similar to that of the insulating film 225.

A method for forming the sidewall insulating films 237 is described below.

First, an insulating film to be the sidewall insulating films 237 is formed over the insulating film 231 and the gate electrode 233. The insulating film is formed by a sputtering method, a CVD method, or the like. In addition, although the thickness of the insulating film is not particularly limited, the thickness is selected as appropriate in consideration of the shape of the gate electrode 233.

Then, the sidewall insulating films 237 are formed by etching the insulating film. The etching here is highly anisotropic etching, and the sidewall insulating films 237 can be formed in a self-aligned manner by performing the highly anisotropic etching on the insulating film.

The width of the region for relieving an electric field in each of the pair of second regions 235*b* and 235*c* containing the dopant depends on the width of the sidewall insulating films 237, and the width of the sidewall insulating films 237 depends on the thickness of the gate electrode 233. Therefore, the thickness of the gate electrode 233 may be determined so that the width of the region for relieving an electric field has a desired value.

When the sidewall insulating films 237 are formed, the insulating film 231 is also etched by highly anisotropic etching and the oxide semiconductor film 235 is partly exposed, whereby the gate insulating film 239 is formed.

The pair of electrodes 241*a* and 241*b* can be formed using a material similar to that of the wirings 223*a* and 223*b*, as appropriate. Note that the pair of electrodes 241*a* and 241*b* may function as wirings.

The pair of electrodes 241*a* and 241*b* is formed by a printing method or an inkjet method. Alternatively, the pair of electrodes 241*a* and 241*b* is formed in such a manner that a conductive film is formed by a sputtering method, a CVD method, an evaporation method, or the like and then part of the conductive film is selectively etched.

The pair of electrodes 241*a* and 241*b* is preferably formed to be in contact with side surfaces of the sidewall insulating films 237 and the gate insulating film 239. In other words, it is preferable that end portions of the pair of electrodes 241*a* and 241*b* of the transistor be located over the sidewall insulating films 237 and that the pair of electrodes 241*a* and 241*b* entirely cover exposed portions of the pair of second regions 235*b* and 235*c* in the oxide semiconductor film 235. As a result, regions in the pair of second regions 235*b* and 235*c*, which are in contact with the pair of electrodes 241*a* and 241*b*, serve as a source region and a drain region, whereas regions in the pair of second regions 235*b* and 235*c*, which overlap with both the gate insulating film 239 and one of the sidewall insulating films 237, serve as electric-field relaxation regions. In addition, since the width of the electric-field relaxation regions can be controlled with the length of the sidewall insulating films 237, a high accuracy in alignment of a mask for forming the pair of electrodes 241*a* and 241*b* is not strictly required. Accordingly, variation among plural transistors can be reduced.

Note that the sidewall insulating films 237 are provided in contact with the side surfaces of the gate electrode 233 in this embodiment; however, the present invention is not limited to this structure, and the sidewall insulating films 237 are not necessarily provided. Although the sidewall insulating films 237 are formed after the pair of second regions 235*b* and 235*c* is formed in this embodiment, the present invention is not limited to this structure and the pair of second regions 235*b* and 235*c* may be formed after the sidewall insulating films 237 are formed. With such a structure, the first region 235*a* can be extended to overlap with the sidewall insulating films 237.

Figure 9A:
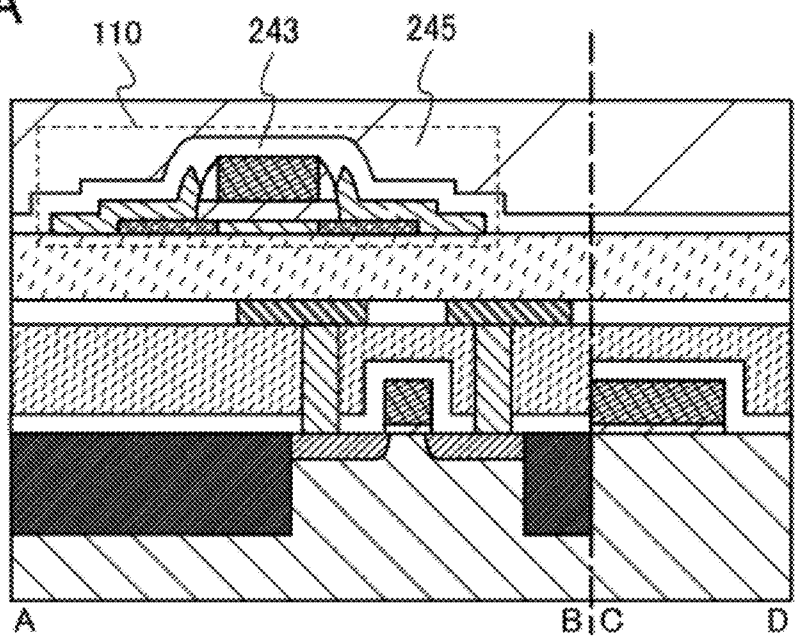
FIGS. 9A and 9B illustrate steps of manufacturing a programmable logic device.

Next, as illustrated in FIG. 9A, an insulating film 243 and an insulating film 245 are formed by a sputtering method, a CVD method, a coating method, a printing method, or the like.

The insulating films 243 and 245 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 245 is formed using an insulating film which prevents diffusion of oxygen to the outside, oxygen released from the insulating film 243 can be supplied to the oxide semiconductor film. Typical examples of the insulating film which prevents diffusion of oxygen to the outside include films of aluminum oxide, aluminum oxynitride, and the like. When an insulating film which prevents diffusion of hydrogen from the outside is used as the insulating film 245, diffusion of hydrogen from the outside to the oxide semiconductor film can be suppressed, and defects in the oxide semiconductor film can be reduced. Typical examples of the insulating film which prevents diffusion of hydrogen from the outside include films of silicon nitride, silicon nitride oxide, aluminum nitride, aluminum nitride oxide, and the like. Further, when the insulating film 243 has a three-layer structure of an oxide insulating film from which part of oxygen is released by heating, an insulating film which prevents diffusion of oxygen to the outside, and an oxide insulating film, oxygen can be efficiently diffused to the oxide semiconductor film and oxygen can be prevented from being released to the outside; accordingly, variation in transistor characteristics can be reduced even at high temperature and in high humidity.

Through the above steps, as illustrated in FIG. 9A, the transistor 110 including an oxide semiconductor film can be manufactured. Note that the transistor 110 includes the oxide semiconductor film 235 including an i-type (intrinsic) or substantially i-type region 235*a*, and therefore exhibits excellent characteristics.

Although the transistor 110 of this embodiment has a top-gate structure, the present invention is not limited to the top-gate structure and a bottom-gate structure may be employed. Further, in the transistor 110 of this embodiment, the pair of electrodes 241*a* and 241*b* is in contact with at least part of upper surfaces of the pair of second regions 235*b* and 235*c*; however, the present invention is not limited to this structure, and the pair of second regions 235*b* and 235*c* may be in contact with at least part of the pair of electrodes 241*a* and 241*b*, for example.

Next, part of each of the insulating film 215, the insulating film 217, the insulating film 221, the insulating film 225, the insulating film 243, and the insulating film 245 is selectively etched, so that opening portions are formed to expose part of each of the gate electrode 209, the electrode 241*a*, and the electrode 241*b*. After a conductive film is formed in the opening portions, part of the conductive film is selectively etched; thus, a wiring 249 in contact with the electrode 241*b* and a wiring 250 in contact with the electrode 241*a* are formed. The wiring 249 and the wiring 250 can be formed using the same material as that of the contact plugs 219*a* and 219*b* as appropriate.

Here, the wiring 249 serves as the node FG which electrically connects the one of the source electrode and the drain electrode of the transistor 110 and the gate electrode 209 of the transistor 112. The wiring 250 serves as the other of the source electrode and the drain electrode of the transistor 110 and is electrically connected to the data line D in FIG. 3A. Further, although not directly illustrated in FIG. 9B, the gate electrode 233 of the transistor 110 is electrically connected to the word line W in FIG. 3A.

Figure 9B:
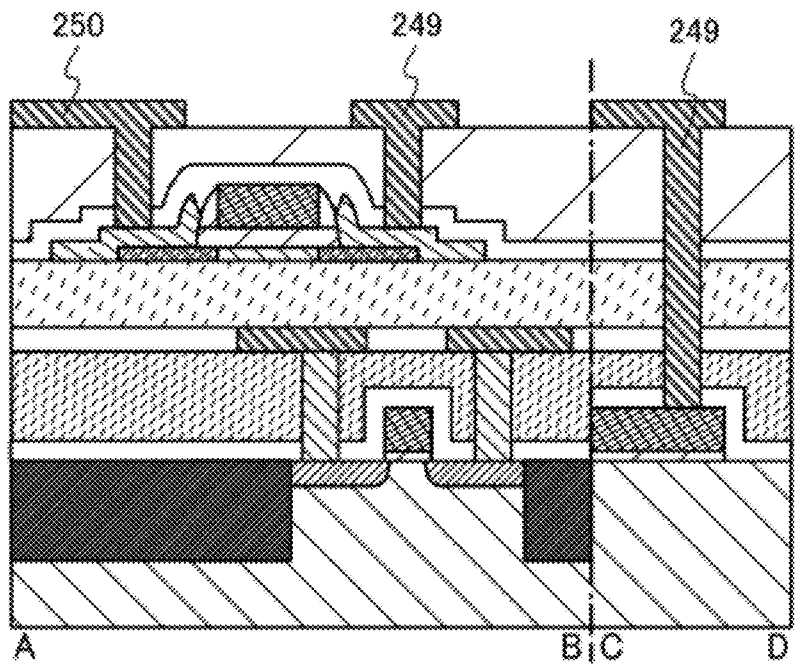

In FIG. 9B, the one of the source electrode and the drain electrode of the transistor 110 (electrode 241*b*) is connected to the gate electrode 209 of the transistor 112 through the wiring 249; however, the structure of the programmable switch of this embodiment is not limited to this structure. For example, an upper surface of the gate electrode of the transistor 112 may be exposed through an opening portion in the insulating films provided over the transistor 112 and the one of the source electrode and the drain electrode of the transistor 110 may be formed to be in direct contact with the upper surface of the gate electrode.

Through the above steps, the programmable switch including the transistor 110 and the transistor 112 can be manufactured.

Figure 27A:
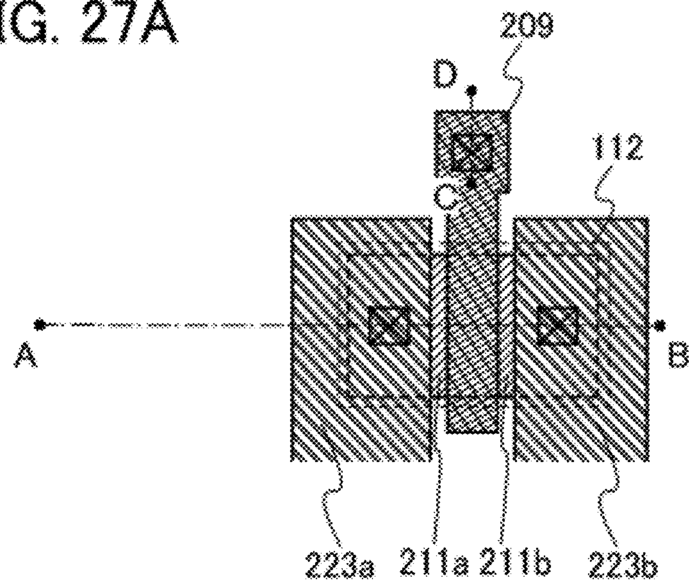
FIGS. 27A and 27B are plan views each illustrating part of a structure of a programmable logic device.
Figure 27B:
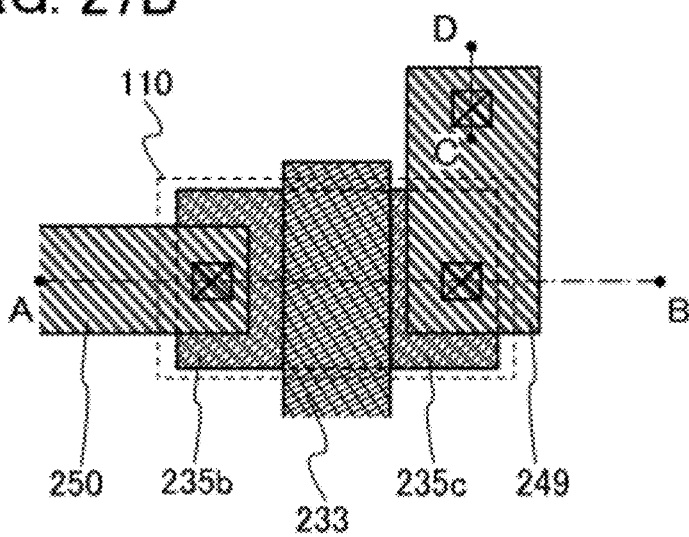

An example of a plan view of the programmable switch in the cross-sectional view of FIG. 9B is illustrated in FIGS. 27A and 27B. FIG. 27A is a plan view of a structure below the insulating film 225, i.e., the transistor 112. FIG. 27B is a plan view of a structure over the insulating film 225, i.e., the transistor 110. Note that some of the components (e.g., the insulating film 215) are not illustrated in FIGS. 27A and 27B for easy understanding. Further, each of the cross-sectional views of FIGS. 6A to 6D, FIGS. 7A and 7B, FIGS. 8A to 8C, and FIGS. 9A and 9B is taken along dashed-dotted line A-B and dashed-dotted line C-D in FIGS. 27A and 27B.

In the programmable switch illustrated in FIGS. 27A and 27B, as illustrated in FIG. 9B, the transistor 110 is electrically connected to the transistor 112 in a region shown in the cross section taken along dashed-dotted line C-D. Here, at least part of the transistor 110 overlaps with at least part of the transistor 112. It is preferable that at least part of the oxide semiconductor film 235 overlap with at least part of the n-type impurity region 211*a* or part of the n-type impurity region 211*b*. With such a planar layout, an increase of the area occupied by the programmable switch due to provision of the transistor including a wide bandgap semiconductor such as an oxide semiconductor can be suppressed. Therefore, high integration of the programmable logic device including the programmable switch can be achieved.

Figure 28:
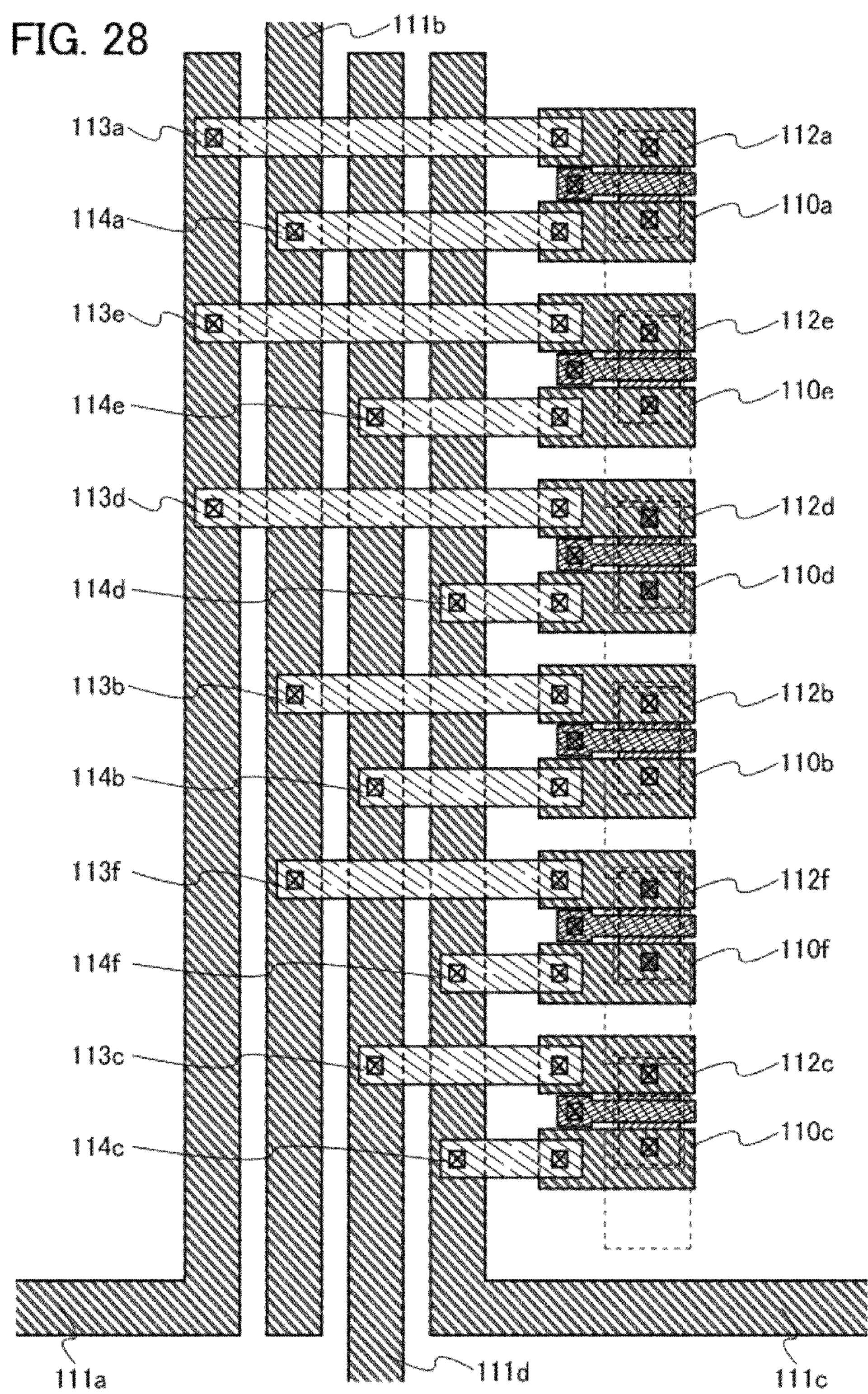
FIG. 28 is a plan view illustrating part of a structure of a programmable logic device.

FIG. 28 is an example of a plan view of the wiring selection circuit 13 in FIG. 2A including the programmable switch in FIGS. 27A and 27B. Note that in FIG. 28, transistors 110*a* to 110*f* corresponding to the transistor 110 in FIG. 27B are indicated by a dashed line for easy understanding. The wiring selection circuit in FIG. 28 includes wirings 111*a* and 111*c* extending in the row direction and wirings 111*b* and 111*d* extending in the column direction. The wiring 111*a* and the wiring 111*b* are electrically connected to each other through an electrode 113*a*, a transistor 112*a* electrically connected to the transistor 110*a*, and an electrode 114*a*. The wiring 111*b* and the wiring 111*d* are electrically connected to each other through an electrode 113*b*, a transistor 112*b* electrically connected to the transistor 110*b*, and an electrode 114*b*. The wiring 111*c* and the wiring 111*d* are electrically connected to each other through an electrode 113*c*, a transistor 112*c* electrically connected to the transistor 110*c*, and an electrode 114*c*. The wiring 111*a* and the wiring 111*c* are electrically connected to each other through an electrode 113*d*, a transistor 112*d* electrically connected to the transistor 110*d*, and an electrode 114*d*. The wiring 111*a* and the wiring 111*d* are electrically connected to an electrode 113*e*, a transistor 112*e* electrically connected to the transistor 110*e*, and an electrode 114*e*. The wiring 111*b* and the wiring 111*c* are electrically connected to each other through an electrode 113*f*, a transistor 112*f* electrically connected to the transistor 110*f*, and an electrode 114*f*.

The wirings 111*a* to 111*d* correspond to the wirings 11*a* to 11*d* in FIG. 2A, respectively. For example, the wirings 111*a* to 111*d* can be formed in the same layer as the wiring 223*a* and the wiring 223*b*. The electrodes 113*a* to 113*f* and the electrodes 114*a* to 114*f* can be formed using a material and a method similar to those of the wirings 223*a* and 223*b*. The transistors 110*a* to 110*f* correspond to the transistor 110 in FIG. 9A and FIG. 27B. The transistors 112*a* to 112*f* correspond to the transistor 112 in FIG. 6D and FIG. 27A. The programmable switches including the respective transistors 110*a* to 110*f* and the respective transistors 112*a* to 112*f* correspond to the programmable switches 30*a* to 30*f* in FIG. 2A.

As illustrated in FIG. 28, at least part of the transistor 110*a* overlaps with at least part of the transistor 112*a* and at least part of the transistor 112*e*. The same applies to the transistors 110*b* to 110*f*. In other words, at least part of a transistor in an upper layer overlaps with at least part of a corresponding transistor in a lower layer and at least part of a transistor adjacent to the transistor in the lower layer. With such a planar layout, an increase of the area occupied by the programmable switch due to provision of the transistor including a wide bandgap semiconductor such as an oxide semiconductor can be suppressed. Therefore, high integration of the programmable logic device including the programmable switch can be achieved.

Figure 29:
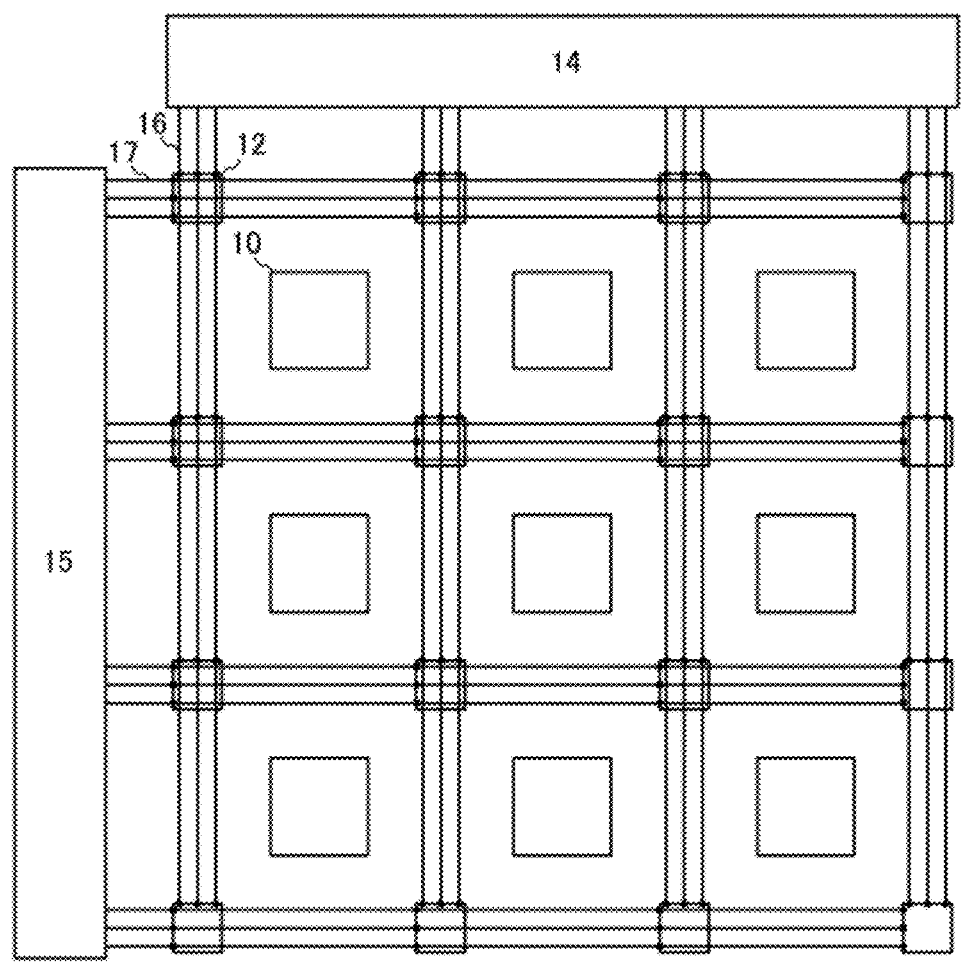
FIG. 29 is a circuit diagram illustrating a programmable logic device according to an embodiment of the present invention.

A transistor in a driver circuit for supplying potentials to the data line D and the word line W can be also manufactured using the semiconductor substrate which is used to prepare the transistor 112. A structure of a programmable logic device provided with such a driver circuit is illustrated in FIG. 29. The programmable logic device in FIG. 29 includes the plurality of logic blocks 10 electrically connected to each other through the plurality of wirings and the switch matrixes 12 each at the intersection of the wirings in the row direction and the wirings in the column direction, as in the programmable logic device in FIG. 1A. Wirings corresponding to the wirings 11 in FIG. 1A are not illustrated in FIG. 29 for easy understanding.

The programmable logic device in FIG. 29 includes a first driver circuit 14 provided in an upper side of the plurality of logic blocks 10 in the drawing, a second driver circuit 15 provided in a left side of the plurality of logic blocks 10 in the drawing, a plurality of first wirings 16 electrically connected to the first driver circuit 14 and extending in the column direction, and a plurality of second wirings 17 electrically connected to the second driver circuit 15 and extending in the row direction. The first wirings 16 and the second wirings 17 are electrically connected to the switch matrixes 12. Note that the structures and arrangement of the first driver circuit 14 and the second driver circuit 15 are not limited to the above-described structures; for example, the first driver circuit 14 and the second driver circuit 15 may be each provided in another position, or three or more driver circuits may be provided.

In this embodiment, the first wirings 16 and the second wirings 17 can be respectively used as the data line D for inputting a potential of the configuration data to be stored in the memory portion and the word line W for inputting a signal for controlling writing of the configuration data to the memory portion, which are illustrated in FIGS. 2B and 2C. The first driver circuit 14 and the second driver circuit 15 can be respectively used as a data line driver circuit for supplying a potential to the data line D and a word line driver circuit for supplying a potential to the word line W. In this embodiment, the first driver circuit 14 serves as a driver circuit for the data line D, the second driver circuit 15 serves as a driver circuit for the word line W, each of the first wirings 16 serves as the data line D, and each of the second wirings 17 serve as the word line W; however, the present invention is not limited to such a structure.

Here, transistors included in the first driver circuit 14 and the second drive circuit 15 can have structures similar to the structure of the transistor 112 in FIG. 6D and FIG. 27A. Therefore, the transistors included in the first driver circuit 14 and the second driver circuit 15 are each formed using a semiconductor other than an oxide semiconductor, such as single crystal silicon, so that high speed operation is possible. Thus, driver circuits capable of high speed operation can be formed. As the first wirings 16 and the second wirings 17, a conductive layer formed in the same layer as the wirings 249 and 250 or a layer formed in a layer upper than the wirings 249 and 250 illustrated in FIG. 9B and FIG. 27B can be used.

As described above, a wide bandgap semiconductor which allows a sufficient reduction in off-state current of a transistor, such as an oxide semiconductor, is used for a transistor in a memory portion of a programmable switch for controlling connection of wirings between logic blocks, whereby a programmable switch which can hold configuration data even when a power supply potential is not supplied can be manufactured. Further, a programmable switch in which start-up time of a logic block after application of the power supply potential is short can be manufactured. Accordingly, a reduction in power consumption of a programmable logic device can be achieved by the normally-off driving method.

The structures, the methods, and the like in this embodiment can combined with each other, or can also be combined with any of structures, methods, and the like in the other embodiments as appropriate.

Embodiment 3

In this embodiment, the field-effect mobility of the transistor including an oxide semiconductor film, which is described in the above embodiments, is theoretically calculated, and the transistor characteristics are calculated from the field-effect mobility.

The actually measured field-effect mobility of an insulated gate transistor is lower than its theoretical mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that a potential barrier (such as a grain boundary) exists in the semiconductor, the measured field-effect mobility $\mu$ can be expressed by the following Formula 2.

[Formula 2]

$$\mu = \mu_0 \exp\left(-\frac{E}{kT}\right) \tag{2}$$

Here, $\mu_0$ represents the theoretical field-effect mobility of a semiconductor, E represents the height of the potential barrier, k represents the Boltzmann constant, and T represents the absolute temperature. When the potential barrier is assumed to be attributed to a defect, the height of the potential barrier can be expressed as the following Formula 3 according to the Levinson model.

[Formula 3]

$$E = \frac{e^2 N^2}{8\varepsilon n} = \frac{e^3 N^2 t}{8\varepsilon C_{ox} V_g} \tag{3}$$

Here, e represents the elementary charge, N represents the average defect density per unit area in a channel, $\in$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following Formula 4.

[Formula 4]

$$I_d = \frac{W \mu V_g V_d C_{ox}}{L} \exp\left(-\frac{E}{kT}\right) \tag{4}$$

Here, L represents the channel length and W represents the channel width, and L and W are each 10 μm in this case. In addition, $V_d$ represents the drain voltage. When dividing both sides of the Formula 4 by $V_g$ and then taking logarithms of both sides, the following Formula 5 is obtained.

[Formula 5]

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \tag{5}$$

The right side of the Formula 5 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. As a result, the defect density N of an oxide semiconductor in which the ratio of indium (In), tin (Sn), and zinc (Zn) was 1:1:1 was approximately $1\times10^{12}/\text{cm}^2$.

On the basis of the defect density obtained in this manner, $\mu_0$ can be calculated to be 120 $\text{cm}^2/\text{Vs}$ from Formula 2 and Formula 3. The measured mobility of an In—Sn—Zn oxide including a defect was approximately 40 $\text{cm}^2/\text{Vs}$. However, assuming that no defect exists inside the semiconductor and at the interface between the semiconductor and an insulating film, the mobility $\mu_0$ of the oxide semiconductor is expected to be 120 $\text{cm}^2/\text{Vs}$.

Note that even when no defect exists inside a semiconductor, scattering at an interface between a channel and a gate insulator affects the transport property of the transistor. In other words, the mobility $\mu_1$ at a position that is distance x away from the interface between the channel and the gate insulator can be expressed as the following Formula 6.

[Formula 6]

$$\frac{1}{\mu_1} = \frac{1}{\mu_0} + \frac{D}{B}\exp\left(-\frac{x}{l}\right) \tag{6}$$

Here, D represents the electric field in the gate direction, and B and l are constants. B and l can be obtained from actual measurement results; according to the above measurement results, B was $4.75\times10^7$ cm/s and l was 10 nm (the depth to which the influence of interface scattering reaches). When D is increased (i.e., when the gate voltage is increased), the second term of Formula 6 is increased and accordingly the mobility $\mu_1$ is decreased.

Figure 16:
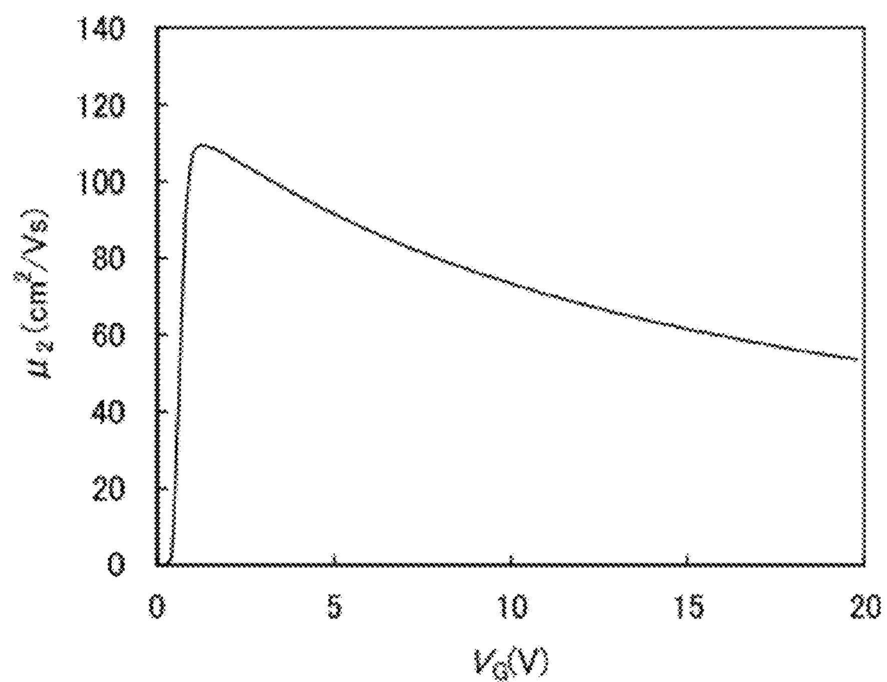
FIG. 16 is a graph showing gate voltage dependence of mobility obtained by calculation.

FIG. 16 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film of the oxide semiconductor that was formed by a sputtering method.

The work functions of a gate, a source, and a drain were assumed to be 5.5 eV, 4.6 eV, and 4.6 eV, respectively. The thickness of a gate insulator was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 16, the mobility has a peak of 100 $\text{cm}^2/\text{Vs}$ or more at a gate voltage that is slightly over 1 V, and is decreased as the gate voltage is increased because the influence of interface scattering is increased. Note that in order to reduce interface scattering, it is desirable that a surface of the semiconductor layer be flat at the atomic level (atomic layer flatness).

Calculation results of characteristics of minute transistors formed using an oxide semiconductor having such a mobility are shown in FIGS. 17A to 17C, FIGS. 18A to 18C, and FIGS. 19A to 19C. FIGS. 20A and 20B illustrate cross-sectional structures of the transistors used for the calculation. The transistors illustrated in FIGS. 20A and 20B each include a second region 1103*b* and a second region 1103*c* that have $n^+$-type conductivity in an oxide semiconductor layer. The resistivity of the second regions 1103*b* and 1103*c* is $2\times10^{-3}$ Ωcm.

The transistor in FIG. 20A is formed over a base insulating film 1101 and an embedded insulator 1102 that is embedded in the base insulating film 1101 and formed of aluminum oxide. The transistor includes the second region 1103*b*, the second region 1103*c*, an intrinsic first region 1103*a* that is placed between the second regions 1103*b* and 1103*c* and serves as a channel formation region, and a gate electrode 1105. The width of the gate electrode 1105 is 33 nm.

A gate insulating film 1104 is formed between the gate electrode 1105 and the first region 1103*a*. A sidewall insulating film 1106*a* and a sidewall insulating film 1106*b* are formed on side surfaces of the gate electrode 1105, and an insulator 1107 is formed over the gate electrode 1105 so as to prevent a short circuit between the gate electrode 1105 and another wiring. The sidewall insulating films each have a width of 5 nm. A source electrode 1108*a* and a drain electrode 1108*b* are provided in contact with the second region 1103*b* and the second region 1103*c*, respectively. Note that the channel width of this transistor is 40 nm.

The transistor in FIG. 20B is the same as the transistor in FIG. 20A in that it is formed over the base insulating film 1101 and the embedded insulator 1102 formed of aluminum oxide and that it includes the second region 1103*b*, the second region 1103*c*, the intrinsic first region 1103*a* provided therebetween, the gate electrode 1105 having a width of 33 nm, the gate insulating film 1104, the sidewall insulating film 1106*a*, the sidewall insulating film 1106*b*, the insulator 1107, the source electrode 1108*a*, and the drain electrode 1108*b*.

The difference between the transistor in FIG. 20A and the transistor in FIG. 20B is the conductivity type of semiconductor regions under the sidewall insulating films 1106*a* and 1106*b*. In the transistor in FIG. 20A, the semiconductor regions under the sidewall insulating film 1106*a* and the sidewall insulating film 1106*b* are part of the second region 1103*b* having $n^+$-type conductivity and part of the second region 1103*c* having $n^+$-type conductivity, whereas in the transistor in FIG. 20B, the semiconductor regions under the sidewall insulating film 1106*a* and the sidewall insulating film 1106*b* are part of the intrinsic first region 1103*a*. In other words, in the semiconductor layer of FIG. 20B, a region which overlaps with neither the second region 1103*b* (the second region 1103*c*) nor the gate electrode 1105 is provided. This region is called an offset region and has a width Loff called an offset length. As is seen from the drawing, the offset length is equal to the width of the sidewall insulating film 1106*a* (the sidewall insulating film 1106*b*).

Figure 17A:
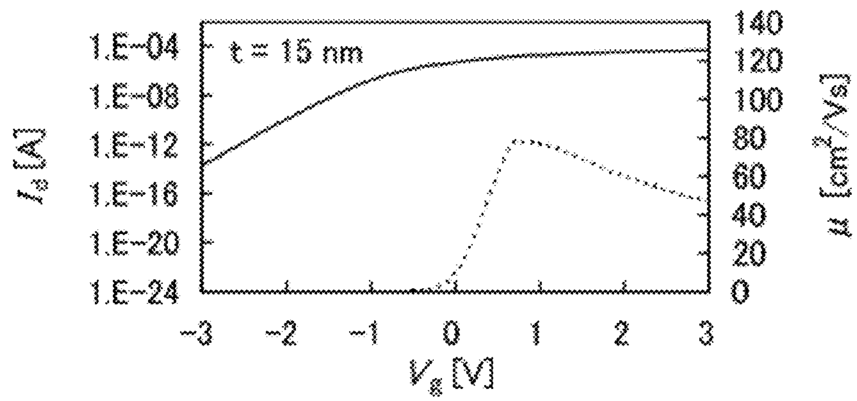
FIGS. 17A to 17C are graphs each showing gate voltage dependence of drain current and mobility obtained by calculation.
Figure 17B:
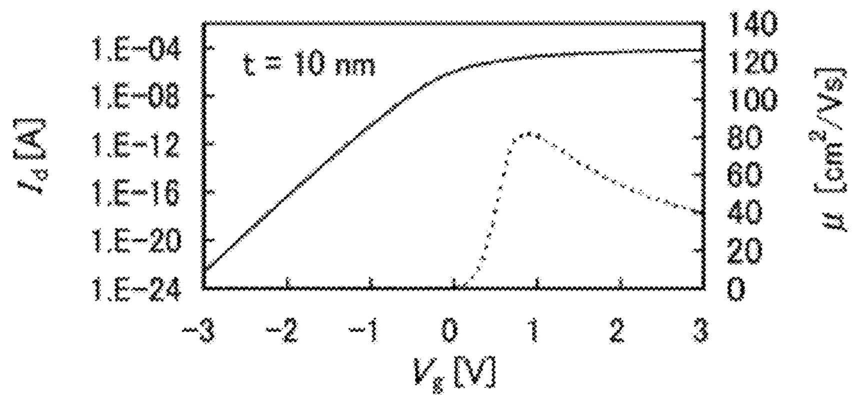
Figure 17C:
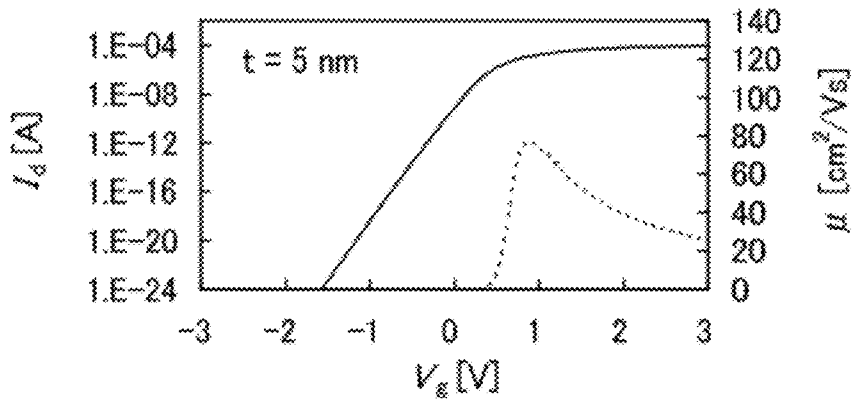

The other parameters used in calculation are as described above. For the calculation, device simulation software Sentaurus Device manufactured by Synopsys, Inc. was used. FIGS. 17A to 17C show the gate voltage ($V_g$: a potential difference between the gate and the source) dependence of the drain current ($I_d$, a solid line) and the mobility (μ, a dotted line) of the transistor having the structure illustrated in FIG. 20A. The drain current $I_d$ was obtained by calculation under the assumption that the drain voltage (a potential difference between the drain and the source) was +1 V, and the mobility μ was obtained by calculation under the assumption that the drain voltage was +0.1 V.

FIG. 17A shows the gate voltage dependence of the transistor in the case where the thickness of the gate insulating film is 15 nm, FIG. 17B shows that of the transistor in the case where the thickness of the gate insulating film is 10 nm, and FIG. 17C shows that of the transistor in the case where the thickness of the gate insulating film is 5 nm. As the gate insulating film is thinner, the drain current $I_d$ particularly in an off state (the off-state current) is significantly decreased. In contrast, there is negligible change in peak value of the mobility μ and the drain current $I_d$ in an on state (the on-state current). The graphs show that the drain current exceeds 10 μA, which is required in a memory element and the like, at a gate voltage of around 1 V.

Figure 18A:
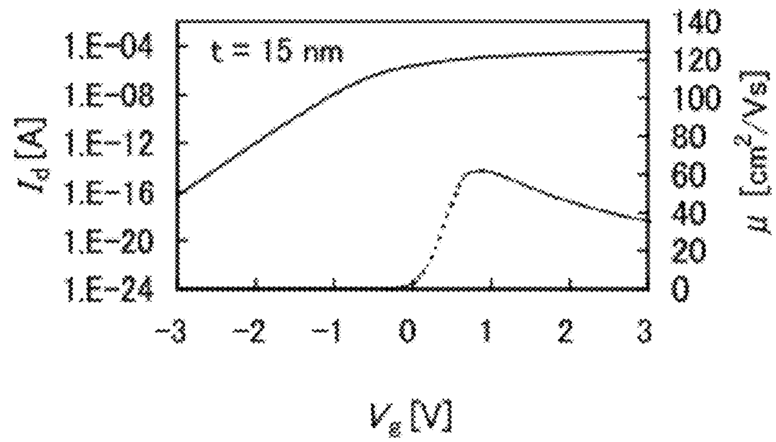
FIGS. 18A to 18C are graphs each showing gate voltage dependence of drain current and mobility obtained by calculation.
Figure 18B:
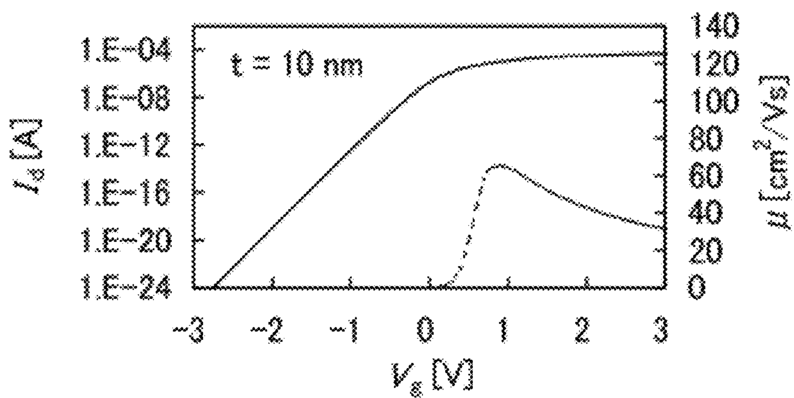
Figure 18C:
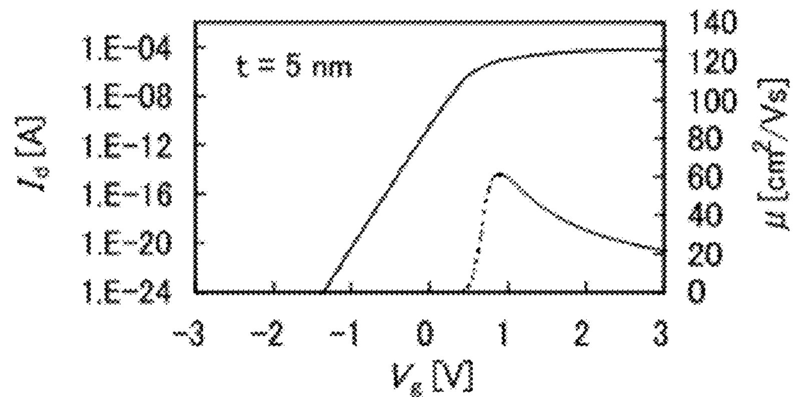

FIGS. 18A to 18C show the gate voltage $V_g$ dependence of the drain current $I_d$ (a solid line) and the mobility μ (a dotted line) of the transistor having the structure in FIG. 20B and an offset length Loff of 5 nm. The drain current $I_d$ was obtained by calculation under the assumption that the drain voltage was +1 V, and the mobility μ was obtained by calculation under the assumption that the drain voltage was +0.1 V. FIG. 18A shows the gate voltage dependence of the transistor in the case where the thickness of the gate insulating film is 15 nm, FIG. 18B shows that of the transistor in the case where the thickness of the gate insulating film is 10 nm, and FIG. 18C shows that of the transistor in the case where the thickness of the gate insulating film is 5 nm.

Figure 19A:
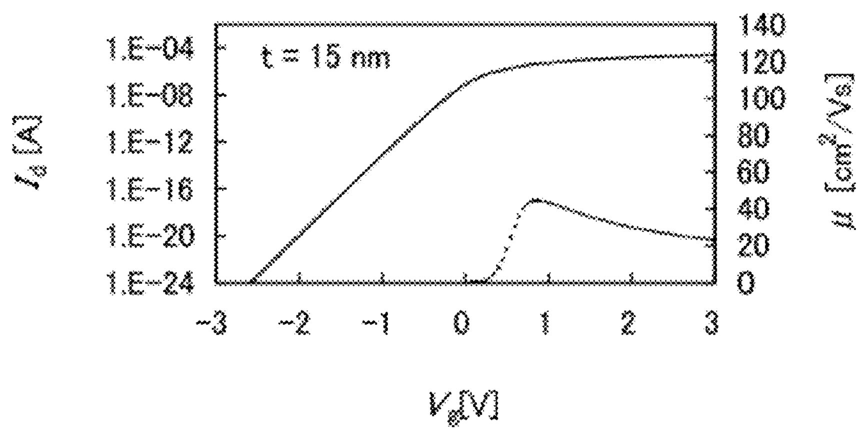
FIGS. 19A to 19C are graphs each showing gate voltage dependence of drain current and mobility obtained by calculation.
Figure 19B:
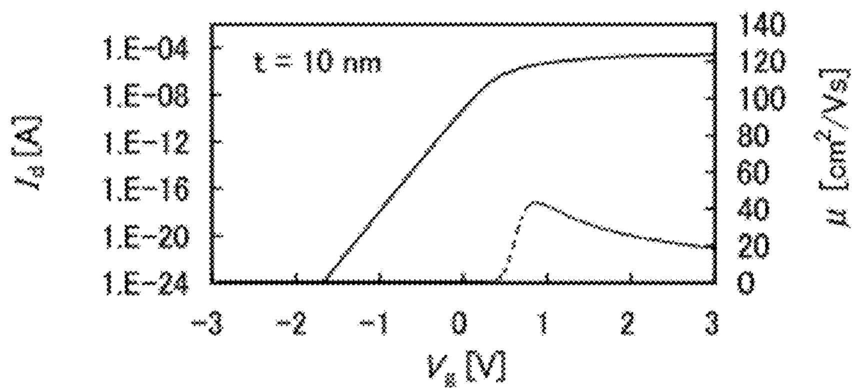
Figure 19C:
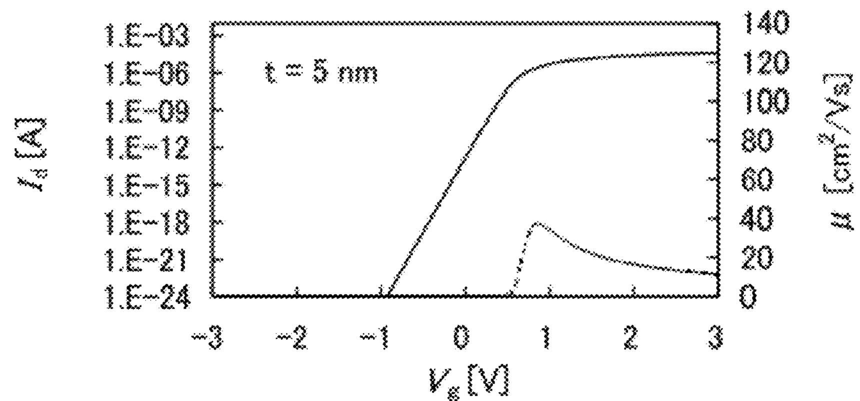
Figure 20A:
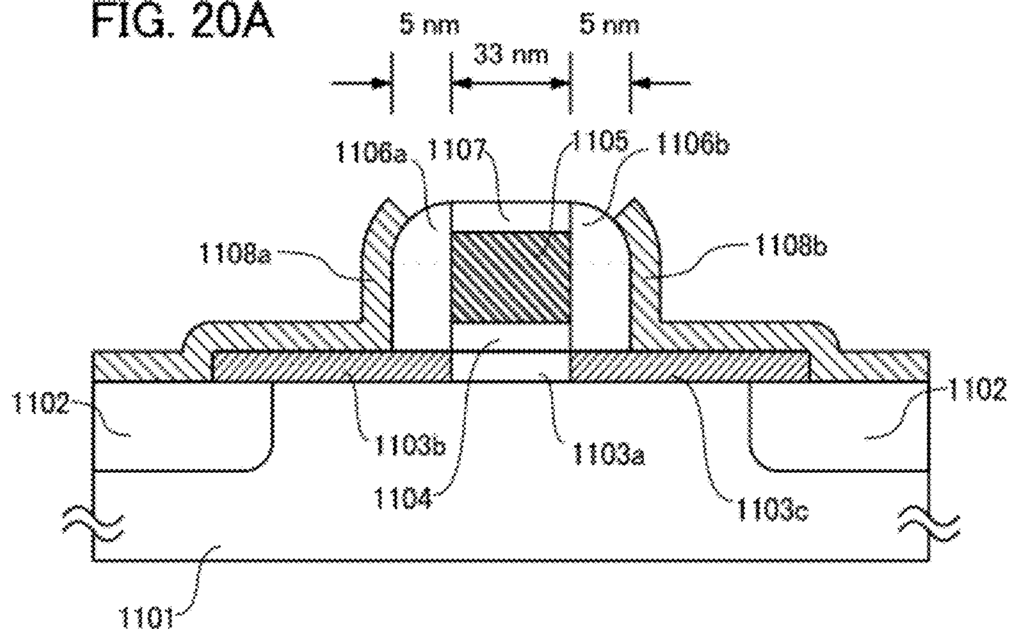
FIGS. 20A and 20B illustrate cross-sectional structures of transistors used for calculation.
Figure 20B:
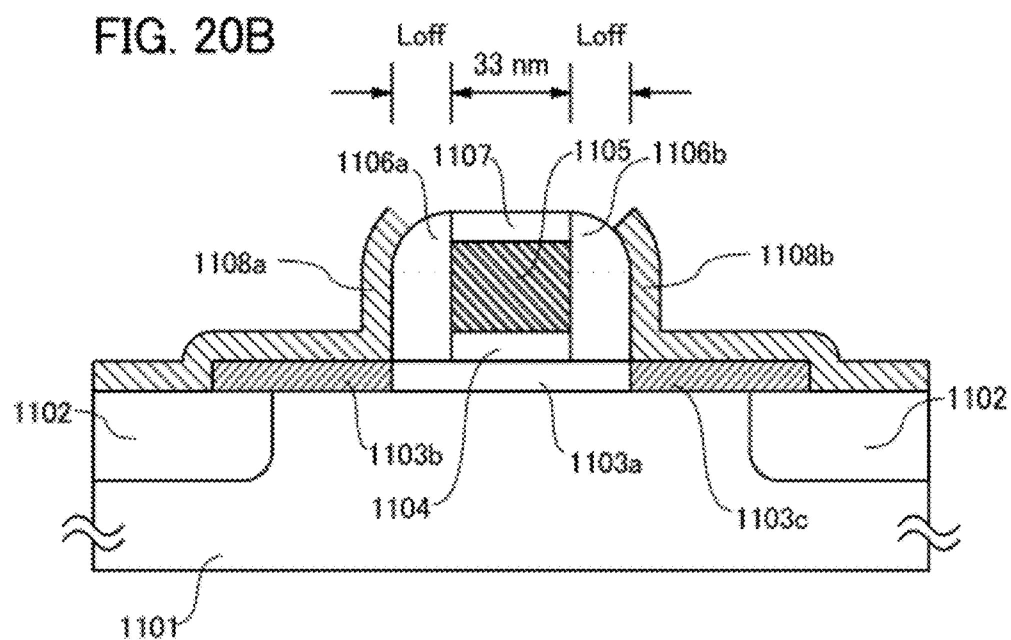

FIGS. 19A to 19C show the gate voltage dependence of the drain current $I_d$ (a solid line) and the mobility μ (a dotted line) of the transistor having the structure in FIG. 20B and an offset length Loff of 15 nm. The drain current $I_d$ was obtained by calculation under the assumption that the drain voltage was +1 V, and the mobility μ is obtained by calculation under the assumption that the drain voltage is +0.1 V. FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm.

In either of the structures, as the gate insulating film is thinner, the off-state current is significantly decreased, whereas no detectable change arises in the peak value of the mobility μ and the on-state current.

Note that the peak of the mobility μ is approximately 80 $cm^2/Vs$ in FIGS. 17A to 17C, approximately 60 $cm^2/Vs$ in FIGS. 18A to 18C, and approximately 40 $cm^2/Vs$ in FIGS. 19A to 19C; thus, the peak of the mobility μ is decreased as the offset length Loff is increased. Further, the same applies to the off-state current. The on-state current is also decreased as the offset length Loff is increased; however, the decrease in the on-state current is much smaller than the decrease in the off-state current. Further, the graphs show that in either of the structures, the drain current exceeds 10 μA, which is required in a memory element and the like, at a gate voltage of around 1 V. Thus, when the transistor having high mobility is used in the memory portion of the programmable switch described in the above embodiments, writing of the configuration data can be performed at high speed; therefore, a programmable logic device in which dynamic configuration can be performed easily can be provided.

Embodiment 4

In this embodiment, as the transistor including the oxide semiconductor film, which is described in the above embodiments, a transistor including an oxide semiconductor film which includes In, Sn, and Zn as its main components will be particularly described.

A transistor in which an oxide semiconductor containing In, Sn, and Zn as main components is used for a channel formation region can have favorable characteristics by depositing the oxide semiconductor while a substrate is heated or by performing heat treatment after the oxide semiconductor film is formed. Note that, here, a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to result in a normally-off transistor. Hereinafter, result of various measurements of the transistor including the oxide semiconductor film including In, Sn, and Zn as main components will be described.

Figure 26A:
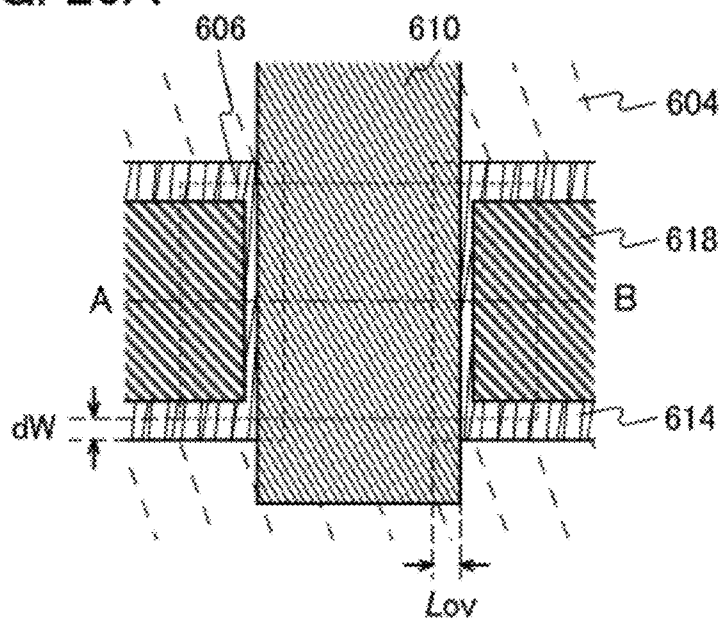
FIGS. 26A and 26B illustrate a plan view and a cross-sectional structure of a transistor used for measurement, respectively.

First, a structure of the transistor used for the various measurements in this embodiment is described with reference to FIGS. 26A and 26B. FIG. 26A is a plan view of the transistor, and FIG. 26B is a cross-sectional view taken along dashed-dotted line A-B in FIG. 26A.

Figure 26B:
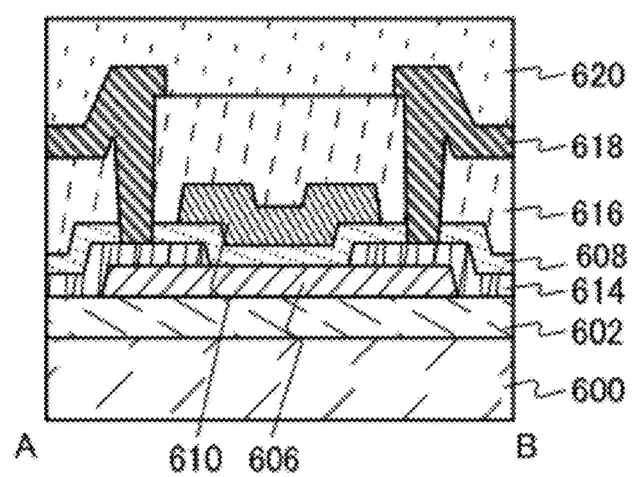

The transistor illustrated in FIG. 26B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 electrically connected to the pair of electrodes 614 through openings formed in the gate insulating film 608 and the interlayer insulating film 616; and a protective film 620 provided to cover the interlayer insulating film 616 and the wirings 618. The pair of electrodes 614 functions as a source electrode and a drain electrode of the transistor.

As the substrate 600, a glass substrate was used. As the base insulating film 602, a silicon oxide film was used. As the oxide semiconductor film 606, an In—Sn—Zn—O film was used. As the pair of electrodes 614, a tungsten film was used. As the gate insulating film 608, a silicon oxide film was used. The gate electrode 610 had a layered structure of a tantalum nitride film and a tungsten film. The interlayer insulating film 616 had a layered structure of a silicon oxynitride film and a polyimide film. The wirings 618 each had a layered structure in which a titanium film, an aluminum film, and a titanium film were formed in this order. As the protective film 620, a polyimide film was used.

Note that in the transistor having the structure illustrated in FIG. 26A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

Figure 21A:
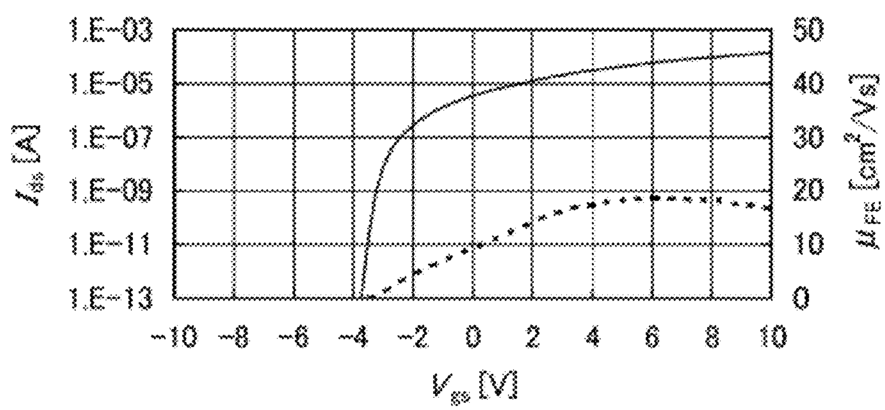
FIGS. 21A to 21C are graphs each showing characteristics of a transistor including an oxide semiconductor film.
Figure 21B:
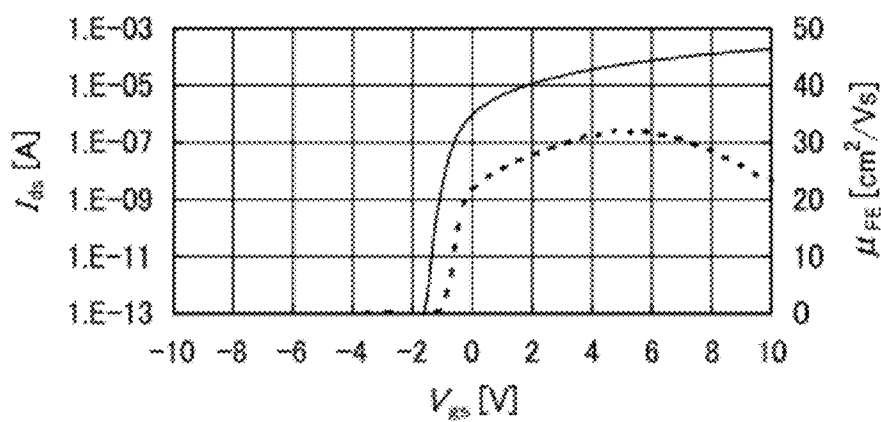
Figure 21C:
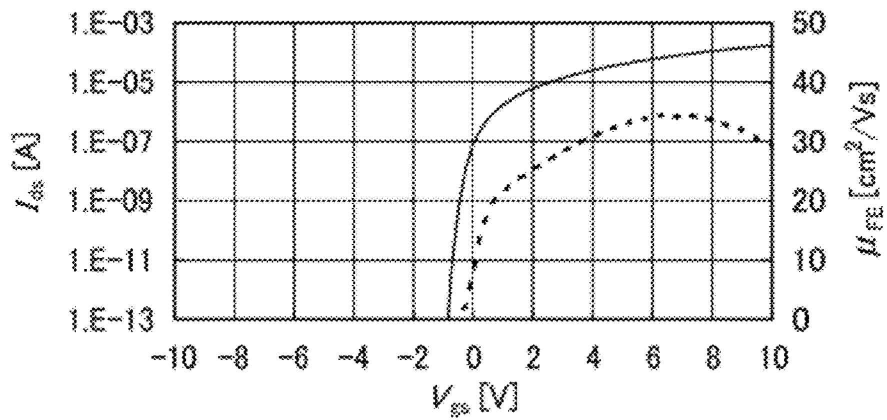

FIGS. 21A to 21C show the characteristics of the transistor in FIGS. 26A and 26B, which includes an oxide semiconductor film having a channel length L of 3 μm and a channel width W of 10 μm and a gate insulating film having a thickness of 100 nm Note that $V_d$ was set to 10 V.

FIG. 21A is a graph showing characteristics of a transistor whose oxide semiconductor film containing In, Sn, and Zn as main components is formed by a sputtering method without heating a substrate intentionally. The field-effect mobility of the transistor is 18.8 $cm^2$/Vsec. On the other hand, when the oxide semiconductor film containing In, Sn, and Zn as main components is formed while the substrate is intentionally heated, the field-effect mobility can be improved. FIG. 21B shows characteristics of a transistor whose oxide semiconductor film containing In, Sn, and Zn as main components is formed while a substrate is heated at 200° C. The field-effect mobility of the transistor is 32.2 $cm^2$/Vsec.

The field-effect mobility can be further improved by performing heat treatment after formation of the oxide semiconductor film containing In, Sn, and Zn as main components. FIG. 21C shows characteristics of a transistor whose oxide semiconductor film containing In, Sn, and Zn as main components is formed by sputtering at 200° C. and then subjected to heat treatment at 650° C. The field-effect mobility of the transistor is 34.5 $cm^2$/Vsec.

The intentional heating of the substrate is expected to suppress inclusion of moisture in the oxide semiconductor film during the formation by sputtering. Further, the heat treatment after film formation enables hydrogen, a hydroxyl group, or moisture to be removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 $cm^2$/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is eliminated by heat treatment, and the oxide semiconductor is crystallized through the heat treatment or by another heat treatment performed later. By such crystallization treatment, a non-single-crystal oxide semiconductor having favorable crystallinity can be obtained.

The intentional heating of the substrate during film formation and/or the heat treatment after the film formation contributes not only to improving field-effect mobility but also to result in a normally-off transistor. In a transistor in which an oxide semiconductor film which contains In, Sn, and Zn as main components and is formed without heating a substrate intentionally is used as a channel formation region, the threshold voltage tends to be shifted negatively. However, when the oxide semiconductor film formed while the substrate is intentionally heated is used, the problem of the negative shift of the threshold voltage can be solved. That is, the threshold voltage is shifted to a positive direction; this tendency can be confirmed by comparison between FIGS. 21A and 21B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be achieved by setting the composition ratio of a target to be In:Sn:Zn=2:1:3.

The substrate temperature at the film formation or the temperature of the heat treatment after the film formation is 150° C. or higher, preferably 200° C. or higher, further preferably 400° C. or higher. When film formation or heat treatment is performed at high temperature, the transistor can be normally off.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency can be compensated with oxygen. The excess oxygen is mainly oxygen existing between lattices. When the concentration of the excess oxygen is set to higher than or equal to $1\times10^{16}/cm^3$ and lower than or equal to $2\times10^{20}/cm^3$, excess oxygen can be included in the oxide semiconductor without causing crystal distortion or the like.

When heat treatment after the film formation is performed so that at least part of the oxide semiconductor is crystallized, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

The results of the XRD analysis of an In—Sn—Zn—O film are specifically described. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a dehydrogenated quartz substrate.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by the same method as that of Sample A was subjected to heat treatment at 650° C. The heat treatment was first performed in a nitrogen atmosphere for one hour and then in an oxygen atmosphere for one hour without lowering the temperature. A sample manufactured in this manner was used as Sample B.

Figure 22:
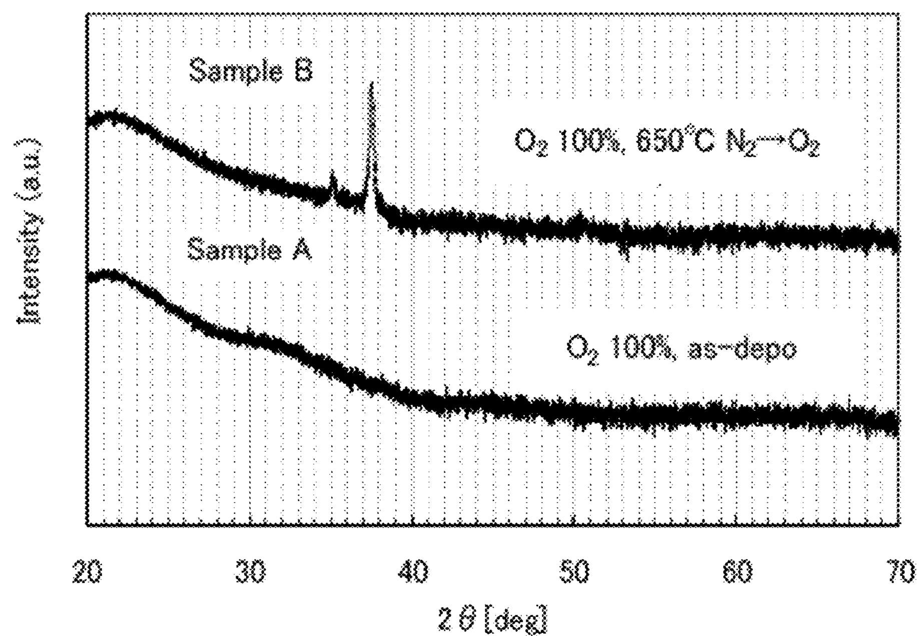
FIG. 22 shows XRD spectra of Sample A and Sample B.

FIG. 22 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

The substrate heating in the deposition of the oxide semiconductor and the heat treatment after the deposition of the oxide semiconductor have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or smaller. Here, the unit of the off-state current represents current per micrometer of a channel width.

Figure 23:
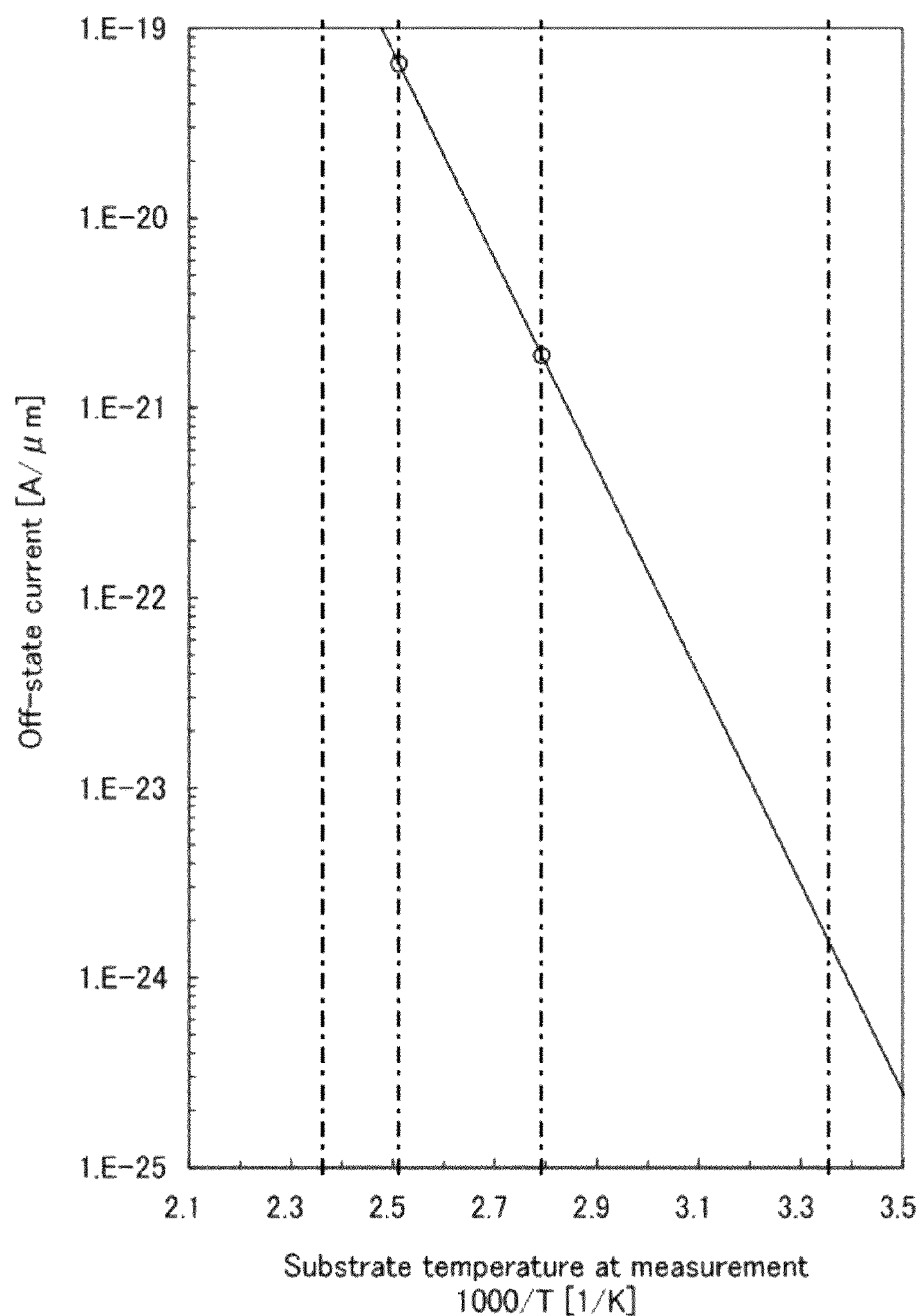
FIG. 23 shows a relation between off-state current of a transistor and substrate temperature in measurement.

FIG. 23 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 23, the off-state current was 0.1 aA/μm ($1\times10^{-19}$ A/μm) or smaller and 10 zA/μm ($1\times10^{-20}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/μm ($1\times10^{-22}$ A/μm) or smaller. Hence, the off-state current can be 1 aA/μm ($1\times10^{-18}$ A/μm) or smaller, 100 zA/μm ($1\times10^{-19}$ A/μm) or smaller, and 1 zA/μm ($1\times10^{-21}$ A/μm) or smaller at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification from an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor containing In, Sn, and Zn as main components by heat treatment, a film which does not include moisture originally is preferably formed because moisture is released from the oxide semiconductor containing In, Sn, and Zn as main components at a higher temperature than from an oxide semiconductor containing In, Ga, and Zn as main components.

The relation between the substrate temperature at measurement and electrical characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 3 μm on one side (total Lov of 6 μm), and dW of 0 μm. Note that $V_{ds}$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 24:
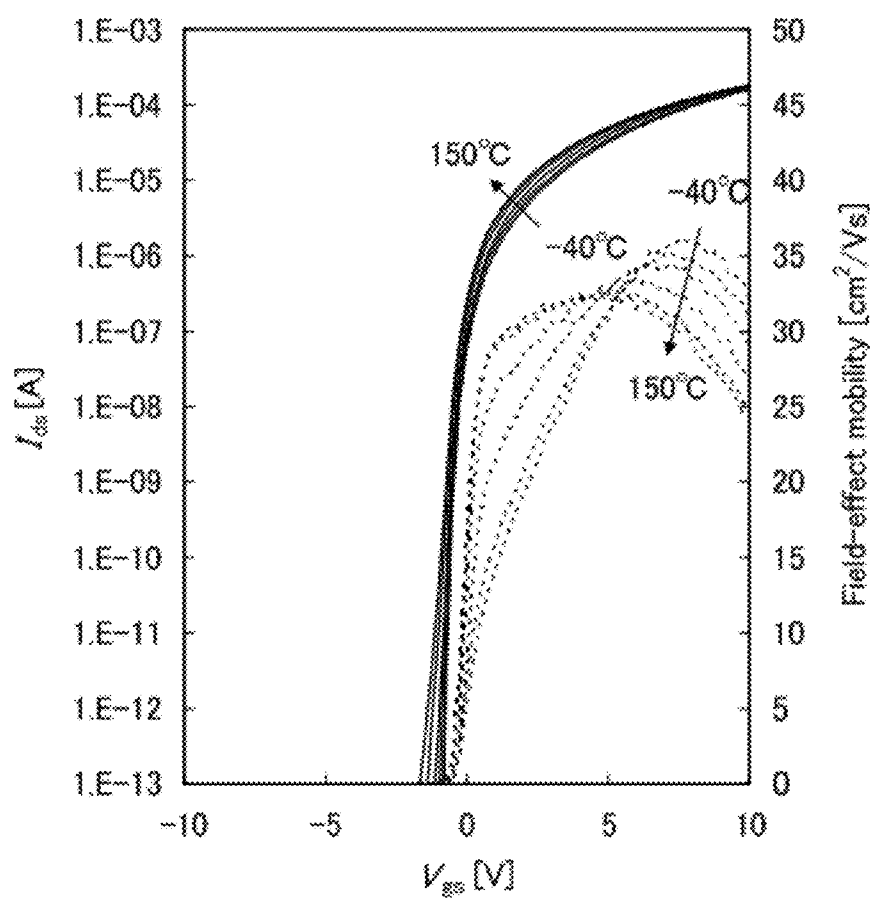
FIG. 24 is a graph showing $V_{gs}$ dependence of $I_{ds}$ and field-effect mobility.
Figure 25A:
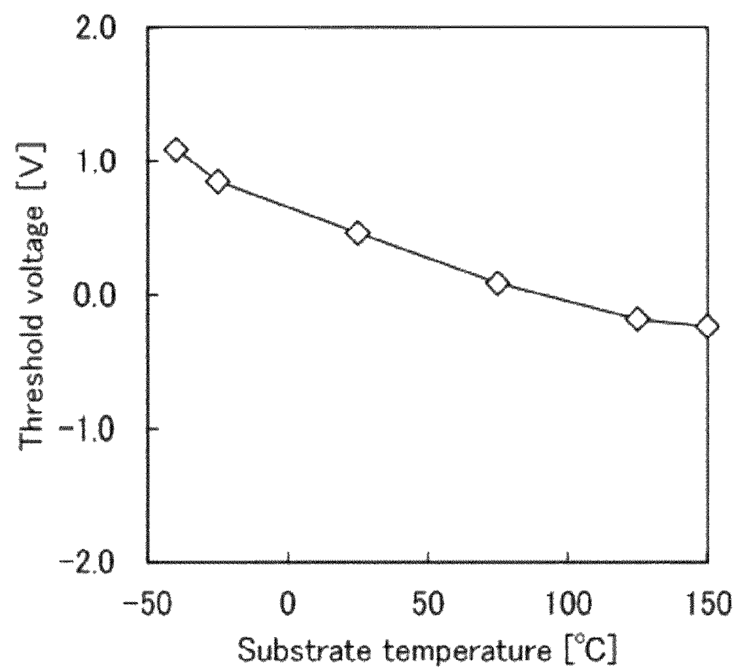
FIG. 25A is a graph showing a relation between substrate temperature and threshold voltage.

FIG. 24 shows the influence of the substrate temperature on the $V_{gs}$ dependence of $I_{ds}$ (a solid line) and field-effect mobility (a dotted line). FIG. 25A shows a relation between the substrate temperature and the threshold voltage, and FIG. 25B shows a relation between the substrate temperature and the field-effect mobility.

From FIG. 25A, it is found that the threshold voltage is decreased as the substrate temperature increases. Note that the threshold voltage is decreased from 1.09 V to −0.23 V in the range from −40° C. to 150° C.

Figure 25B:
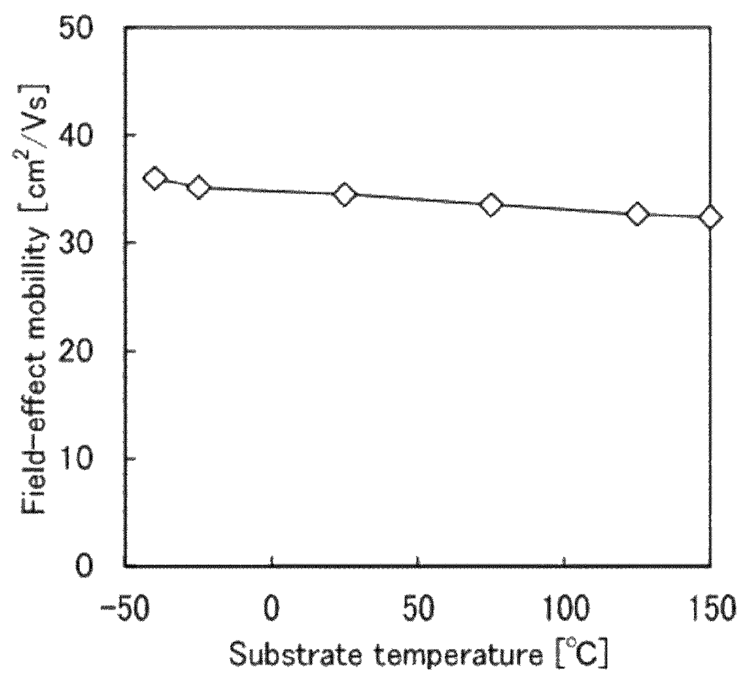
FIG. 25B is a graph showing a relation between substrate temperature and field-effect mobility.

From FIG. 25B, it is found that the field-effect mobility is decreased as the substrate temperature increases. Note that the field-effect mobility is decreased from 36 $cm^2$/Vs to 32 $cm^2$/Vs in the range from −40° C. to 150° C. Thus, it is found that variation in electrical characteristics is small in the above temperature range.

In a transistor in which such an oxide semiconductor containing In, Sn, and Zn as main components is used for a channel formation region, a field-effect mobility of 30 $cm^2$/Vsec or higher, preferably 40 $cm^2$/Vsec or higher, further preferably 60 $cm^2$/Vsec or higher can be obtained with the off-state current maintained at 1 aA/μm or smaller, and on-state current needed for an LSI can be achieved. For example, in an FET where L/W is 33 nm/40 nm, an on-state current of 12 μA or larger can flow when the gate voltage is 2.7 V and the drain voltage is 1.0 V.

Thus, a transistor having extremely small off-state current is used for the memory portion of the programmable switch described in the above embodiments, whereby configuration data can be held even when a power supply potential is not supplied. Thus, writing of configuration data after the power is supplied can be omitted, so that start-up time of a logic block can be short. Accordingly, a programmable logic device in which power consumption is reduced by the normally-off driving method can be provided.

Further, when the transistor having high mobility is used in the memory portion of the programmable switch described in the above embodiments, writing of the configuration data can be performed at high speed; therefore, a programmable logic device in which dynamic configuration can be performed easily can be provided.

With such characteristics, a programmable logic device can be provided without decreasing the operation speed even when a transistor including an oxide semiconductor is also provided in an integrated circuit formed using a Si semiconductor.

Embodiment 5

With the use of a programmable logic device according to an embodiment of the present invention, a low-power electronic device can be provided. In particular, in the case of a portable electronic device which has difficulty in continuously receiving power, an advantage in increasing the continuous duty period can be obtained when a semiconductor device with low power consumption according to an embodiment of the present invention is added as a component of the device.

The semiconductor device including a programmable logic device according to an embodiment of the present invention can be used for display devices, personal computers, or image reproducing devices provided with recording media (typically, devices which reproduce the content of recording media such as digital versatile discs (DVDs) and have displays for displaying the reproduced images). Other than the above, as an electronic device which can use the semiconductor device according to an embodiment of the present invention, mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case is described in which the semiconductor device including a programmable logic device according to an embodiment of the present invention is applied to a portable electronic device such as a mobile phone, a smartphone, or an e-book reader.

Figure 10:
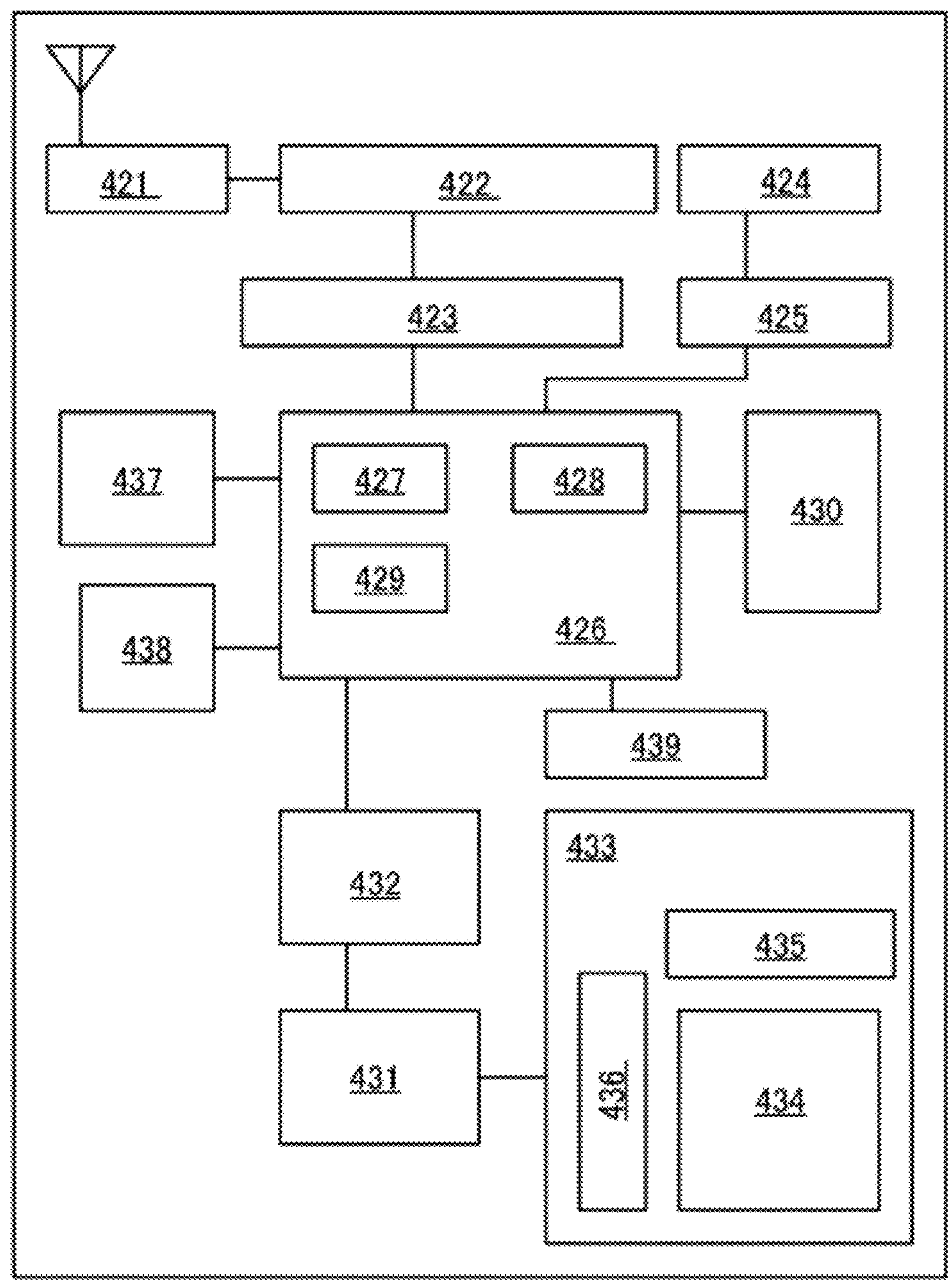
FIG. 10 is a block diagram of a portable electronic device.

FIG. 10 is a block diagram of a portable electronic device. The portable electronic device illustrated in FIG. 10 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. For example, when the programmable logic device in the above embodiment is used as any of or all of the CPU 427, the digital baseband circuit 423, the memory circuit 432, the DSP 428, the interface 429, the display controller 431, and the audio circuit 437, power consumption can be reduced.

Figure 11:
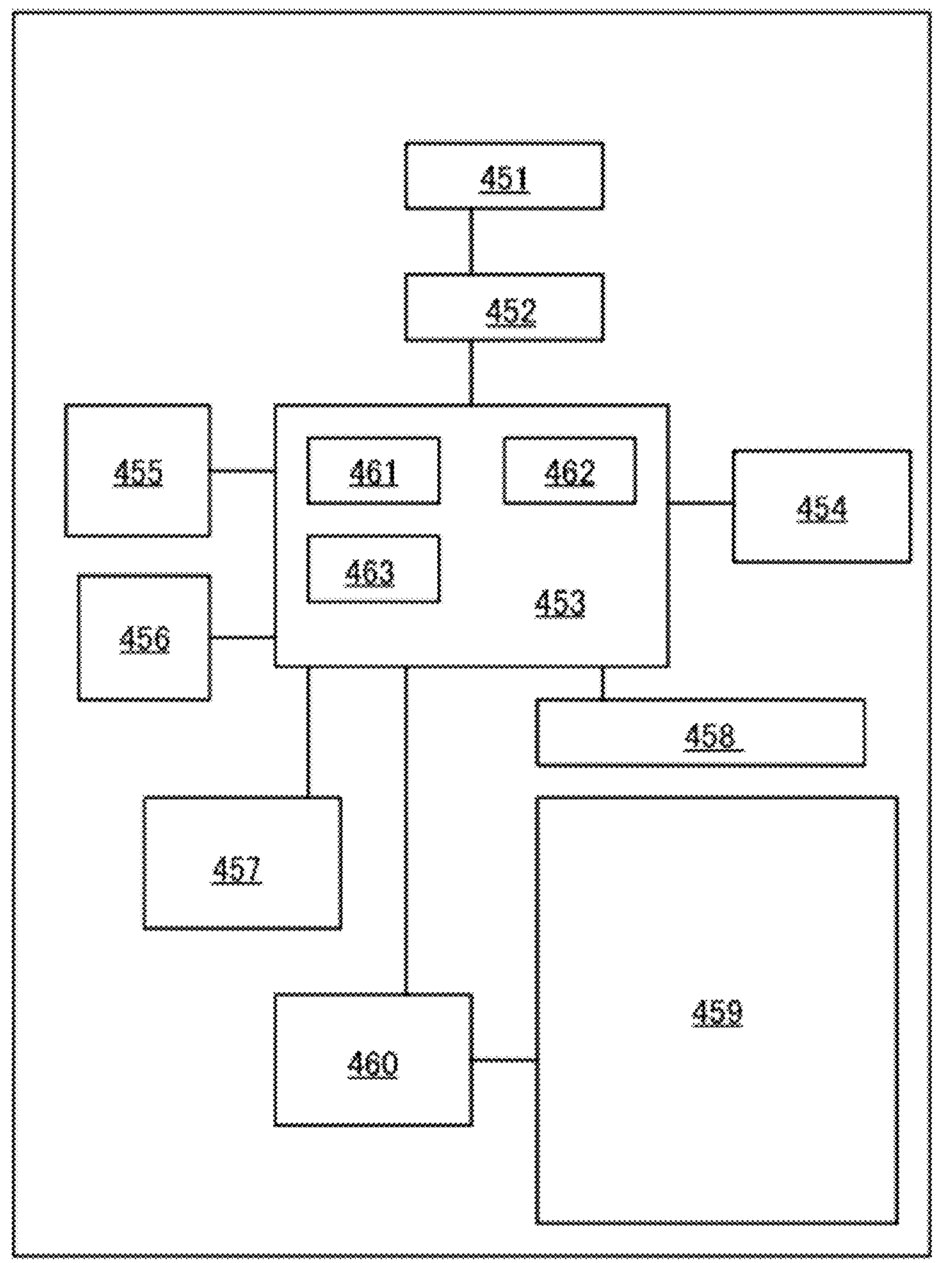
FIG. 11 is a block diagram of an e-book reader.

FIG. 11 is a block diagram of an e-book reader. The e-book reader illustrated in FIG. 11 includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface 463. For example, when the programmable logic device in the above embodiment is used as any of or all of the CPU 461, the audio circuit 455, the memory circuit 457, the display controller 460, the DSP 462, and the interface 463, power consumption can be reduced.

This embodiment can be implemented in appropriate combination with any of the other embodiments.

The structures, the methods, and the like described in this embodiment can be combined as appropriate with any of the structures, the methods, and the like described in the other embodiments.

EXPLANATION OF REFERENCE

10: logic block, 11: wiring, 11*a*: wiring, 11*b*: wiring, 11*c*: wiring, 11*d*: wiring, 12: switch matrix, 13: wiring selection circuit, 14: first driver circuit, 15: second driver circuit, 16: first wiring, 17: second wiring, 30: programmable switch, 30*a*: programmable switch, 30*b*: programmable switch, 30*c*: programmable switch, 30*d*: programmable switch, 30*e*: programmable switch, 30*f*: programmable switch, 32: memory portion, 34: switch portion, 40: transistor, 111*a*: wiring, 111*b*: wiring, 111*c*: wiring, 111*d*: wiring, 110: transistor, 110*a*: transistor, 110*b*: transistor, 110*c*: transistor, 110*d*: transistor, 110*e*: transistor, 110*f*: transistor, 112: transistor, 112*a*: transistor, 112*b*: transistor, 112*c*: transistor, 112*d*: transistor, 112*e*: transistor, 112*f*: transistor, 113*a*: electrode, 113*b*: electrode, 113*c*: electrode, 113*d*: electrode, 113*e*: electrode, 113*f*: electrode, 114*a*: electrode, 114*b*: electrode, 114*c*: electrode, 114*d*: electrode, 114*e*: electrode, 114*f*: electrode, 116: capacitor, 118: buffer, 120: inverter, 130: transistor, 134: transmission gate, 136: capacitor, 144: inverter, 146: buffer, 150: transistor, 152: transistor, 154: transmission gate, 156: capacitor, 158: capacitor, 160: capacitor, 201: semiconductor substrate, 203: element isolation region, 207: gate insulating film, 209: gate electrode, 211*a*: impurity region, 211*b*: impurity region, 215: insulating film, 217: insulating film, 219*a*: contact plug, 219*b*: contact plug, 221: insulating film, 223*a*: wiring, 223*b*: wiring, 225: insulating film, 227: oxide semiconductor film, 229: oxide semiconductor film, 231: insulating film, 233: gate electrode, 235: oxide semiconductor film, 235*a*: region, 235*b*: region, 235*c*: region, 237: sidewall insulating film, 239: gate insulating film, 241*a*: electrode, 241*b*: electrode, 243: insulating film, 245: insulating film, 249: wiring, 250: wiring, 421: RF circuit, 422: analog baseband circuit, 423: digital baseband circuit, 424: battery, 425: power supply circuit, 426: application processor, 427: CPU, 428: DSP, 429: interface, 430: flash memory, 431: display controller, 432: memory circuit, 433: display, 434: display portion, 435: source driver, 436: gate driver, 437: audio circuit, 438: keyboard, 439: touch sensor, 451: battery, 452: power supply circuit, 453: microprocessor, 454: flash memory, 455: audio circuit, 456: keyboard, 457: memory circuit, 458: touch panel, 459: display, 460: display controller, 461: CPU, 462: DSP, 463: interface, 600: substrate, 602: base insulating film, 606: oxide semiconductor film, 608: gate insulating film, 610: gate electrode, 614: electrode, 616: interlayer insulating film, 618: wiring, 620: protective film, 1101: base insulating film, 1102: embedded insulator, 1103*a*: first region, 1103*b*: second region, 1103*c*: second region, 1104: gate insulating film, 1105: gate electrode, 1106*a*: sidewall insulating film, 1106*b*: sidewall insulating film, 1107: insulator, 1108*a*: source electrode, and 1108*b*: drain electrode.

This application is based on Japanese Patent Application serial No. 2011-112045 filed with Japan Patent Office on May 19, 2011, the entire contents of which are hereby incorporated by reference.

The invention claimed is:

1. A semiconductor device comprising:

a first wiring and a second wiring;

a logic block electrically connected to the first wiring and the second wiring; and a wiring selection circuit provided at an intersection of the first wiring and the second wiring, wherein the wiring selection circuit comprises a switch which comprises a first transistor, a second transistor, and a fourth transistor each comprising a first terminal, a second terminal, and a gate;

wherein the first terminal and the second terminal of the first transistor are electrically connected to the first wiring and the second wiring, respectively, wherein the second terminal of the second transistor is electrically connected to the gate of the first transistor, wherein the gate of the second transistor is electrically connected to the gate of the fourth transistor, and wherein the second transistor comprises an oxide semiconductor.

2. The semiconductor device according to claim 1, wherein the first transistor comprises a single crystal semiconductor.

3. The semiconductor device according to claim 1, further comprising a capacitor electrically connected to the second terminal of the second transistor.

4. The semiconductor device according to claim 1, further comprising a capacitor electrically connected to the second terminal of the fourth transistor.

5. The semiconductor device according to claim 1, further comprising a capacitor electrically connected between the second terminal of the fourth transistor and the gate of the first transistor.

6. The semiconductor device according to claim 1, wherein the oxide semiconductor comprises indium and oxygen.

7. The semiconductor device according to claim 1, wherein the oxide semiconductor comprises a crystal with c-axis alignment.

8. The semiconductor device according to claim 1, wherein the oxide semiconductor comprises stoichiometrically excessive oxygen.

9. An electronic device comprising the semiconductor device according to claim 1.

10. A semiconductor device comprising:

a first wiring and a second wiring;

a logic block electrically connected to the first wiring and the second wiring; and a wiring selection circuit provided at an intersection of the first wiring and the second wiring, wherein the wiring selection circuit comprises a switch which comprises first to fourth transistors each comprising a first terminal, a second terminal, and a gate, wherein the first terminal and the second terminal of the first transistor are electrically connected to the first wiring and the second wiring, respectively, wherein the second terminal of the second transistor is electrically connected to the gate of the first transistor, wherein the gate of the second transistor is electrically connected to the gate of the fourth transistor, wherein the first terminal and the second terminal of the third transistor are electrically connected to the first wiring and the second wiring, respectively, and wherein the second transistor comprises an oxide semiconductor.

11. The semiconductor device according to claim 10, wherein polarities of the first transistor and the third transistor are different from each other.

12. The semiconductor device according to claim 10, further comprising a capacitor electrically connected to the second terminal of the second transistor.

13. The semiconductor device according to claim 10, further comprising a capacitor electrically connected to the second terminal of the fourth transistor.

14. The semiconductor device according to claim 10, further comprising a capacitor electrically connected between the second terminal of the fourth transistor and the gate of the first transistor.

15. The semiconductor device according to claim 10, wherein the oxide semiconductor comprises indium and oxygen.

16. The semiconductor device according to claim 10, wherein the oxide semiconductor comprises a crystal with c-axis alignment.

17. The semiconductor device according to claim 10, wherein the oxide semiconductor comprises stoichiometrically excessive oxygen.

18. An electronic device comprising the semiconductor device according to claim 10.

* * * * *